US 6,492,730 B1

(12) United States Patent
Nakamura et al.

(10) Patent No.: US 6,492,730 B1
(45) Date of Patent: Dec. 10, 2002

(54) METHOD FOR FABRICATING SEMICONDUCTOR INTEGRATED CIRCUIT

(75) Inventors: Yoshitaka Nakamura, Ome (JP);
Tsuyoshi Tamaru, Hachiouji (JP);
Naoki Fukuda, Ome (JP); Hidekazu Goto, Fussa (JP); Isamu Asano, Iruma (JP); Hideo Aoki, Musashi-murayama (JP); Keizo Kawakita, Ome (JP);
Satoru Yamada, Ome (JP); Katsuhiko Tanaka, Ome (JP); Hiroshi Sakuma, Ome (JP); Masayoshi Hirasawa, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/480,480

(22) Filed: Jan. 11, 2000

Related U.S. Application Data

(63) Continuation of application No. 09/106,074, filed on Jun. 29, 1998, now Pat. No. 6,028,360.

(30) Foreign Application Priority Data

Jun. 30, 1997 (JP) .............................................. 9-174150

(51) Int. Cl.⁷ .............................................. H01L 23/48
(52) U.S. Cl. ........................ 257/758; 257/763; 257/306; 257/310

(58) Field of Search ................................. 257/301–310, 257/751, 758, 761, 763, 764, 770

(56) References Cited

U.S. PATENT DOCUMENTS

| 5,420,072 A | * | 5/1995 | Fiordalice et al. ........ 427/126.1 |
| 5,576,240 A | * | 11/1996 | Radosevich et al. .. 148/DIG. 14 |
| 5,654,581 A | | 8/1997 | Radosevich et al. |
| 5,801,097 A | | 9/1998 | Chang |

FOREIGN PATENT DOCUMENTS

| JP | 8-204144 | 8/1996 |
| JP | 9-45770 | 2/1997 |
| JP | 9-219501 | 8/1997 |

* cited by examiner

Primary Examiner—Kevin M. Picardat
(74) Attorney, Agent, or Firm—Mattingly, Stanger & Malur, P.C.

(57) ABSTRACT

The semiconductor device is formed according to the following steps. A TiN film 71 and a W film 72 are deposited on a silicon oxide film 64 including the inside of a via-hole 66 by the CVD method and thereafter, the W film 72 and TiN film 71 on the silicon oxide film 64 are etched back to leave only the inside of the via-hole 66 and form a plug 73. Then, a TiN film 74, Al-alloy film 75, and Ti film 76 are deposited on the silicon oxide film 64 including the surface of the plug 73 by the sputtering method and thereafter, the Ti film 76, Al-alloy film 75, and TiN film 74 are patterned to form second-layer wirings 77 and 78.

10 Claims, 51 Drawing Sheets

METHOD FOR FABRICATING SEMICONDUCTOR INTEGRATED CIRCUIT

This is a continuation application of U.S. Ser. No. 09/106,074, filed Jun. 29, 1998, now U.S. Pat. No. 6,028,360.

BACKGROUND OF THE INVENTION

The present invention relates to a semiconductor integrated circuit device and a technique of fabricating a semiconductor integrated circuit device, and more particularly to measures for preventing corrosion of an upper-layer wiring when a TiN film is formed inside a through-hole for connecting upper- and lower-layer wiring formed over a semiconductor substrate and over an upper electrode of a capacitor insulating film, by a chemical vapor deposition method using a metal source containing a halogen element.

When the aspect ratio of a through-hole (depth/diameter of the through-hole) for connecting upper- and lower-layer wirings formed on a semiconductor substrate is increased as an LSI is further refined and more densely integrated, it is difficult to deposit a conductive film for wiring in the through-hole. Therefore, an art for embedding a plug in a through-hole having a high aspect ratio in a plug has been used so far.

As described in Japanese Patent Laid-Open No. 204144/1996, to prevent reaction between a metal wiring layer in a microminiaturized contact hole and an underlying layer, a titanium nitride (TiN) film is used as a reaction barrier layer.

The titanium nitride film, when deposited by a CVD (Chemical Vapor Deposition) method, has a good coverage and is thus widely used as a plug material buried in a through-hole with a high aspect ratio. For example, Japanese Patent Laid-Open No. 45770/1997 discloses a technique whereby a TiN film is formed by a CVD method inside a through-hole formed in an interlayer insulating film and a tungsten film or a tungsten compound is formed over the TiN film.

A technique has been developed which deposits a TiN film as an upper electrode by a CVD method over a tantalum oxide film which is a capacitive insulating film of a capacitor. For example, Japanese Patent Laid-Open No. 219501/1997 discloses a technique for forming a TiN film as an upper electrode over a tantalum oxide film as a capacitor insulating film by a CVD method.

To deposit a TiN film by the CVD method, a source gas containing a halogen element such as titanium tetrachloride ($TiCl_4$) is generally used. This is because a TiN film formed by using the source gas has a large step coverage and moreover, the film can be formed at a low temperature of approx. 450° C. and thereby, there is an advantage that the characteristic of a device is not deteriorated.

However, because a TiN film formed by using a source gas containing a halogen element contains a halogen element such as chlorine produced due to decomposition of the source gas, there is a problem that the Al (aluminum) wiring formed on a through-hole in which a CVD-TiN film is embedded would be corroded because the halogen element reacts with Al. In a method of forming a tungsten film or tungsten compound film over a titanium nitride film buried in a through-hole, as described in Japanese Patent Laid-Open No. 45770/1997, although the tungsten film has a greater capability to trap halogen elements than a tungsten compound film such as a tungsten nitride film, the overall effect of trapping halogen elements by the tungsten film is small, allowing halogen elements to enter the aluminum wiring layer formed over the tungsten film, and resulting in the halogen elements corroding the aluminum. Further, the tungsten film has a poor adhesion to the underlying film and is easily peeled.

An object of the present invention is to provide a method of preventing corrosion of an Al wiring formed over a through-hole in which a CVD-TiN film is buried or a technique of preventing corrosion of an Al wiring formed over the CVD-TiN film as an upper electrode of a capacitor insulating film.

SUMMARY OF THE INVENTION

The outline of the present invention is briefly described below.

Between the titanium nitride film formed by using a gas containing halogen as a source gas and a second conductive film is provided a film which contains metal atoms that tend to bond to halogen elements and which has a higher capability to trap halogen elements than tungsten. The provision between the titanium nitride film and the second conductive film of a film that traps halogen elements—which corrode the second conductive film such as an aluminum film—can prevent the diffusion of the halogen elements into the second conductive film and therefore the corrosion of the second conductive film.

The trap film that contains metal atoms tending to bond to halogen elements and has a higher capability to trap halogen than tungsten may be a titanium film, a titanium nitride film, a tantalum film or a tantalum nitride film, all these formed by the sputtering method, and a titanium film, a titanium nitride film, a tantalum film or a tantalum nitride film, all these formed by the CVD method using a source gas not containing halogen as constitutional elements. Any of these films may be used as a single layer and also as a multilayer film two or more layers of these films. When used as a single layer, the titanium film formed by the sputtering method has the greatest capability to trap halogen elements. When a multilayer film comprising a titanium film formed by sputtering and a titanium nitride film formed by sputtering is used, because the titanium film has a higher trapping capability, a greater corrosion prevention effect can be produced if the titanium film is made thicker than the titanium nitride film. These trap films are preferably formed to a thickness of more than 5 nm, more preferably 20 nm or more, either as a single layer film or as a multilayer film. A thickness in excess of 120 nm results in increased resistance and is practically not preferable. The provision of such a trapping layer improves the adhesion between the titanium nitride film containing a halogen element and the interlayer insulating film.

The trap film is a film containing atoms with a halogen bonding energy in excess of 111 kcal/mol. The greater the bonding energy, the greater the capability to trap halogen. In practice it is necessary for the bonding energy to be 111 kcal/mol or higher.

The effect to prevent corrosion of this trap film when the trap film is provided immediately below the second conductive film is equivalent to the effect when one or more additional layers are provided between the second conductive film and the trap film.

The trap film such as a titanium film exhibits an excellent capability to trap halogen even when a gas containing, fluorine, bromine or iodine, not to mention chlorine, as a constitutional element is used for a source gas for the titanium nitride film. Among examples of the source gas containing halogen are titanium tetrachloride and titanium tetraiodide. Titanium tetrachloride exhibits the highest corrosiveness for metals, particularly when it is used as a source gas, and there is a definite reason to provide a trap film.

The second conductive film is a film that may be corroded and which is made of aluminum, aluminum alloy, copper or copper alloy.

The trap film is formed over the opening after the titanium nitride film containing a halogen element has been formed by the CVD method in the opening of the insulating film. In more detail, the first conductive film including a titanium nitride film formed by the CVD method using a source gas containing halogen is deposited over the insulating film on the substrate through the opening in the insulating film. After this, the first conductive film over this insulating film is removed to form a plug inside the opening and a second conductive film including as a lowermost layer a second titanium nitride film formed by the sputtering method is deposited over the insulating film including the plug surface. This second conductive film is patterned to form a wiring layer. The first conductive layer may be a multilayer film of a titanium nitride film and a tungsten film formed by the CVD method or a single layer film of a titanium nitride film formed by the CVD method. Alternatively, the first conductive film including a titanium nitride film formed by the CVD method using a source gas containing halogen as a constitutional element is deposited over the insulating film through the opening in the insulating film on the substrate where a MISFET and a capacitor is formed. After this, the first conductive film over this insulating film is removed to form a plug inside the opening and a second conductive film including as a lowermost layer a second titanium nitride film formed by the sputtering method is deposited over the insulating film including the plug surface. This second conductive film is patterned to form a wiring layer. In this case, too, the first conductive layer may be a multilayer film of a titanium nitride film and a tungsten film formed by the CVD method or a single layer film of a titanium nitride film formed by the CVD method.

In the semiconductor device using a copper wiring layer, which is corroded particularly easily, the copper corrosion can be mitigated by providing a trap film such as of tantalum or tantalum nitride between the titanium nitride film containing a halogen element and the copper wiring layer.

When the titanium nitride film formed by the CVD method is used for one of the electrodes of the capacitor, the trap film such as a titanium film made by sputtering is formed over this titanium nitride film. Conventionally, polysilicon has primarily been used for the electrodes of capacitors. Polysilicon films must be formed at a high temperature of about 650° C. The film making temperature can be reduced by the use a titanium nitride film formed by a CVD method using a source gas containing halogen as a constitutional element. The film making temperature of the titanium nitride film by the CVD method is 400° C. to 600° C. The relation between chlorine concentration in the titanium nitride film and the film making temperature when titanium tetrachloride is used as a source gas is shown in FIG. 46. As shown in this graph, lower film making temperature results in higher chlorine concentration in the titanium nitride film. Particularly when the film is made at temperatures below 500° C., the extent to which the wiring layer around the storing capacitor is corroded increases. Thus, the effect to prevent corrosion of the wiring layer becomes great if the trap film of this invention is provided particularly when the titanium nitride film is formed at temperatures below 500° C. Not only when a titanium nitride film containing halogen is formed as the storage electrode but also when a titanium nitride film is formed after an aluminum wiring layer has been formed, it is preferable that the film making temperature be below 500° C. Forming the film at low temperatures increases the content of halogen in the titanium nitride film.

The corrosion of the conductive film can also be prevented by forming a titanium nitride film using a source gas containing halogen as a constitutional element and then annealing it in an inert gas such as nitrogen gas or rare gas. That is, annealing can remove halogen from the titanium nitride film. The annealing is performed at a temperature of 400° C. to 800° C., preferably at a temperature higher than that of the process in which a TiN film is formed by the CVD method. If annealing is done in the same apparatus as the film making apparatus without exposing the titanium nitride film to the atmosphere immediately after the titanium nitride film is formed, the oxidation of the surface of the titanium nitride film can be prevented. The cleaning process may be omitted. If the cleaning process is performed, it may be done either before or after the annealing, preferably after annealing. The use of warm water at 40° C. or higher during cleaning is most effective in removing chlorine.

If water enters the titanium nitride film during a certain processing, chlorine becomes more freely movable in the device and thus the amount of chlorine moving toward the wiring layer increases, rendering the wiring layer more likely to be corroded. It is considered that the reason is because chlorine in the titanium nitride film, when contacting water, is ionized and become more freely movable seeking species to bond to. To prevent ingress of water into the titanium nitride film, the titanium nitride film is formed by using a source gas containing halogen as a constitutional element, followed by the forming of a high-density plasma CVD insulating film that has a high water blocking effect. The refractive index of the insulating film is above 1.46, and the insulating film includes Si rich. The processes during which water can enter the film include the cleaning process after dry etching and the inorganic spin-on-glass (SOG) film forming process. The inorganic SOG film forming process involves applying an inorganic SOG film and then performing a steam-baking whereby the film is baked in water steam. Thus, by forming a high-density plasma CVD insulating film under the inorganic SOG film, the corrosion of the wiring layer can be reduced. An organic SOG film may be formed instead of the high-density plasma CVD film because the organic SOG film also has a water blocking capability, though not as high as that of the high-density plasma CVD insulating film.

DETAILED DESCRIPTION OF THE PREFERRED EMBODIMENTS

EMBODIMENT 1

The preferred embodiments of the present invention are described below in detail by referring to the accompanying drawings, are provided with the same symbol and their repetitive description is omitted.

Figure 1:
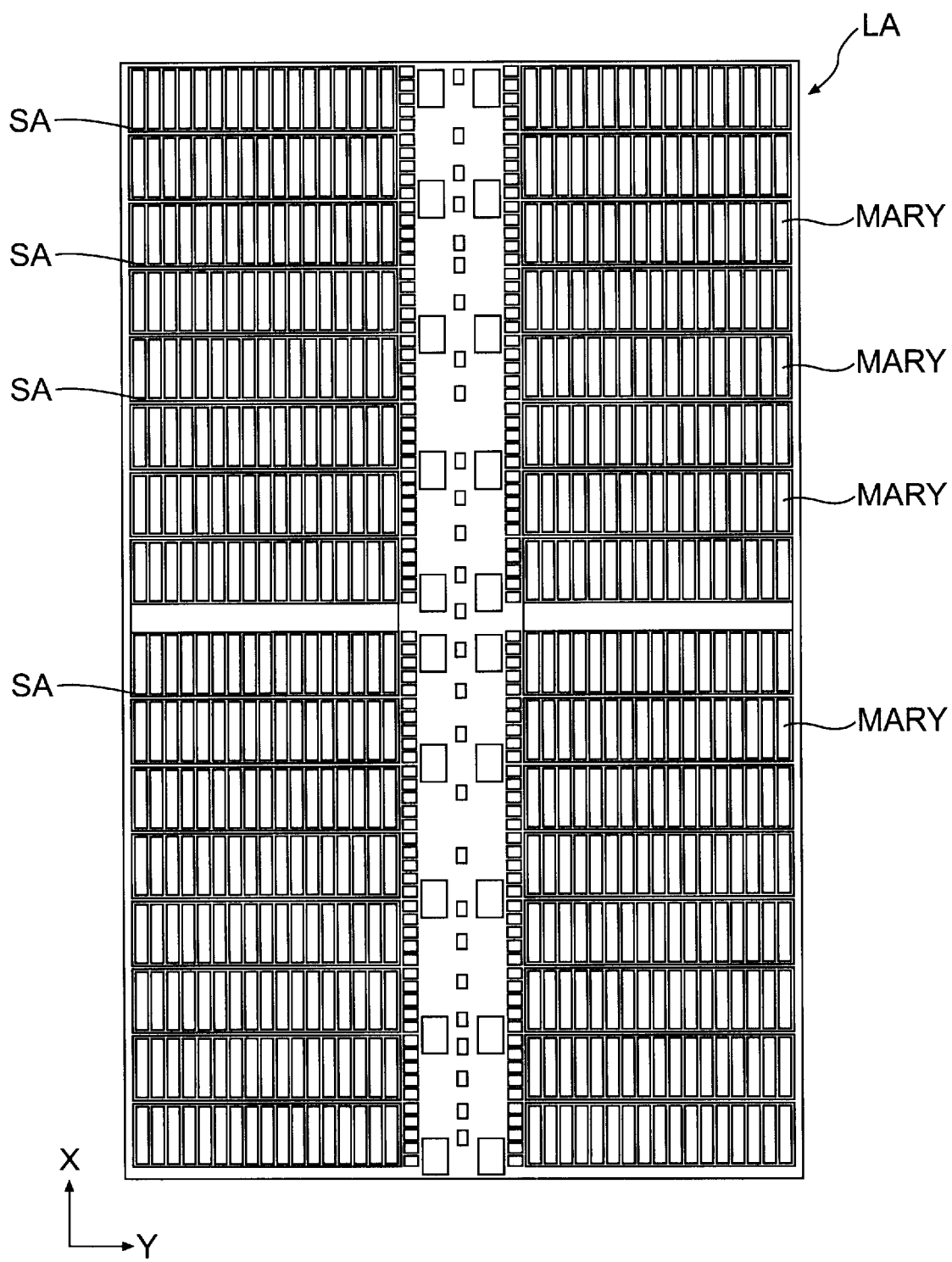
FIG. 1 is an overall top view of a semiconductor chip on which the DRAM of an embodiment of the present invention is formed.

FIG. 1 is a top view of a semiconductor chip on which the DRAM of this embodiment is formed. As shown in FIG. 1, a lot of memory arrays MARY are arranged on the principal plane of a semiconductor chip 1A made of single-crystal silicon like a matrix along the X direction (major-side direction of the semiconductor chip 1A) and the Y direction (minor-side direction of the semiconductor chip 1A). A sense amplifier SA is set between the memory arrays MARY adjacent to each other along X direction. Control circuits such as a word driver WD and a data-line selection circuit and an input/output circuit and a bonding pad are arranged at the central portion of the principal plane of the semiconductor chip 1A.

Figure 2:
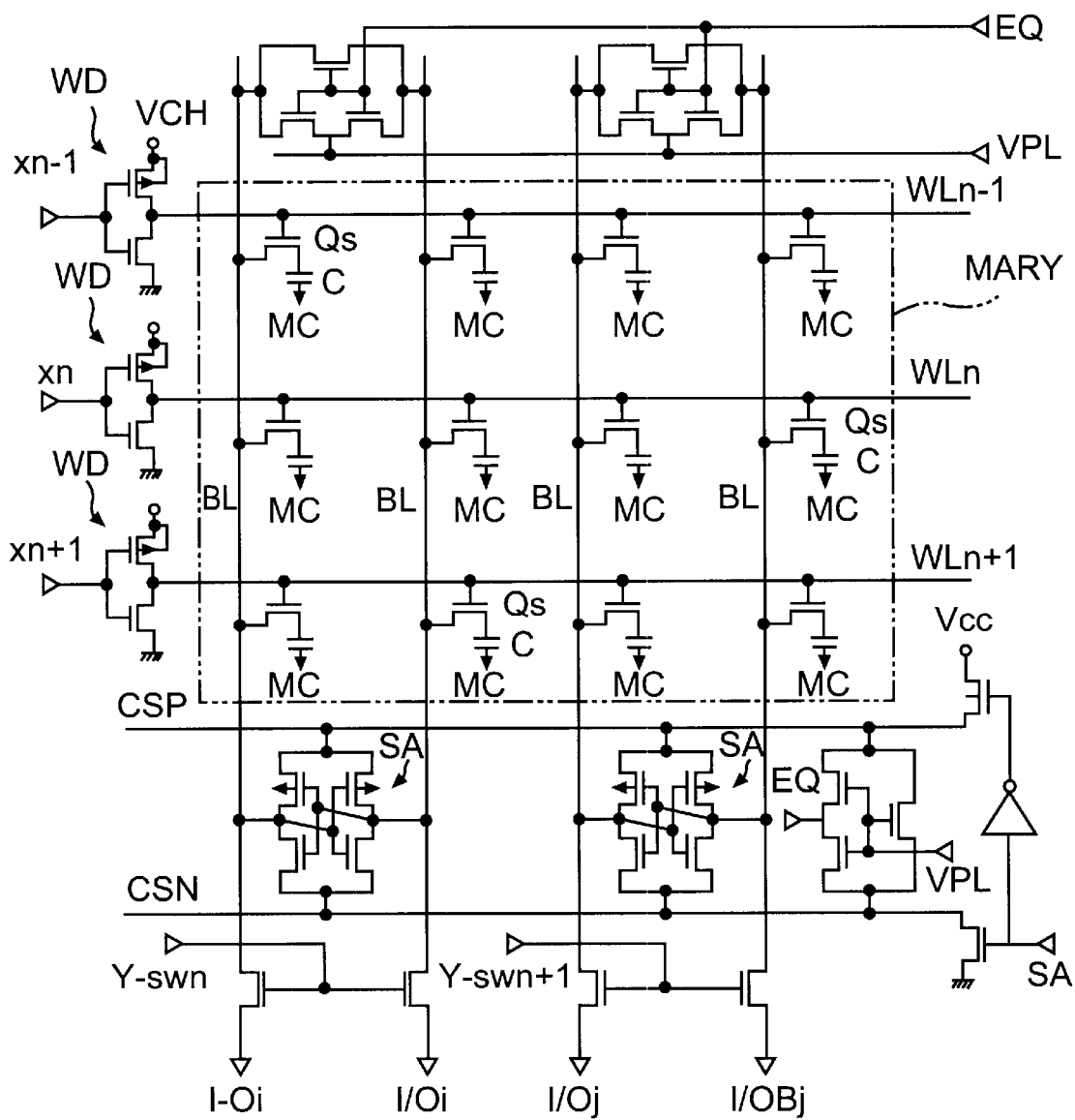
FIG. 2 is an equivalent circuit diagram of the DRAM of an embodiment of the present invention.

FIG. 2 is an equivalent circuit diagram of the DRAM. As shown in FIG. 2, the memory array (MARY) of the DRAM comprises a plurality of word lines WL (WLn−1, WLn, WLn+1, . . . ) arranged like a matrix, a plurality of bit lines BL, and a plurality of memory cells arranged at the intersections of the word lines WL and bit lines BL. One memory cell for storing the information for 1 bit comprises one information storing capacitive element C and one memory cell selecting MISFET Qs series-connected with the element. One source and drain of the memory cell selecting MISFETs are electrically connected with the information storing capacitive element C and the other source and drain are electrically connected with the bit lines BL. One end of the word line WL is connected to the word driver WD and one ends of the bit lines BL are connected to the sense amplifier SA.

Then, the method of this embodiment for fabricating a DRAM is described below in order of step by referring to FIGS. 3 to 45.

Figure 3:
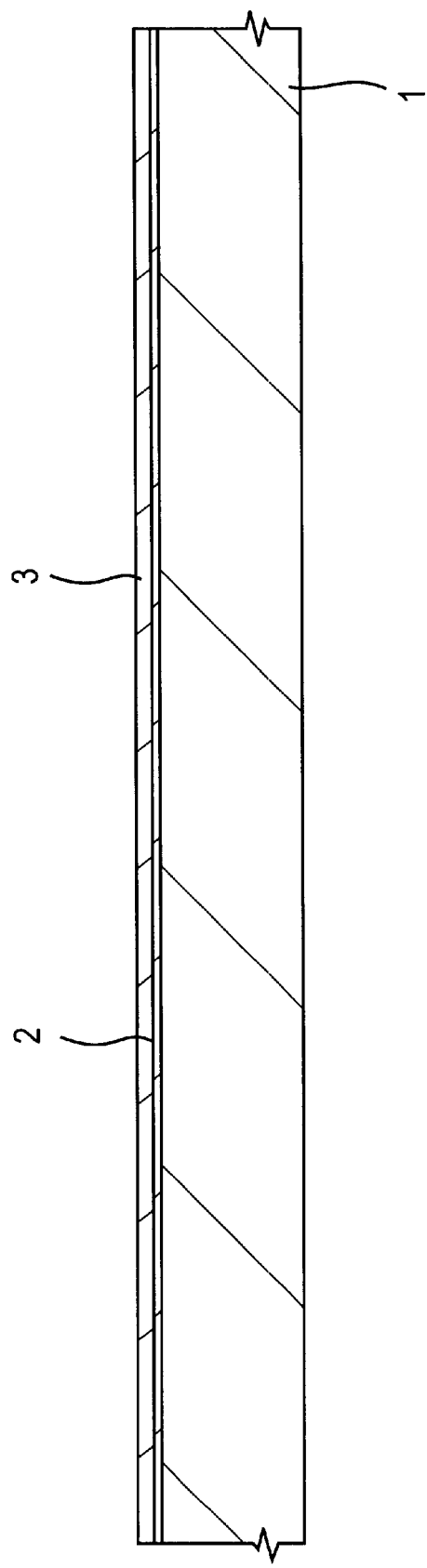
FIG. 3 is a sectional view of an essential portion of a semiconductor substrate showing a fabrication method of the DRAM of an embodiment of the present invention.

First, as shown in FIG. 3, a p-type semiconductor substrate 1 having a resistivity of approx. 10 Ωcm is wet-oxidized at approx. 85° C. to form a thin silicon oxide film 2 having a thickness of approx. 10 nm on the surface of the substrate 1 and thereafter, deposit a silicon nitride film 3 having a thickness of approx. 140 nm on the silicon oxide film 2 by the CVD (Chemical Vapor Deposition) method. The silicon oxide film 2 is formed to moderate the stress added to a substrate when sintering a silicon oxide film to be embedded into the inside of a device separation groove in the subsequent process. Because the silicon nitride film 3 has a characteristic that it is hardly oxidized, it is used as a mask for preventing the oxidization of the substrate surface below the film 3 (active region).

Figure 4:
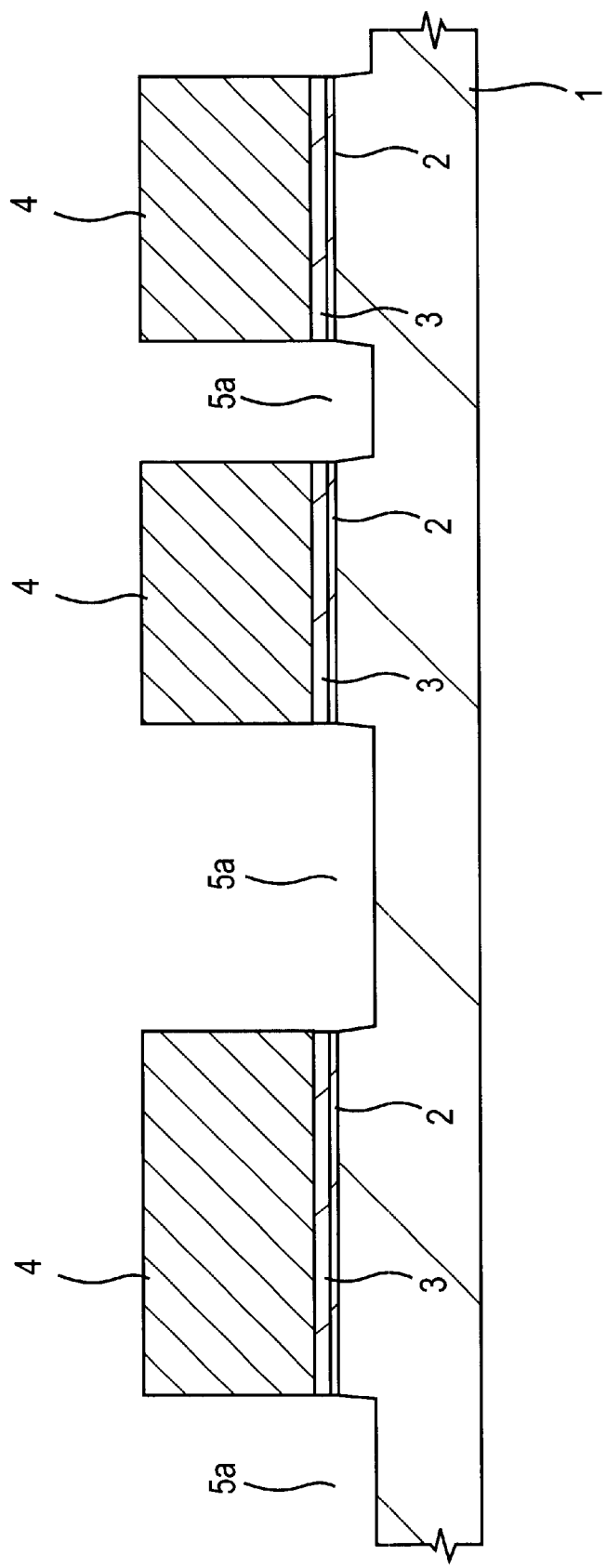
FIG. 4 is a sectional view of an essential portion of a semiconductor substrate showing a fabrication method of the DRAM of an embodiment of the present invention.

Then, as shown in FIG. 4, a groove 5a having a depth of 300 to 400 nm is formed on the semiconductor substrate 1 in a device separation region by using a photoresist film 4 as a mask and thereby, dry-etching the silicon nitride film 3, silicon oxide film 2, and semiconductor substrate 1. To form the groove 5a, it is also possible to dry-etch the silicon nitride film 3 by using the photoresist film 4 as a mask and then remove the photoresist film 4 and thereafter, dry-etch the silicon oxide film 2 and semiconductor substrate 1 by using the silicon nitride film 3 as a mask.

Figure 5:
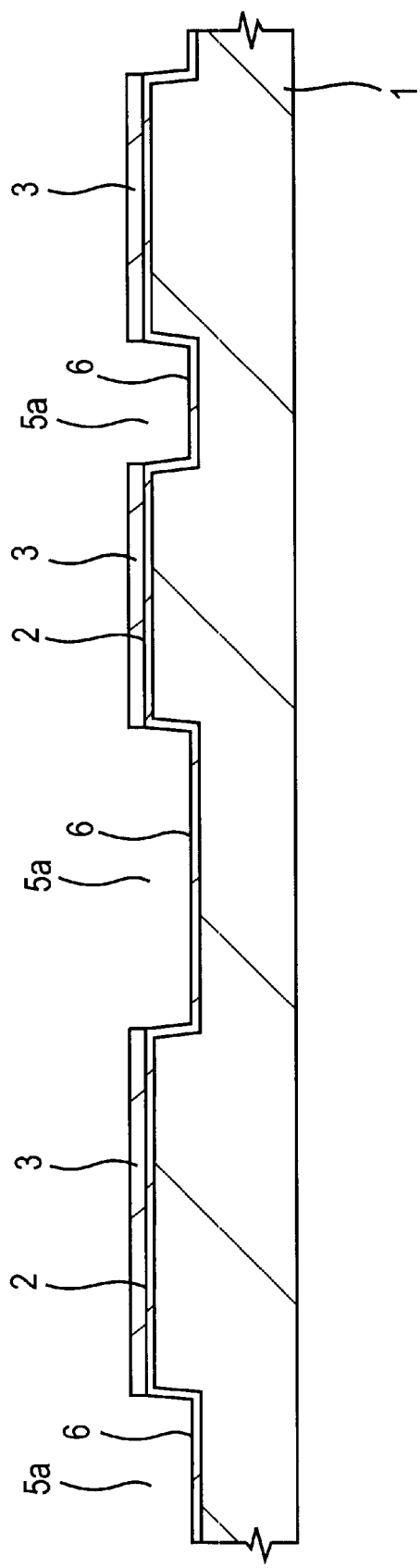
FIG. 5 is a sectional view of an essential portion of a semiconductor substrate showing a fabrication method of the DRAM of an embodiment of the present invention.

Then, after removing the photoresist film 4, as shown in FIG. 5 the semiconductor substrate 1 is wet-oxidized at 850 to 900° C. to remove a damage layer produced on the inner wall of the groove 5a due to the above etching and form a thin silicon oxide film 6 having a thickness of approx. 10 nm on the inner wall of the groove 5a.

Figure 6:
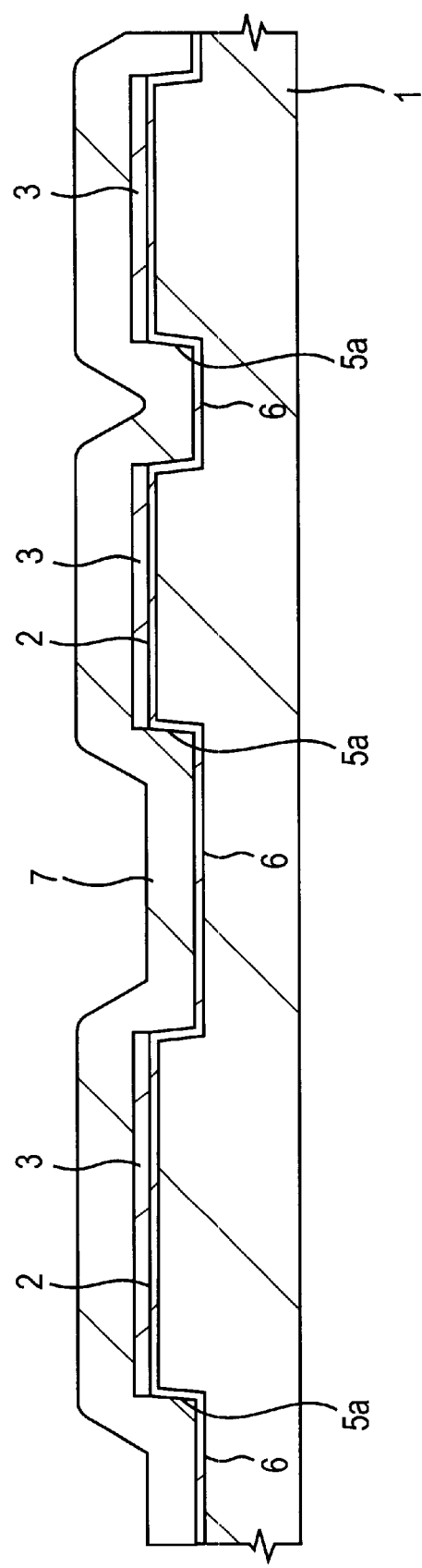
FIG. 6 is a sectional view of an essential portion of a semiconductor substrate showing a fabrication method of the DRAM of an embodiment of the present invention.

Then, as shown in FIG. 6, a silicon oxide film 7 having a thickness of 300 to 400 nm is deposited on the semiconductor substrate 1a and thereafter, the semiconductor substrate 1 is dry-oxidized at approx. 1000° C. to perform sintering for improving the quality of the silicon oxide film 7 embedded in the groove 5a. The silicon oxide film 7 is deposited by the thermal CVD method using ozone ($O_3$) and tetraethoxysilane (TEOS) as source gases.

Figure 7:
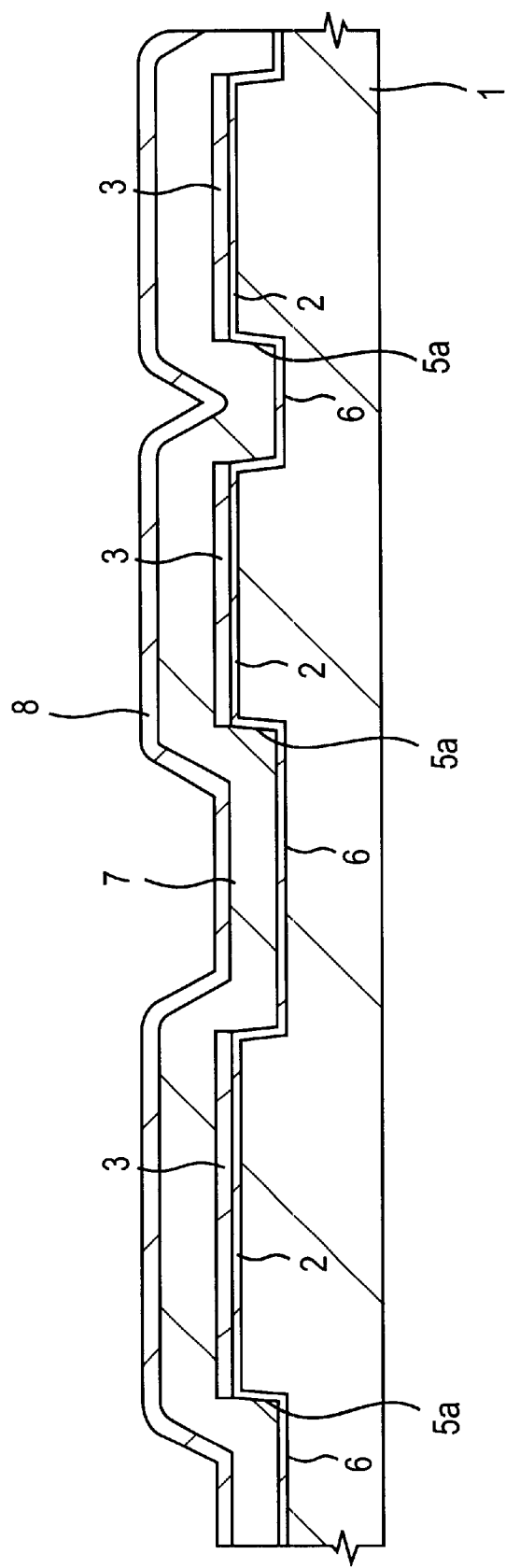
FIG. 7 is a sectional view of an essential portion of a semiconductor substrate showing a fabrication method of the DRAM of an embodiment of the present invention.
Figure 8:
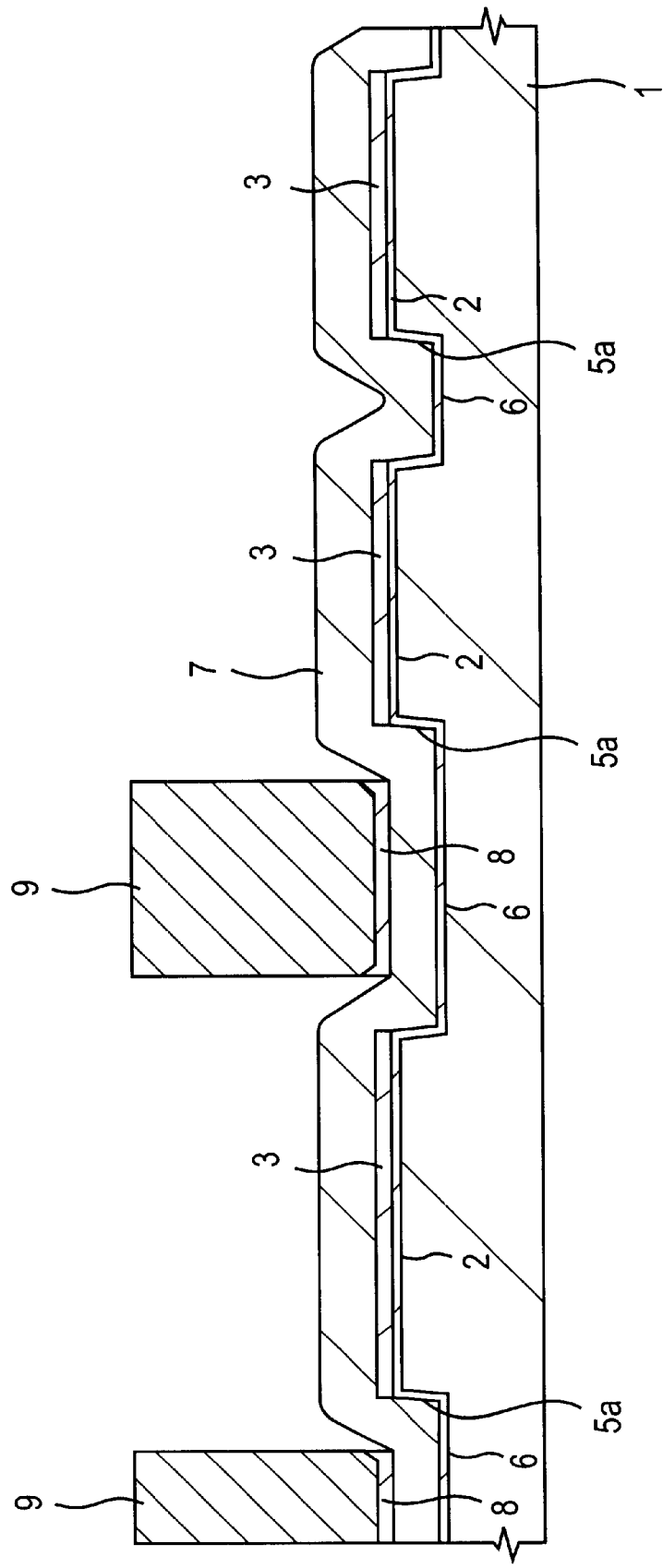
FIG. 8 is a sectional view of an essential portion of a semiconductor substrate showing a fabrication method of the DRAM of an embodiment of the present invention.
Figure 9:
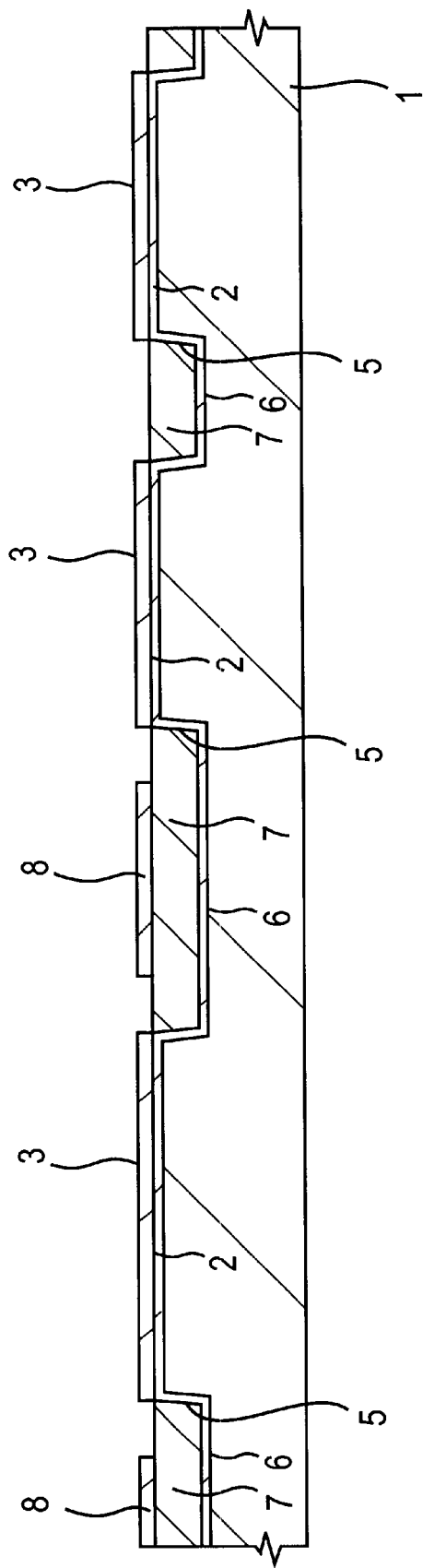
FIG. 9 is a sectional view of an essential portion of a semiconductor substrate showing a fabrication method of the DRAM of an embodiment of the present invention.

Then, a silicon nitride film 8 having a thickness of approx. 140 nm is deposited on the silicon oxide film 7 by the CVD method as shown in FIG. 7 and thereafter, dry-etched by using a photoresist film 9 as a mask as shown in FIG. 8 to leave the silicon nitride film 8 only on the groove 5a having a relatively large area like the boundary between a memory array and a peripheral circuit region. The silicon nitride film 8 left on the groove 5a is formed to prevent the phenomenon (dishing) in which the silicon oxide film 7 inside of the groove 5a having a relatively large area from being deeply polished compared to the silicon oxide film 7 inside of the groove 5a having a relatively small area when flattening the silicon oxide film 7 by polishing it by the CMP method in the next step.

Then, the photoresist film 9 is removed and thereafter, a device separation groove 5 is formed by polishing the silicon oxide film 7 by the CMP method using the silicon nitride films 3 and 8 as stoppers and leaving the film 7 in the groove 5a.

Figure 10:
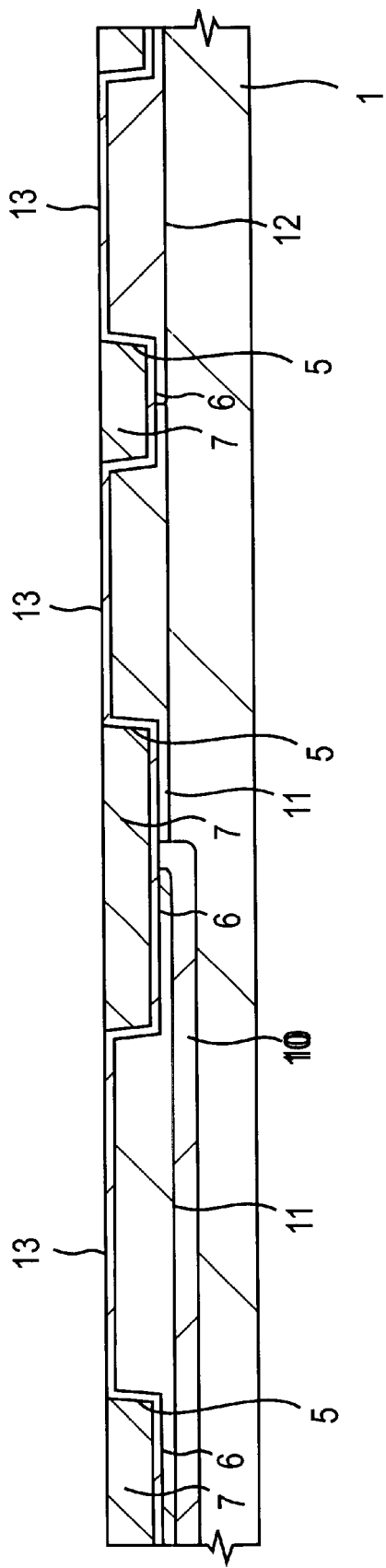
FIG. 10 is a sectional view of an essential portion of a semiconductor substrate showing a fabrication method of the DRAM of an embodiment of the present invention.

Then, the silicon nitride films 3 and 8 are removed by the wet etching using hot phosphoric acid and thereafter, ions of an n-type impurity such as P (phosphorus) are implanted into the semiconductor substrate 1 in the region (memory array) where a memory cell is formed to form an n-type semiconductor region 10 as shown in FIG. 10, ions of p-type impurity such as B (boron) is implanted into the memory array and a part of the peripheral circuit region (region where an n-channel MISFET is formed) to form a p-type well 11, and ions of an n-type impurity such as P (phosphorus) are implanted into other part of the peripheral circuit region (region where a p-channel MISFET is formed) to form an n-type well 12. Moreover, after the ion implantation, an impurity for adjusting the threshold voltage of the MISFET such as $BF_2$ (boron fluoride) are implanted into the p-type well 11 and n-type well 12. The n-type semiconductor region 10 is formed to prevent noises from entering the p-type well 11 of the memory array from an input/output circuit or the like through the semiconductor substrate 1.

Then, the silicon oxide film 2 of the surfaces of the p-type well 11 and n-type well 12 is removed by an HF(hydrofluoric acid)-based cleaning solvent and thereafter, the semiconductor substrate 1 is wet-oxidized at approx. 850° C. to form a clean gate oxide film 13 on the surfaces of the p-type well 11 and n-type well 12 respectively.

Though not restricted, by forming the gate oxide film 13 and thereafter, heat-treating the semiconductor substrate 1 in an NO (nitrogen oxide) environment or an $N_2O$ (nitrogen suboxide) environment, it is possible to segregate nitrogen at the interface between the gate oxide film 13 and the semiconductor substrate 1 (oxidation-nitration treatment). When the thickness of the gate oxide film 13 decreases up to approx. 7 nm, a strain produced at the interface between the gate oxide film 13 and the semiconductor substrate 1 is realized due to the difference between their thermal expansion coefficients to cause hot carriers to occur. Because the nitrogen segregated at the interface with the semiconductor substrate 1 moderates the strain, the oxidation-nitration treatment can improve the reliability of the thin gate oxide film 13.

Figure 11:
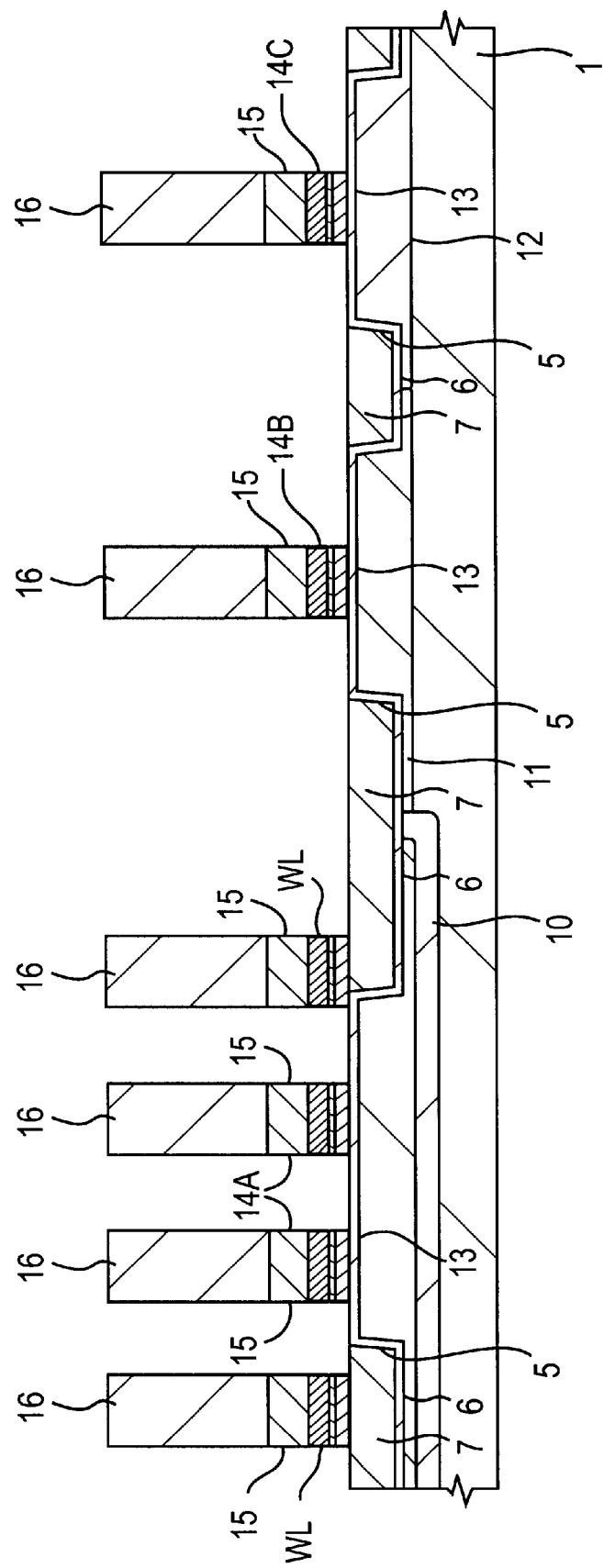
FIG. 11 is a sectional view of an essential portion of a semiconductor substrate showing a fabrication method of the DRAM of an embodiment of the present invention.

Then, as shown in FIG. 11, gate electrodes 14A, 14B, and 14C are formed on the gate oxide film 13. The gate electrode 14A constitutes a part of a memory cell selecting MISFET and is used as a word line WL in regions other than an active region. The width or gate length of the gate electrode 14A (word line WL) is set to a minimum value (e.g. approx. 0.24 $\mu$m) in an allowable range capable of controlling the short channel effect of the memory cell selecting MISFET and securing a threshold voltage. Moreover, the interval between adjacent gate electrodes 14A (word lines WL) is set to a minimum value (e.g. 0.22 $\mu$m) determined by the resolution limit of photolithography. The gate electrodes 14B and 14C constitute a part of the n-channel MISFET and p-channel MISFET serving as peripheral circuits.

The gate electrodes 14A (word line WL), 14B, and 14C are formed by depositing a polysilicon film having a thickness of approx. 70 nm doped with an n-type impurity such as P (phosphorus) on the semiconductor substrate 1 by the CVD method, then depositing a WN (tungsten nitride) film having a thickness of approx. 50 nm and a W film having a thickness of approx. 100 nm on the polysilicon film by the sputtering method. Then a silicon nitride film 15 having a thickness of approx. 150 nm is deposited on the WN film and W film by the CVD method, and thereafter these films are patterned by using a photoresist film 16 as a mask. The WN film functions as a barrier layer for preventing a silicide layer from being formed at the interface between the W film and the polysilicon film because the both films react on each other under high-temperature heat treatment. The barrier layer can use not only the WN film but also a TiN (titanium nitride) film.

When constituting a part of the gate electrode 14A with a low-resistivity metal (W), it is possible to decrease the sheet resistivity of the electrode 14A up to 2 to 2.5 $\Omega/\square$. Therefore, it is possible to decrease the delay of a word line. Moreover, because a word line delay can be decreased without lining a gate electrode 14 (word line WL) with an Al wiring, it is possible to further decrease the number of wiring layers formed on a memory cell.

Then, the photoresist 16 is removed and thereafter, dry etching residue and photoresist residue left on the surface of the semiconductor substrate 1 are removed by using an etching solution such as hydrofluoric acid. When the wet etching is performed, the gate oxide film 13 in regions other than the lower sides of the gate electrode 14A (word line WL) and the gate electrodes 14B and 14C is chipped and moreover, the gate oxide film 13 at the lower side of the gate side wall is etched in isotropic manner and undercut occurs. Therefore, under the above condition, the withstand voltage of the gate oxide film 13 decreases. Thus, the quality of the chipped gate oxide film 13 is improved by wet-oxidizing the semiconductor substrate 1 at approx. 900° C.

Figure 12:
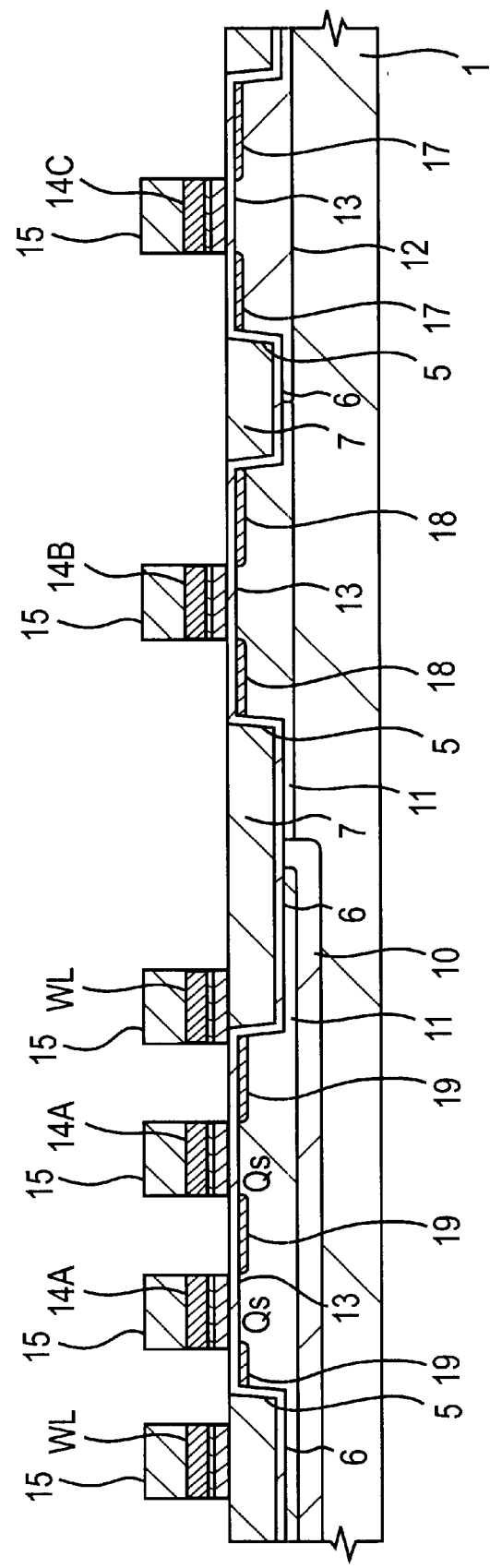
FIG. 12 is a sectional view of an essential portion of a semiconductor substrate showing a fabrication method of the DRAM of an embodiment of the present invention.

Then, as shown in FIG. 12, ions of a p-type impurity such as B (boron) are implanted into the n-type well 12 to form a p-type semiconductor region 17 on the n-type well 12 at the both sides of the gate electrode 14C. Moreover, ions of an n-type impurity such as P (phosphorus) are implanted into the p-type well 11 to form an n-type semiconductor region 18 on the p-type well 11 at the both sides of the gate electrode 14B and form an n-type semiconductor region 19 on the p-type well 11 at the both sides of the gate electrode 14A. Thereby, memory cell selecting MISFET Qs is formed on the memory array.

Figure 13:
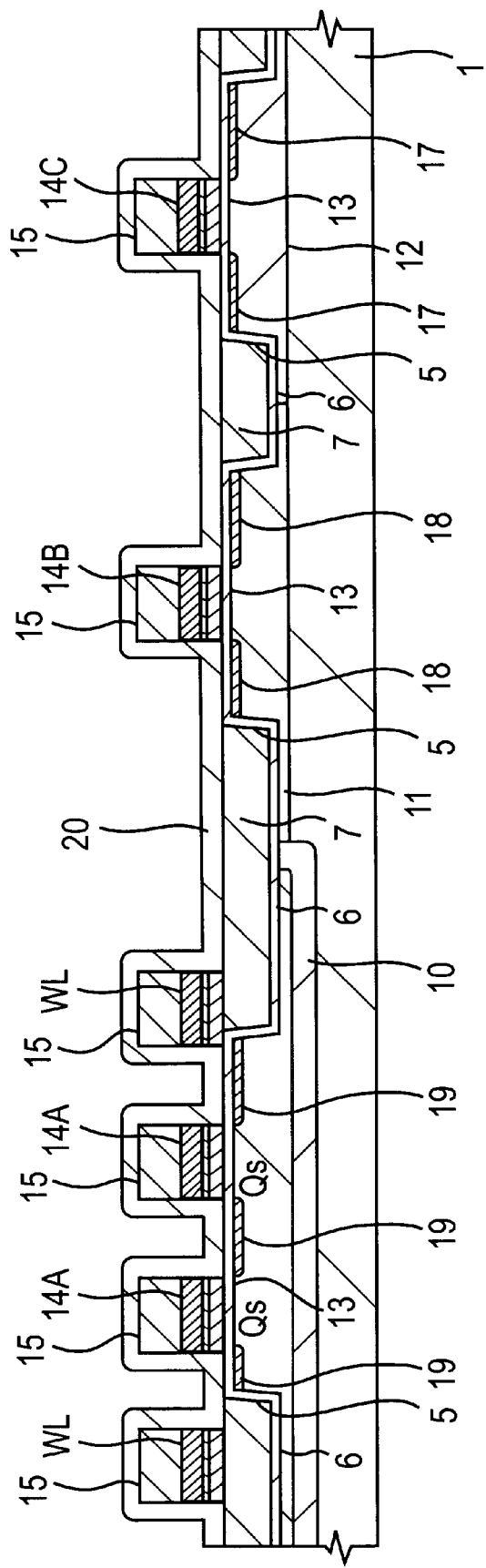
FIG. 13 is a sectional view of an essential portion of a semiconductor substrate showing a fabrication method of the DRAM of an embodiment of the present invention.
Figure 14:
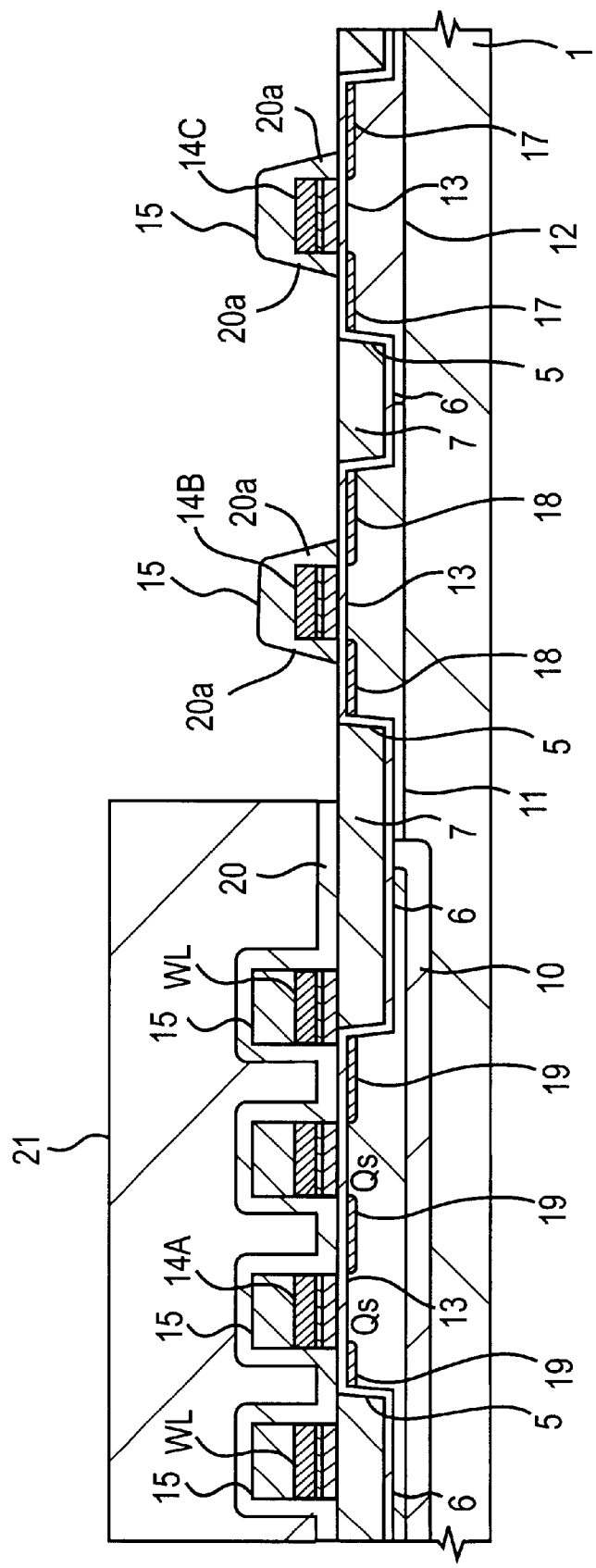
FIG. 14 is a sectional view of an essential portion of a semiconductor substrate showing a fabrication method of the DRAM of an embodiment of the present invention.

Then, a silicon nitride film 20 having a thickness of 50 to 100 nm is deposited on the semiconductor substrate 1 by the CVD method as shown in FIG. 13 and thereafter, as shown in FIG. 14 the silicon nitride film 20 of the memory array is covered with a photoresist film 21, and anisotropic etching is applied to the silicon nitride film 20 in the peripheral circuit region to form a side wall spacer 20a on the side walls of the gate electrodes 14B and 14C. This etching is performed by using an etching gas so that the etching rate of the silicon nitride film 20 becomes larger than that of a silicon oxide film in order to minimize the amount of the gate oxide film 13 to be chipped or the silicon oxide film 7 embedded in the device separation groove 5. Moreover, to minimize the amount of the silicon nitride film 15 to be chipped on the gate electrodes 14B and 14C, the degree of over-etching is minimized.

Figure 15:
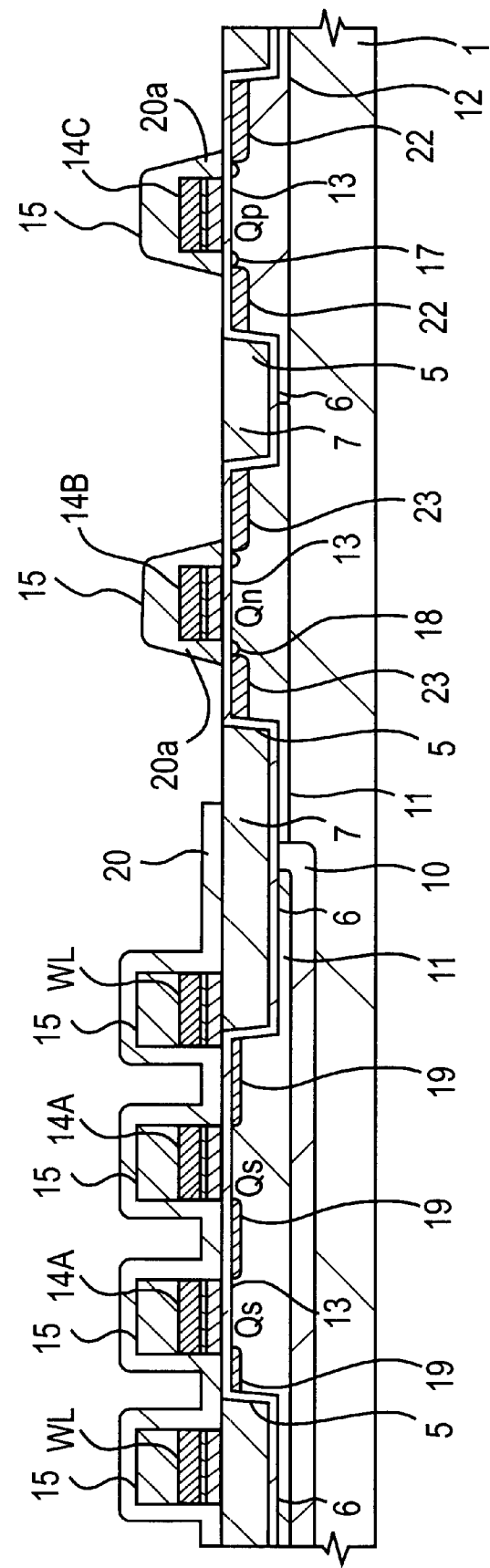
FIG. 15 is a sectional view of an essential portion of a semiconductor substrate showing a fabrication method of the DRAM of an embodiment of the present invention.

Then, the photoresist 21 is removed and thereafter, as shown in FIG. 15, ions of a p-type impurity such as B (boron) are implanted into the n-type well 12 in the peripheral circuit region a $p^+$-type semiconductor region 22 (source and drain) of the p-channel MISFET and ions of a n-type impurity such as As (arsenic) are implanted into the p-type well 11 in the peripheral circuit region to form an, $n^+$type semiconductor region 23 (source and drain) of the n-channel MISFET. Thereby, a p-channel MISFET Qp and n-channel MISFET Qn respectively having an LDD (Lightly Doped Drain) groove in the peripheral circuit region are formed.

Figure 16:
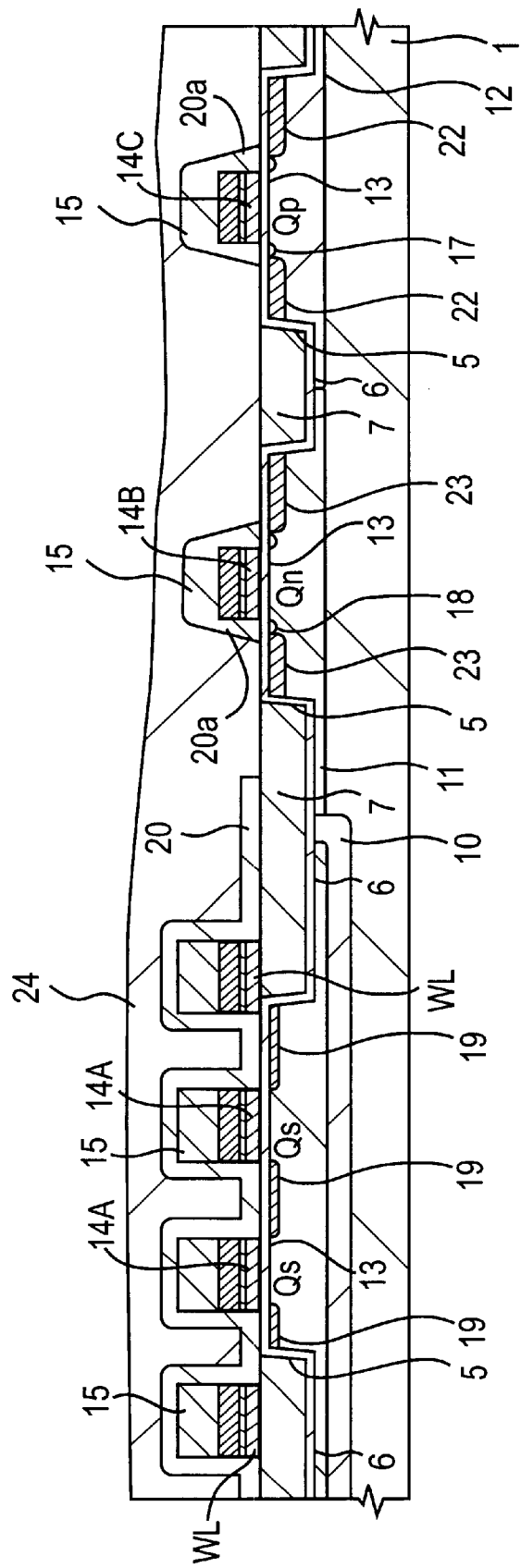
FIG. 16 is a sectional view of an essential portion of a semiconductor substrate showing a fabrication method of the DRAM of an embodiment of the present invention.

Then, as shown in FIG. 16, a SOG (spin-on-glass) film 24 having a thickness of approx. 300 nm is spin-coated on the semiconductor substrate 1 and thereafter, the semiconductor substrate 1 is heat-treated at 800° C. for approx. 1 min to sinter the SOG film 24.

Figure 17:
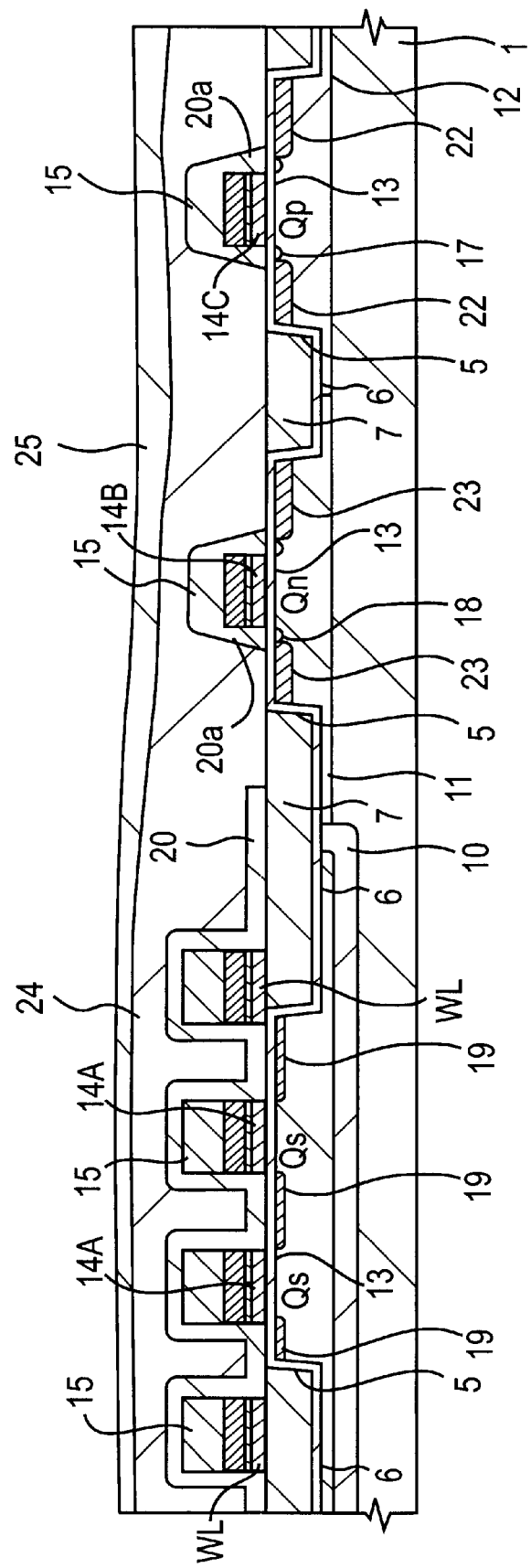
FIG. 17 is a sectional view of an essential portion of a semiconductor substrate showing a fabrication method of the DRAM of an embodiment of the present invention.

Then, as shown in FIG. 17, a silicon oxide film 25 having a thickness of approx. 600 nm is deposited on the SOG film 24 and thereafter, polished by the CMP method to flatten the surface of the film 25. The silicon oxide film 25 is deposited by the plasma CVD method using ozone ($O_3$) and tetra-ethoxysilane (TEOS) as source gases.

Thus, in the case of this embodiment, the SOG film 24 having a high flatness is applied onto the gate electrode 14A (word line) and the gate electrodes 14B and 14C even immediately after film formation and moreover, the silicon oxide film 25 deposited on the film 24 is flattened by the CMP method. Thereby, the gap filling characteristic of a small gap between the gate electrodes 14A (word lines WL) is improved and it is possible to flatten an insulating film on the gate electrode 14A (word line WL) and the gate electrodes 14B and 14C.

Figure 18:
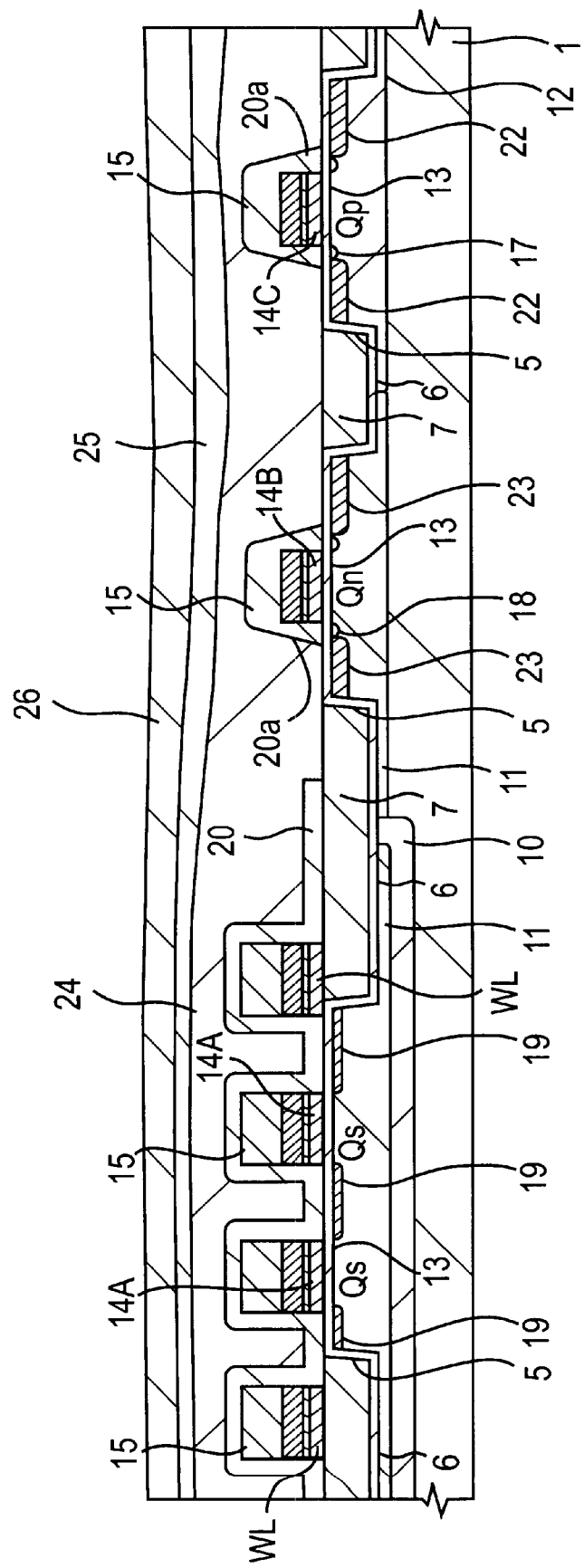
FIG. 18 is a sectional view of an essential portion of a semiconductor substrate showing a fabrication method of the DRAM of an embodiment of the present invention.

Then, as shown in FIG. 18, a silicon oxide film 26 having a thickness of approx. 100 nm is deposited on the silicon oxide film 25. The silicon oxide film 26 is deposited to repair fine scratches on the surface of the silicon oxide film 25 produced when the film 25 is polished by the CMP method. The silicon oxide film 26 is deposited by the plasma CVD method using ozone ($O_3$) and tetraethoxysilane (TEOS) as source gases. Moreover, it is possible to deposit a PSG (Phospho Silicate Glass) film on the silicon oxide film 25 instead of the silicon oxide film 26.

Figure 19:
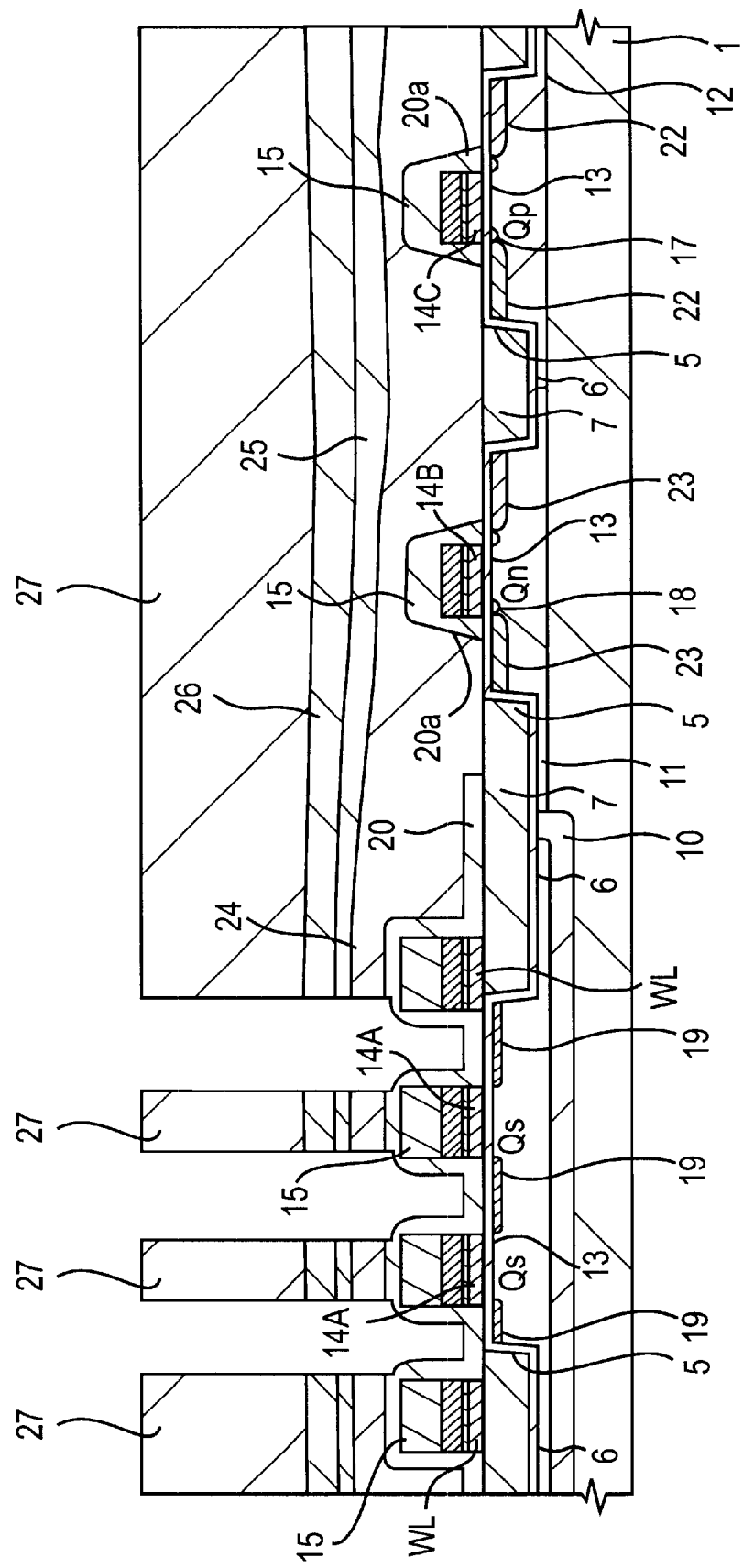
FIG. 19 is a sectional view of an essential portion of a semiconductor substrate showing a fabrication method of the DRAM of an embodiment of the present invention.

Then, as shown in FIG. 19, the silicon oxide films 26 and 25 and the SOG film 24 on the n-type semiconductor region (source and drain) of the memory cell selecting MISFET Qs are removed by the dry etching using a photoresist film 27 as a mask. This etching is performed under conditions in which etching rates of the silicon oxide films 26 and 25 and the SOG film 24 for the silicon nitride film 20 increase so that the silicon nitride film 20 covering the upper sides of the n-type semiconductor region 19 and the device separation groove 5 are not completely removed.

Figure 20:
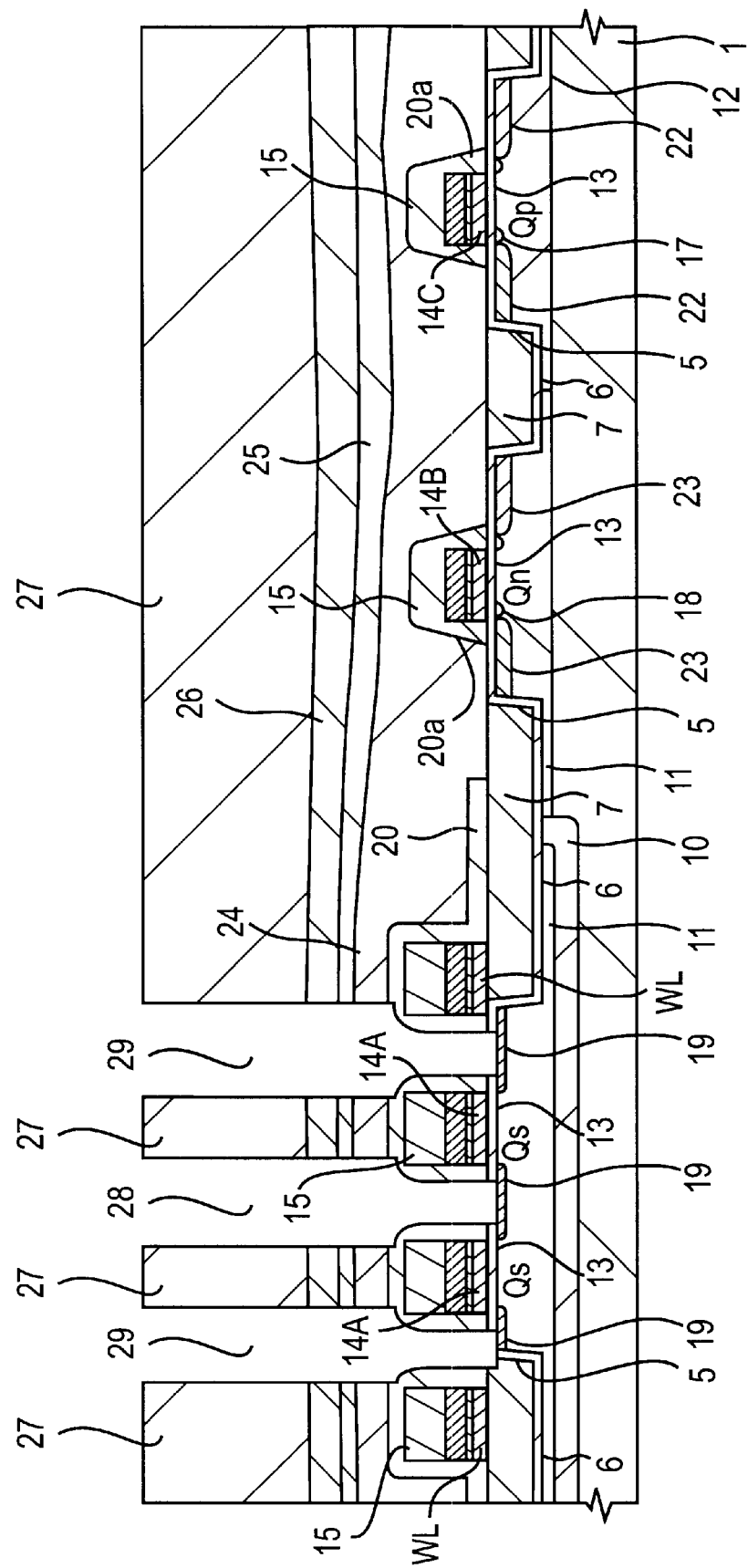
FIG. 20 is a sectional view of an essential portion of a semiconductor substrate showing a fabrication method of the DRAM of an embodiment of the present invention.

Then, as shown in FIG. 20, the silicon nitride film 15 and the gate oxide film 13 on the n-type semiconductor region 19 (source and drain) of the memory cell selecting MISFET Qs are removed by the dry etching using the photoresist film 27 as a mask to form a contact hole 28 on the upper side of one side of the n-type semiconductor 19 (source and drain) and a contact hole 29 on the upper side of the other side of the semiconductor 19.

The above dry etching is performed under a condition in which the etching rate of the silicon nitride film 20 becomes larger than that of silicon oxide films (the gate oxide film 13 and the silicon oxide film 7 in the device separation groove 5) so that the n-type semiconductor region 19 or device separation groove 5 is not deeply chipped. Moreover, the etching is performed under a condition in which the silicon nitride film 20 is etched in anisotropic manner so that the silicon nitride film 20 is left on the side wall of the gate electrode 14A (word line WL). Thereby, the contact holes 28 and 29 respectively having a fine diameter equal to or less than the resolution limit of photolithography are formed on the gate electrode 14A (word line WL) in self-alignment. To form the contact holes 28 and 29 on the gate electrode 14A (word line WL) in self-alignment, it is also possible to previously anisotropy-etching the silicon nitride film 20 and form a side wall spacer on the side wall of the gate electrode 14A (word line WL).

Then, the photoresist film 27 is removed to remove the dry etching residue and photoresist residue from the substrate surface exposed to the bottoms of the contact holes 28 and 29. In this case, the SOG film 24 exposed to the side walls of the contact holes 28 and 29 is also exposed to an etching solution. However, because the etching rate of the SOG film 24 by a hydrofluoric-acid-based etching solution is decreased because of the above sintering at approx. 800° C., the side wall of the contact hole 28 or 29 is not greatly undercut by this wet etching. Thereby, it is possible to securely prevent plugs to be embedded in the contact holes 28 and 29 in the next step from shortcircuiting each other.

Figure 21:
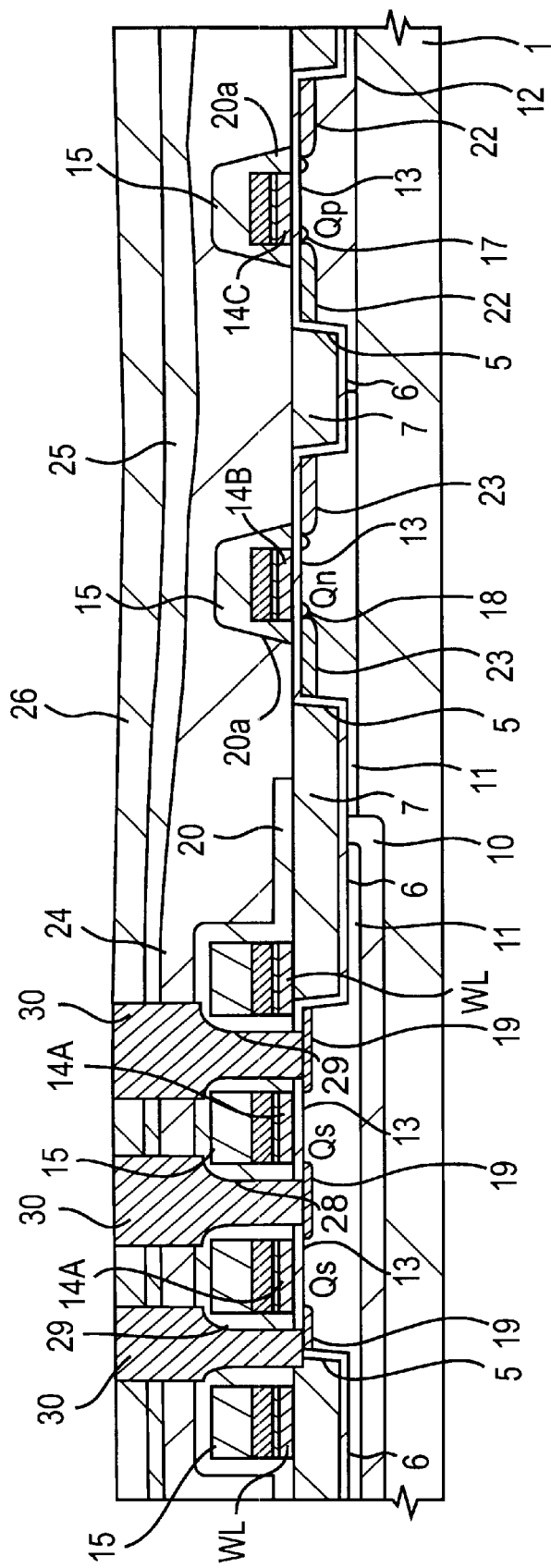
FIG. 21 is a sectional view of an essential portion of a semiconductor substrate showing a fabrication method of the DRAM of an embodiment of the present invention.

Then, as shown in FIG. 21, a plug 30 is formed inside of the contact holes 28 and 29 respectively. The plug 30 is formed by depositing a polysilicon film obtained by doping the upper side of the silicon oxide film 26 with an n-type impurity (e.g., phosphorus) and thereafter, polishing the polysilicon film by the CMP method and leaving the film in the contact holes 28 and 29.

Figure 22:
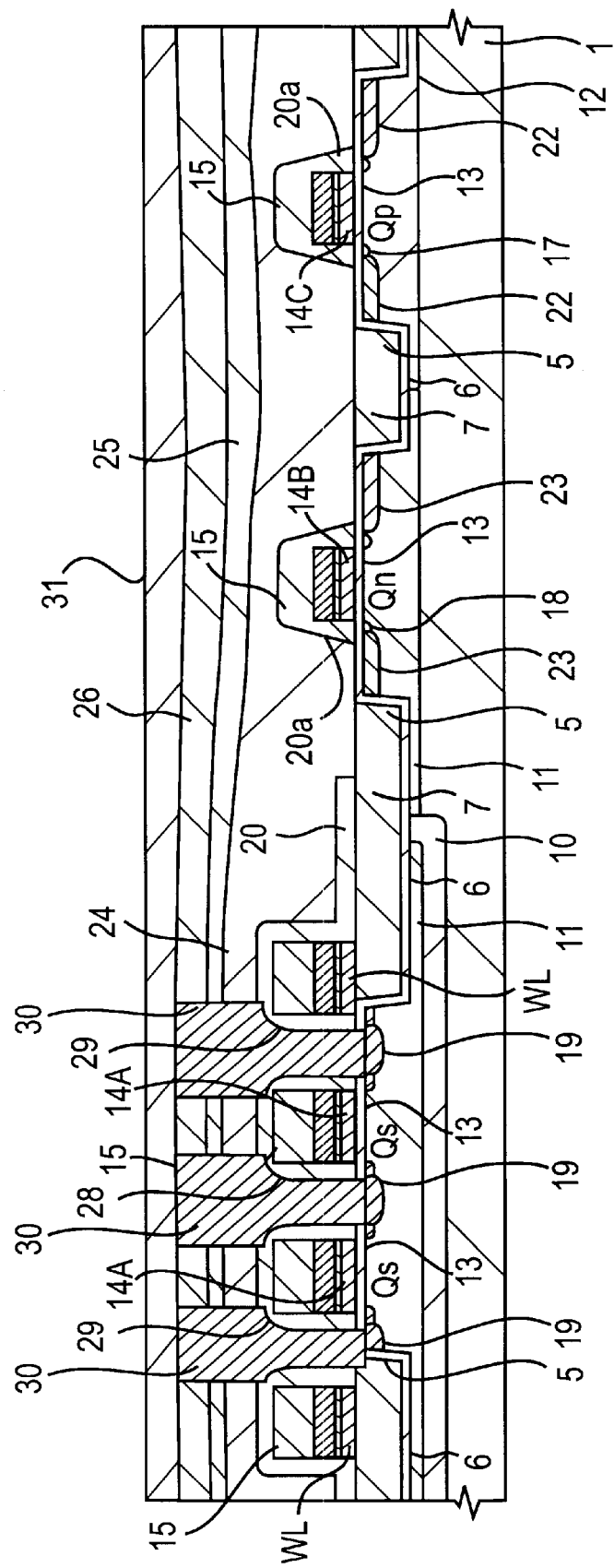
FIG. 22 is a sectional view of an essential portion of a semiconductor substrate showing a fabrication method of the DRAM of an embodiment of the present invention.

Then, as shown in FIG. 22, a silicon oxide film 31 having a thickness of approx. 200 nm is deposited on the silicon oxide film 26 and thereafter, the semiconductor substrate 1 is heat-treated at approx. 800° C. The silicon oxide film 31 is deposited by the plasma CVD method using, for example, ozone ($O_3$) and tetraethoxysilane (TEOS) as source gases. According to this heat treatment, the n-type impurity in the polysilicon film constituting the plug 30 diffuses into the n-type semiconductor region 19 (source and drain) of the memory cell selecting MISFET Qs from the bottoms of the contact holes 28 and 29 and the resistivity of the n-type semiconductor region 19 is decreased.

Figure 23:
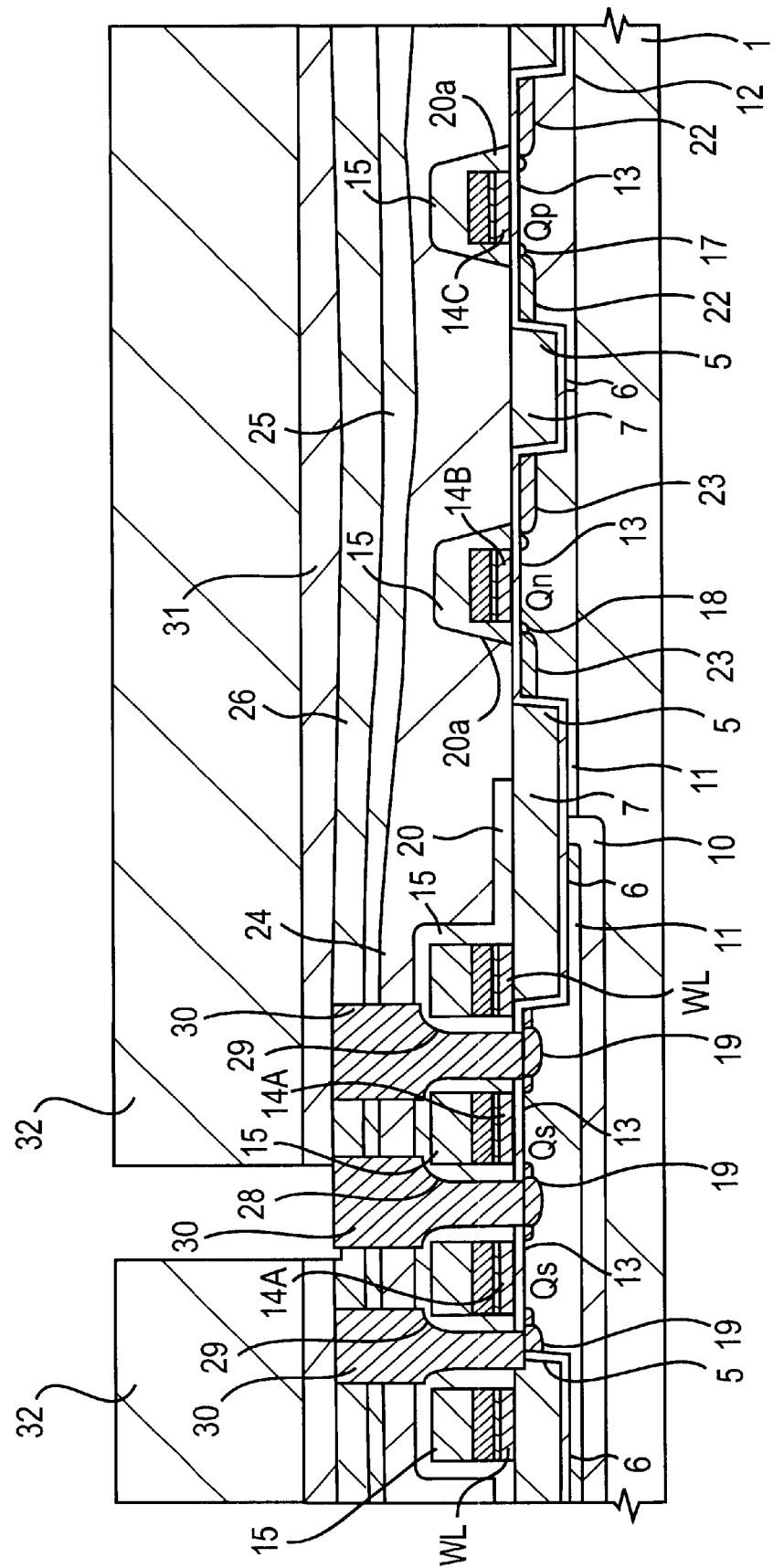
FIG. 23 is a sectional view of an essential portion of a semiconductor substrate showing a fabrication method of the DRAM of an embodiment of the present invention.
Figure 24:
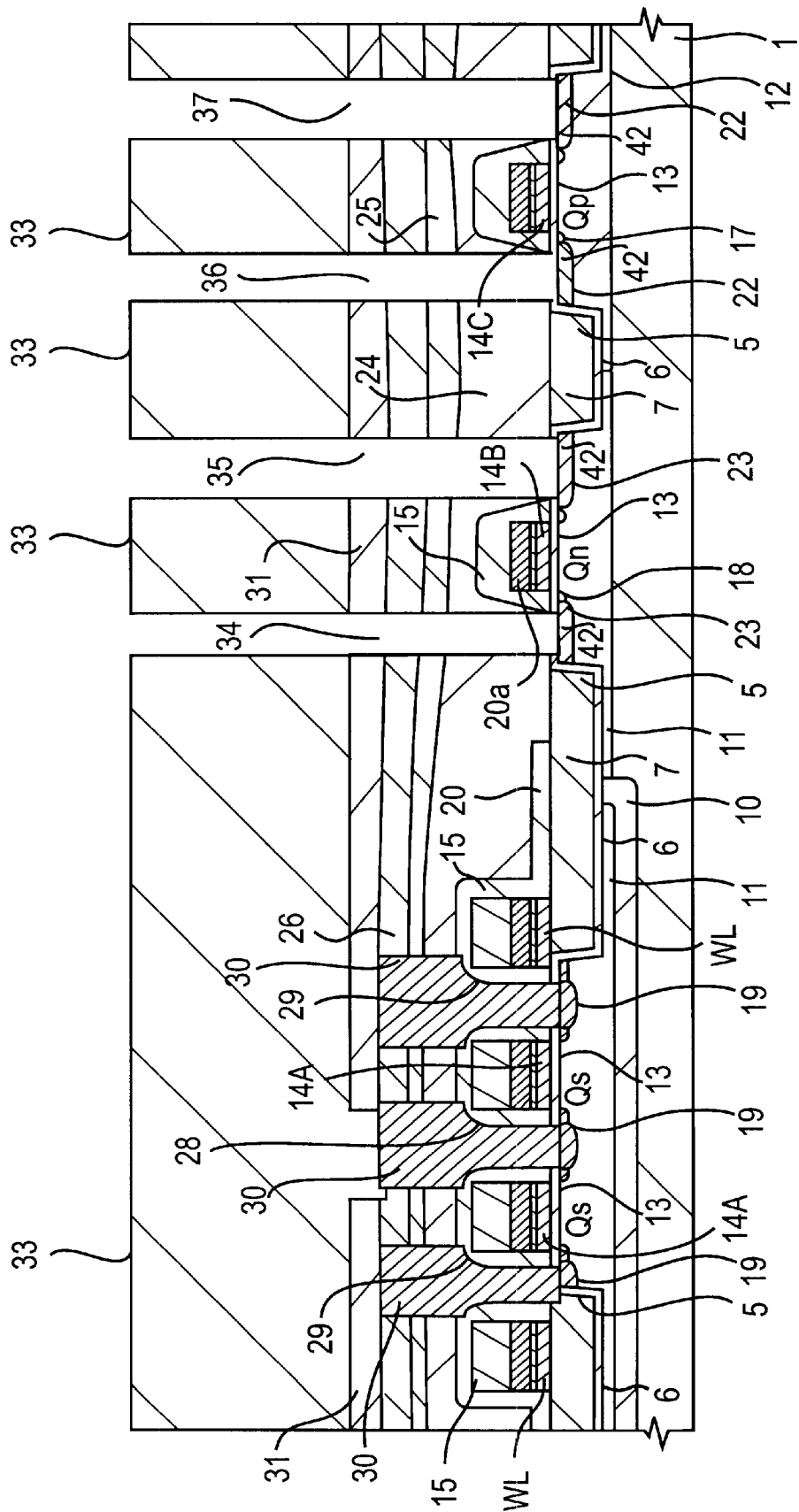
FIG. 24 is a sectional view of an essential portion of a semiconductor substrate showing a fabrication method of the DRAM of an embodiment of the present invention.

Then, as shown in FIG. 23, the silicon oxide film 31 on the contact hole 28 is removed by the dry etching using the photoresist film 32 as a mask to expose the surface of the plug 30. Then, the photoresist film 32 is removed and as shown in FIG. 24, the silicon oxide films 31, 26, and 25, SOG film 24, and gate oxide film 13 in the peripheral circuit region are removed by the dry etching using the photoresist film 33 as a mask to form contact holes 34 and 35 on the $n^+$-type semiconductor region 23 (source and drain) of the n-channel MISFET Qn and form contact holes 36 and 37 on the $p^+$-type semiconductor region 22 (source and drain) of the p-channel MISFET Qp.

Figure 25:
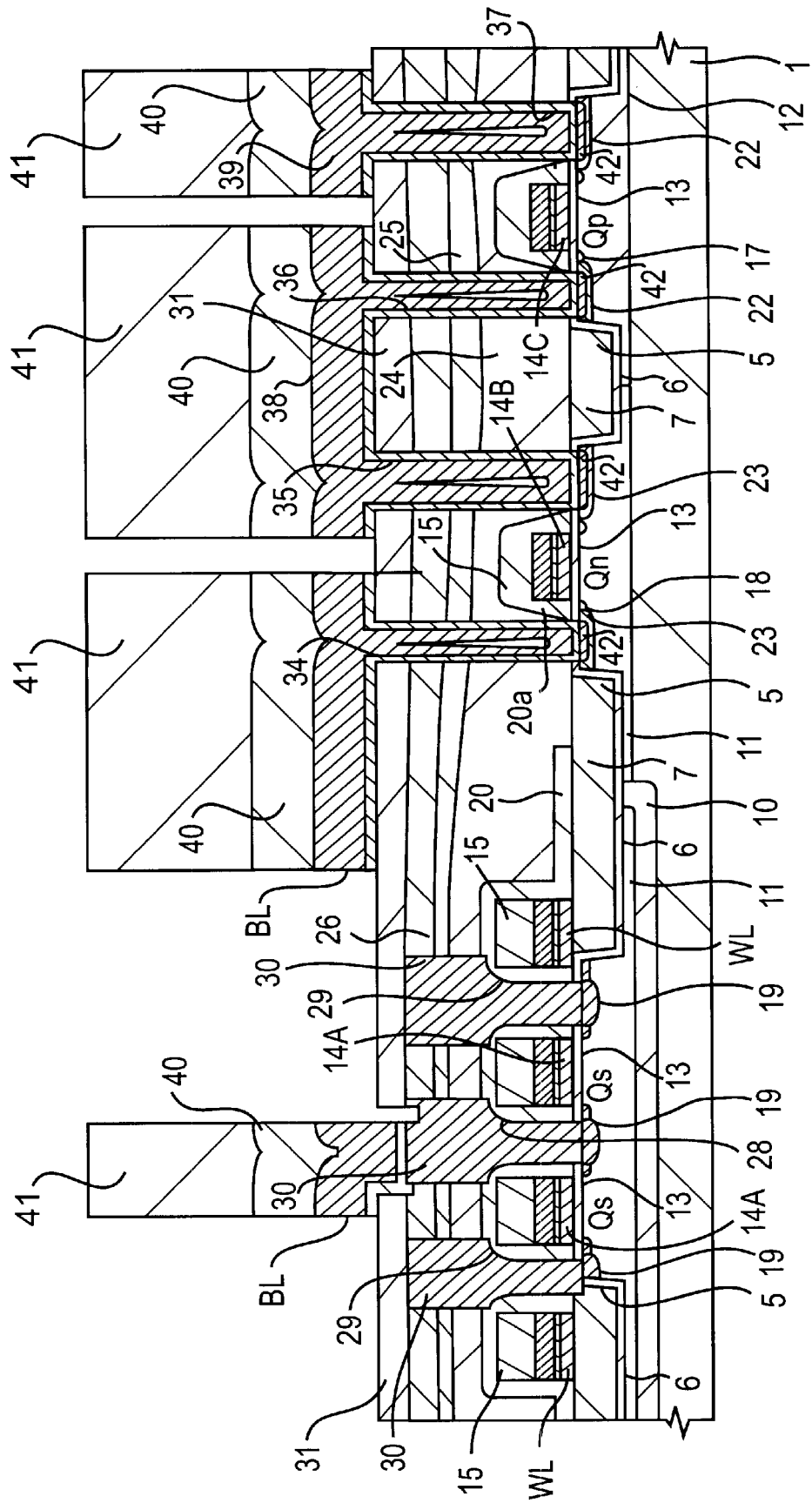
FIG. 25 is a sectional view of an essential portion of a semiconductor substrate showing a fabrication method of the DRAM of an embodiment of the present invention.

Then, the photoresist film 33 is removed and thereafter, as shown in FIG. 25, the bit line BL and first-layer wirings 38 and 39 of peripheral circuits are formed on the silicon oxide film 31. To form the bit line BL and first-layer wirings 38 and 39, a Ti film having a thickness of approx. 50 nm is first deposited on the silicon oxide film 31 by the sputtering method to heat-treat the semiconductor substrate 1 at approx. 800° C. Then, a TiN film having a thickness of approx. 50 nm is deposited on the Ti film by the sputtering method and moreover, a W film having a thickness of approx. 150 nm and a silicon nitride film 40 having a thickness of 200 nm are deposited on the TiN film and thereafter, these films are patterned by using the photoresist film 41 as a mask.

By depositing the Ti film on the silicon oxide film 31 and then heat-treating the semiconductor substrate 1 at approx. 800° C., the Ti film reacts on the Si substrate and a low-resistivity $TiSi_2$ (titanium silicide) layer 42 is formed on the surface of the n+-type semiconductor region 23 (source and drain) of the n-channel MISFET Qn and the surface of the $p^+$-type semiconductor region 22 (source and drain) of the p-channel MISFET Qp. In this case, though not illustrated, the $TiSi_2$ (titanium silicide) layer 42 is also formed on the surface of the plug 30 embedded in the contact hole 28 on the n-type semiconductor region 19 of the memory cell selecting MISFET Qs. Thereby, it is possible to decrease the contact resistivity of the wirings (bit line BL and first-layer wirings 38 and 39) to be connected to the $n^+$-type semiconductor region 23 and $p^+$-type semiconductor region 22. Moreover, by constituting a bit line BL with a W film/TiN film/Ti film, it is possible to decrease the sheet resistivity of a bit line BL up to 2 Ω/□ or less. Therefore, it is possible to improve the read speed and write speed of information and moreover, form a bit line BL and the first-layer wirings 38 and 39 of peripheral circuits in one step at the same time and thus, decrease the number of DRAM fabrication steps. Moreover, when constituting the first-layer wirings (38 and 39) of peripheral circuits with wirings at the same layer as a bit line BL, the connection reliability of the firs-layer wirings is improved compared to the case of constituting the first-layer wirings with Al wiring of the upper layer of a memory cell because the aspect ratios of contact holes (34 to 37) for connecting MISFETs (n-channel MISFET Qn and p-channel MISFET Qp) of peripheral circuits with the first-layer wirings are decreased.

Bit lines BL are formed so that the interval between them becomes longer than the width of each bit line BL in order to improve the information read speed and write speed by decreasing the parasitic capacitance formed between adjacent bit lines BL. The interval between the bit lines BL is set to, for example, approx. 0.24 μm and the width of each bit. line BL is set to, for example, approx. 0.22 μm.

Figure 26:
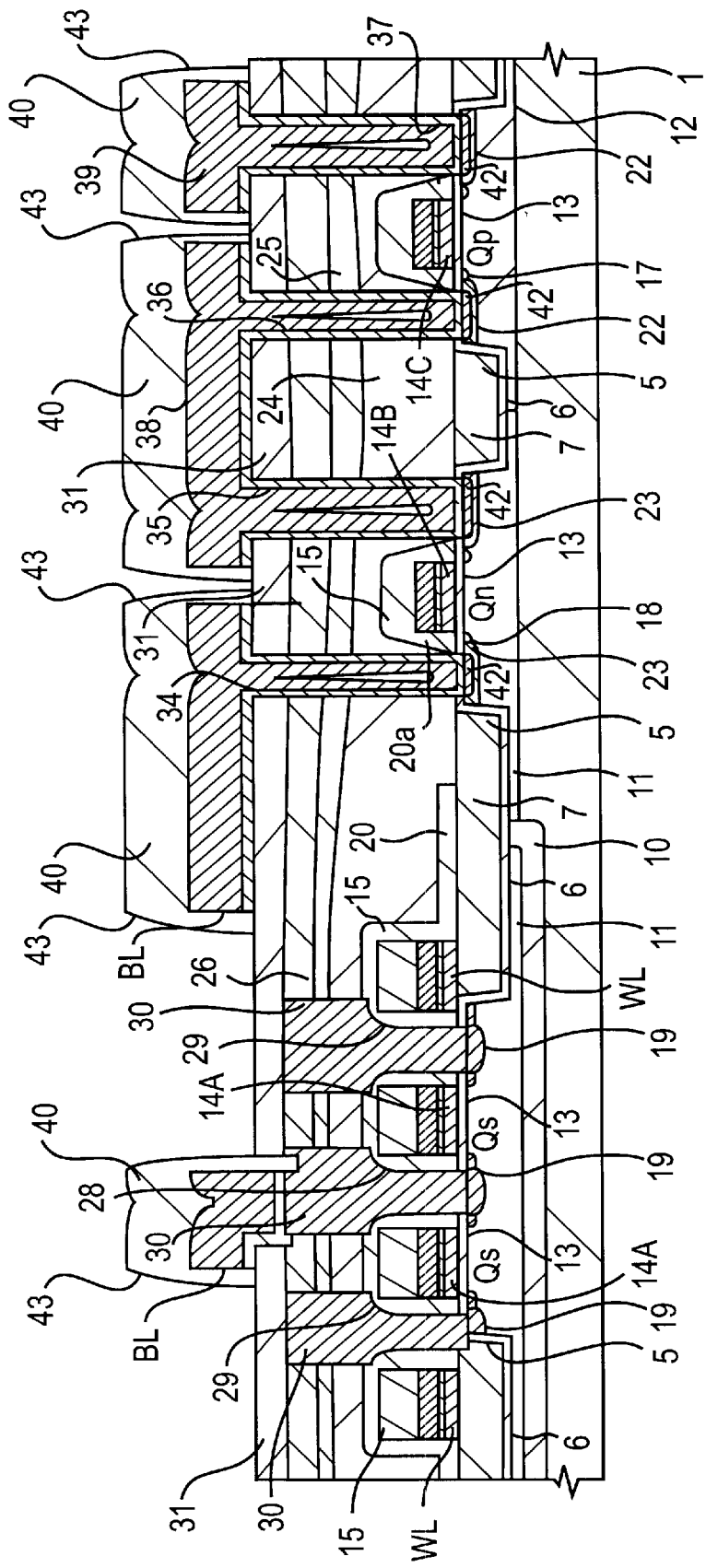
FIG. 26 is a sectional view of an essential portion of a semiconductor substrate showing a fabrication method of the DRAM of an embodiment of the present invention.

Then, the photoresist 41 is removed and thereafter, as shown in FIG. 26, a side wall spacer 43 is formed between the side wall of a bit line BL and those of the first-layer wirings 38 and 39. The side wall spacer 43 is formed by depositing a silicon nitride film on the bit line BL and first-layer wirings 38 and 39 by the CVD method and thereafter anisotropy-etching the silicon nitride film.

Figure 27:
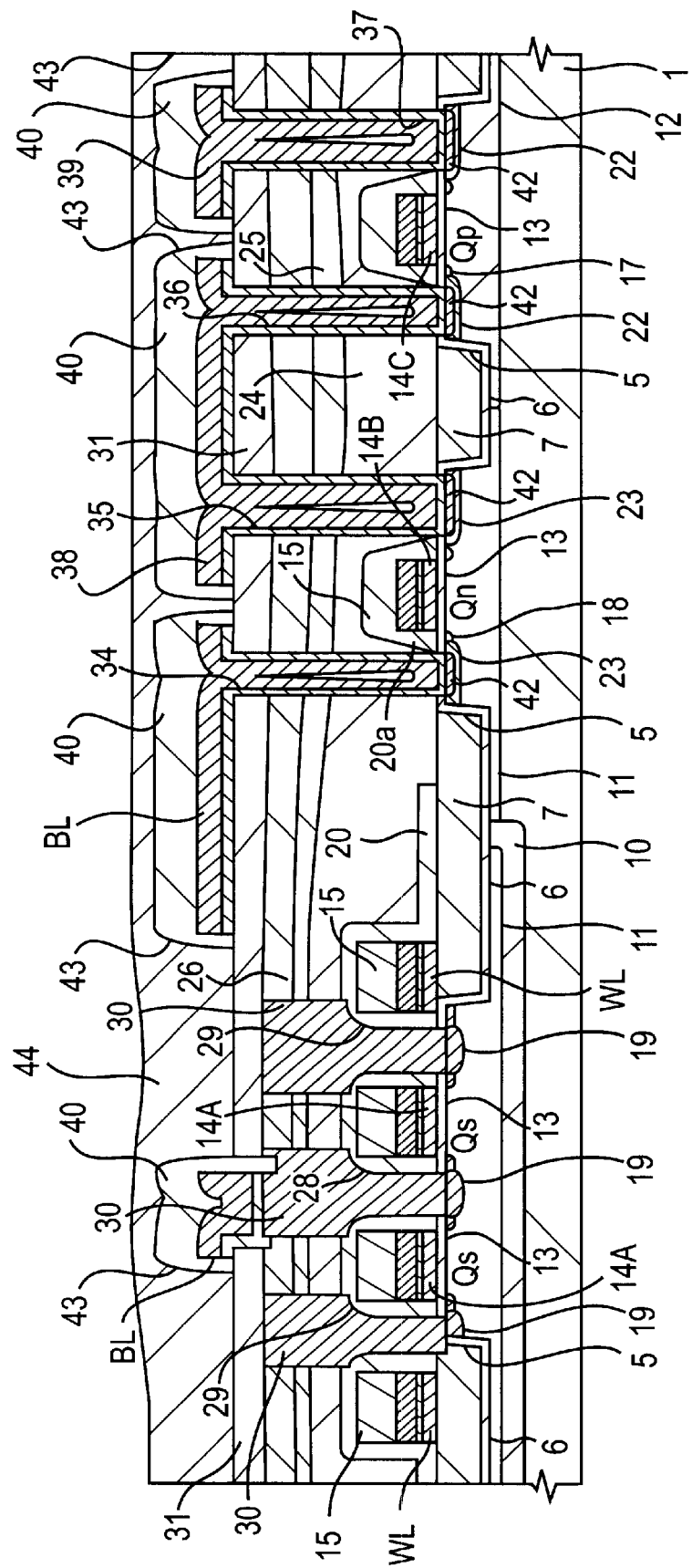
FIG. 27 is a sectional view of an essential portion of a semiconductor substrate showing a fabrication method of the DRAM of an embodiment of the present invention.

Then, as shown in FIG. 27, surfaces of a bit lines BL and the first-layer wirings 38 and 39 are spin-coated with an SOG film 44 having a thickness of approx. 300 nm. Then, the semiconductor substrate 1 is heat-treated at 800° C. for approx. 1 min to sinter the SOG film 44.

Because the SOG film 44 has a reflowing characteristic higher than that of a BPSG film and is superior in gap filling characteristic between fine wirings, it is possible to smoothly fill the gap between very fine bit lines BL which are made fine up to about the resolution limit of photolithography. Moreover, the SOG film 44 has a high reflowing characteristic without performing high-temperature and long-time heat treatment required for a BPSG film, the film 44 makes it possible to control thermal diffusion of impurities contained in the source and drain of the memory cell selecting MISFET Qs formed on the lower layer of a bit line BL and the sources and drains of MISFETs (n-channel MISFET Qn and p-channel MISFET Qp) of peripheral circuits and realize shallow conjunction. Furthermore, because the film 44 makes it possible to control the deterioration of metals (W films) constituting the gate electrode 14A (word line) and the gate electrodes 14B and 14C, it is possible to improve the performances of memory cells of a DRAM and MISFETs constituting peripheral circuits. Furthermore, the film 44 makes it possible to control the deterioration of a Ti film, TiN film, and W film constituting a bit line BL and the first-layer wirings 38 and 39 and decrease the wiring resistivity.

Figure 28:
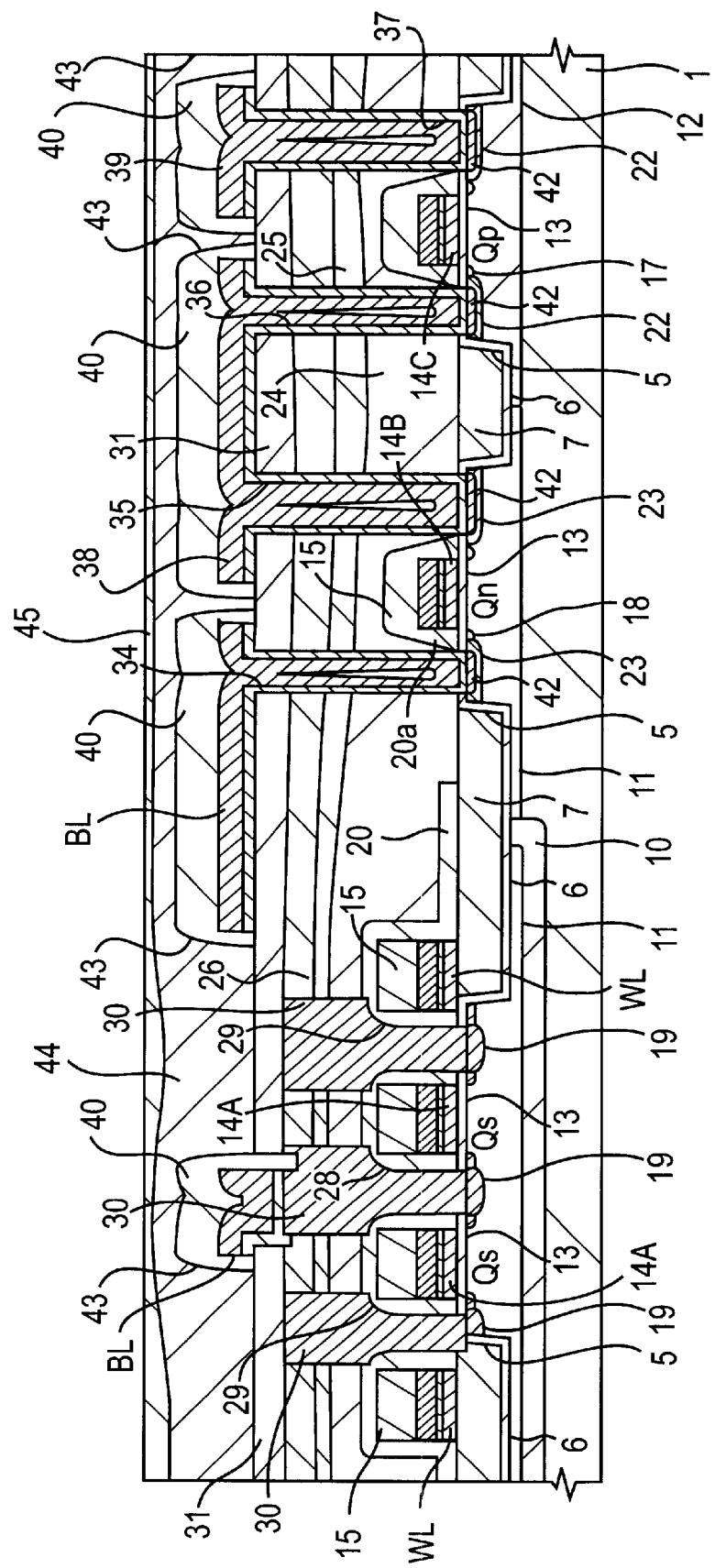
FIG. 28 is a sectional view of an essential portion of a semiconductor substrate showing a fabrication method of the DRAM of an embodiment of the present invention.

Then, as shown in FIG. 28, a silicon oxide film 45 having a thickness of 600 nm is deposited on the SOG film 44 and thereafter, polished by the CMP method to flatten the surface of the film 45. The silicon oxide film 45 is deposited by the plasma CVD method using, for example, ozone (O$_3$) and tetraethoxysilane (TEOS) as source gases.

Thus, in the case of this embodiment, the SOG film 44 having a high flatness is applied onto bit lines BL and the first-layer wirings 38 and 39 even immediately after film formation and moreover, the silicon oxide film 45 deposited on the film 44 is flattened by the CMP method. Thereby, the filling characteristic of a fine gap between bit lines BL is improved and it is possible to flatten the insulating film on bit lines BL and the first-layer wirings 38 and 39. Moreover, because high-temperature long-time heat treatment is not performed, it is possible to prevent the deterioration of characteristics of memory cells and MISFETs constituting peripheral circuits from deteriorating and realize high performances and decrease resistivities of bit lines BL and the first-layer wirings 38 and 39.

Figure 29:
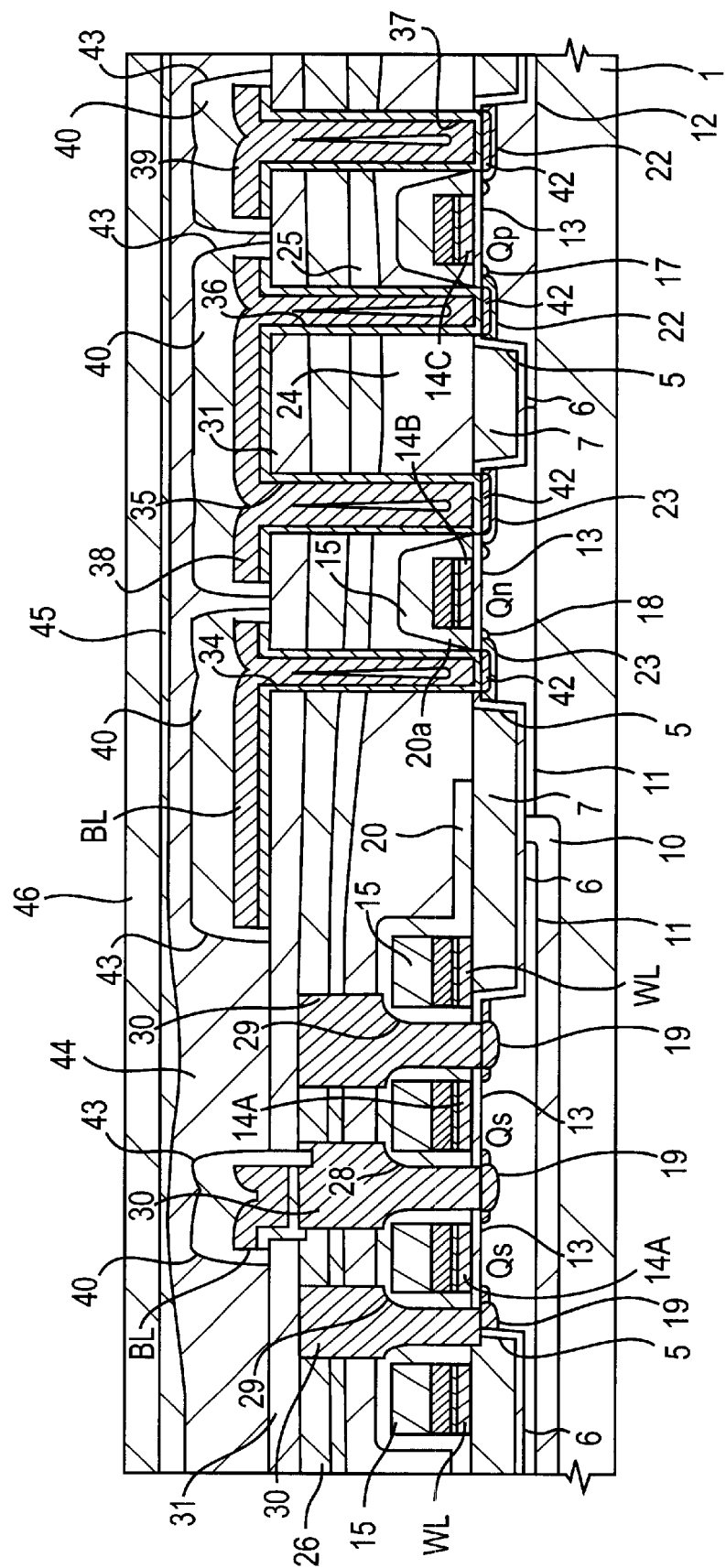
FIG. 29 is a sectional view of an essential portion of a semiconductor substrate showing a fabrication method of the DRAM of an embodiment of the present invention.

Then, as shown in FIG. 29, a silicon oxide film 46 having a thickness of approx. 100 nm is deposited on the silicon oxide film 45. The silicon oxide film 46 is deposited to repair fine scratches on the surface of the silicon oxide film 45 produced when polished by the CMP method. The silicon oxide film 46 is deposited by the plasma CVD method using, for example, ozone (O$_3$) and tetraethoxysilane (TEOS) as source gases.

Figure 30:
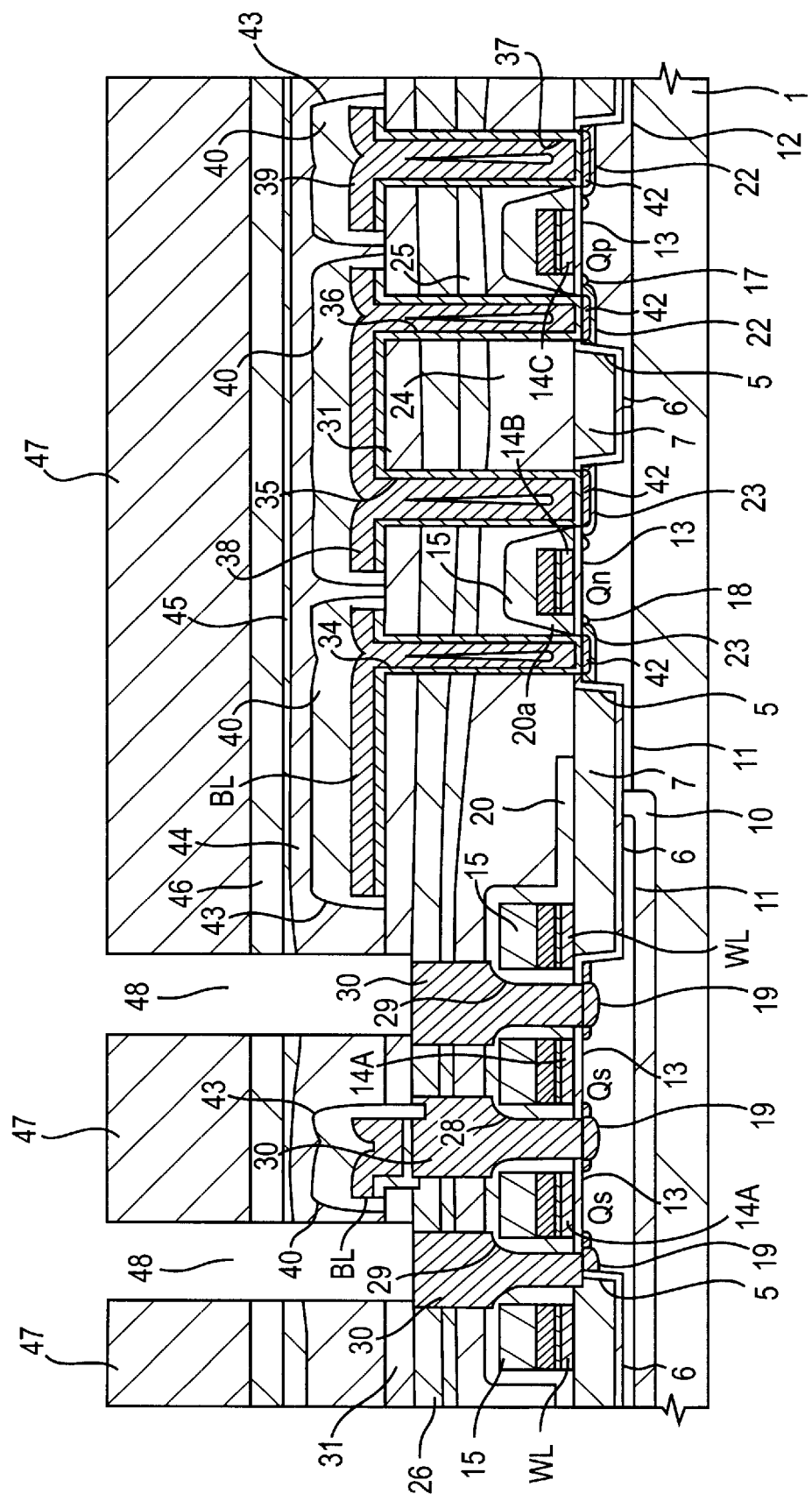
FIG. 30 is a sectional view of an essential portion of a semiconductor substrate showing a fabrication method of the DRAM of an embodiment of the present invention.

Then, as shown in FIG. 30, the silicon oxide films 46 and 45, SOG film 44, and silicon oxide film 31 on the contact hole 29 are removed by the dry etching using the photoresist film 47 as a mask to form a via-hole reaching the surface of the plug 30. This etching is performed under a condition in which the etching rate of a silicon nitride film becomes smaller than those of the silicon oxide films 46, 45, and 31 and SOG film 44 so that the silicon nitride film 40 on a bit line BL and the side wall spacer 43 are not deeply chipped even if misalignment between the via-hole 48 and a bit line BL occurs. Thereby, the via-hole 48 is formed on the bit line BL in self-alignment.

Then, the photoresist film 47 is removed and thereafter, the dry etching residue and photoresist residue are removed from the surface of the plug 30 exposed to the bottom of the via-hole 48 by using an etching solution such as a mixed solution of hydrofluoric acid and ammonium fluoride. In this case, the SOG film 44 exposed to the side wall of the via-hole 48 is also exposed to the etching solution. However, because the etching rate of the SOG film 44 by a hydrofluoric-acid-based etching solution is decreased due to the sintering at approx. 800° C., the side wall of the via-hole 48 is not greatly undercut by the wet etching. Thereby, it is possible to securely prevent the plug embedded in the via-hole 48 from short-circuiting with a bit line BL in the next step. Moreover, because the plug can be adequately separated from the bit line BL, it is possible to control the increase of the parasitic capacitance of the bit line BL.

Figure 31:
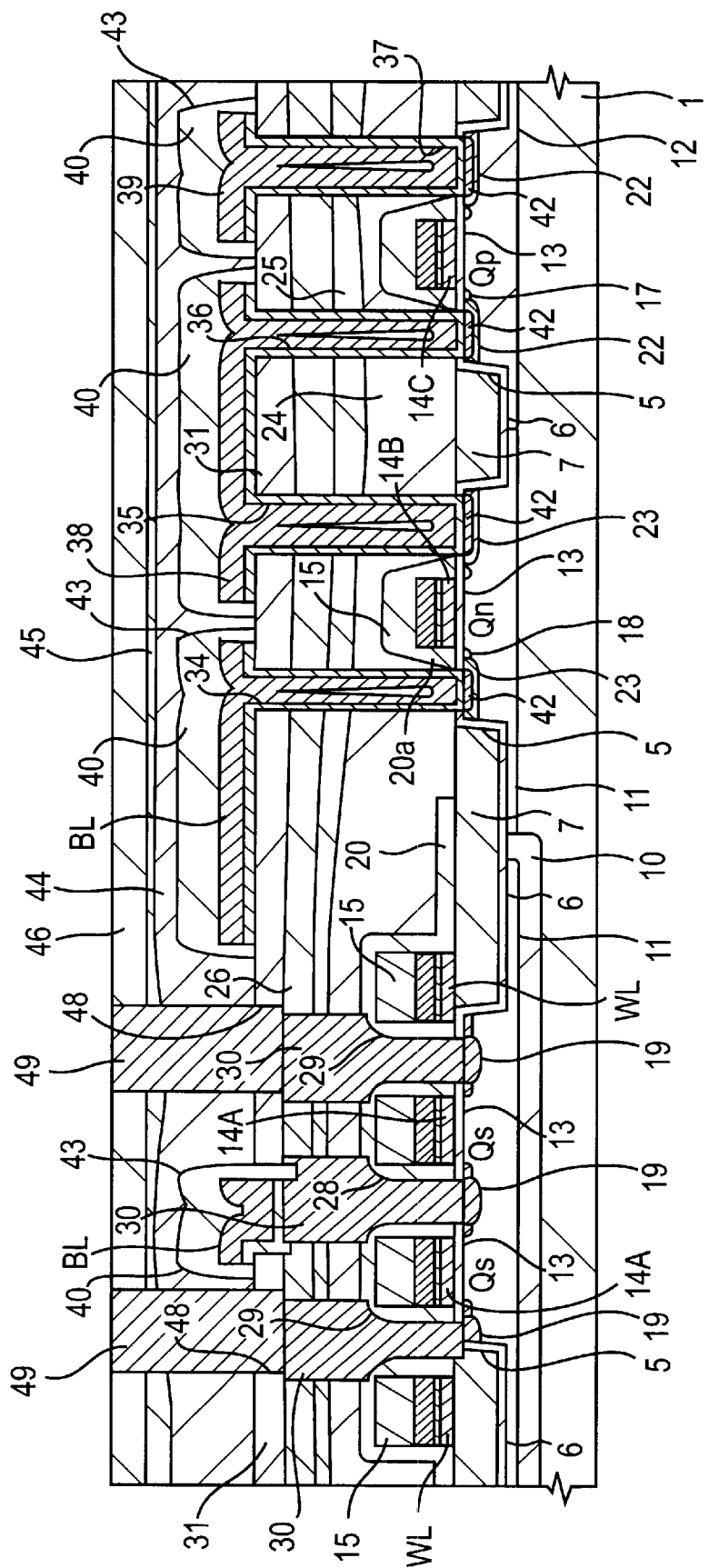
FIG. 31 is a sectional view of an essential portion of a semiconductor substrate showing a fabrication method of the DRAM of an embodiment of the present invention.

Then, as shown in FIG. 31, a plug 49 is formed inside of the via-hole 48. The plug 49 is formed by depositing a polysilicon film doped with an n-type impurity (e.g., phosphorus) on the silicon oxide film 46 by the CVD method and thereafter, etching back the polysilicon film to leave it in the via-hole 48.

Figure 32:
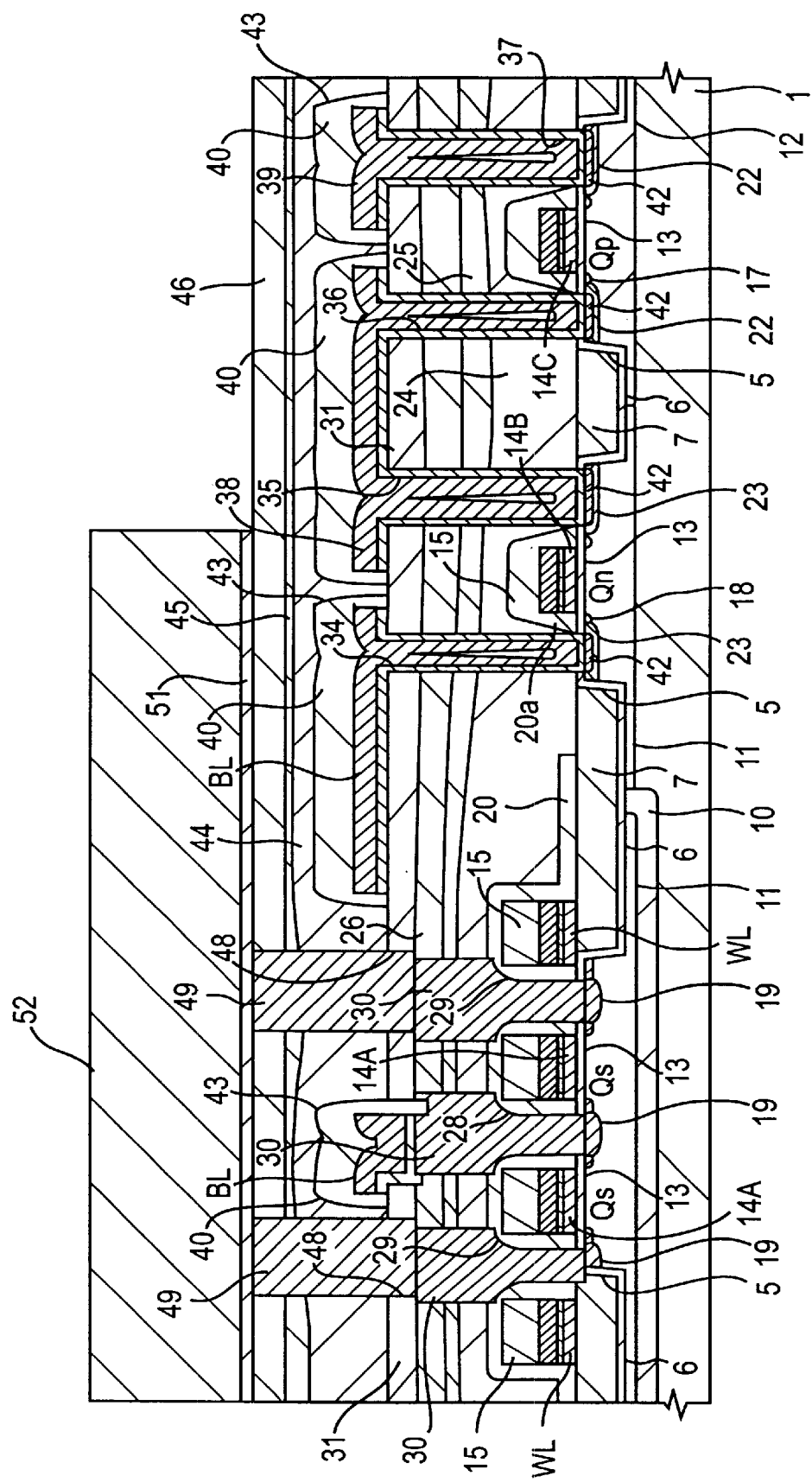
FIG. 32 is a sectional view of an essential portion of a semiconductor substrate showing a fabrication method of the DRAM of an embodiment of the present invention.

Then, as shown in FIG. 32, a silicon nitride film 51 having a thickness of approx. 100 nm is deposited on the silicon oxide film 46 by the CVD method to remove the silicon nitride film 51 in the peripheral circuit region by the dry etching using the photoresist film 52 as a mask. The silicon nitride film 51 left in the memory array is used as an etching stopper when etching the silicon oxide film between bottom electrodes in the step of forming a bottom electrode of an information storing capacitive element to be described later.

Figure 33:
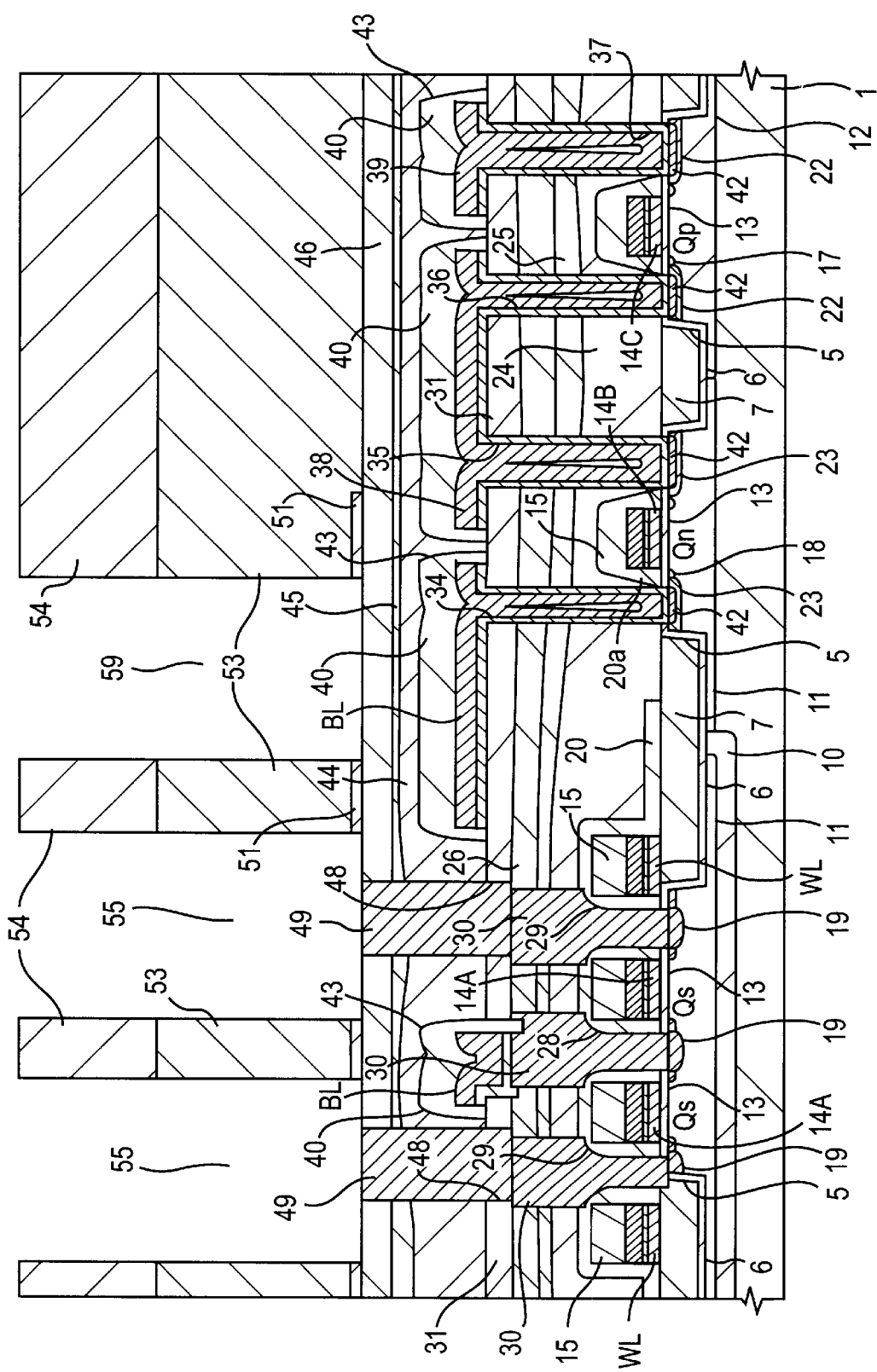
FIG. 33 is a sectional view of an essential portion of a semiconductor substrate showing a fabrication method of the DRAM of an embodiment of the present invention.
Figure 34:
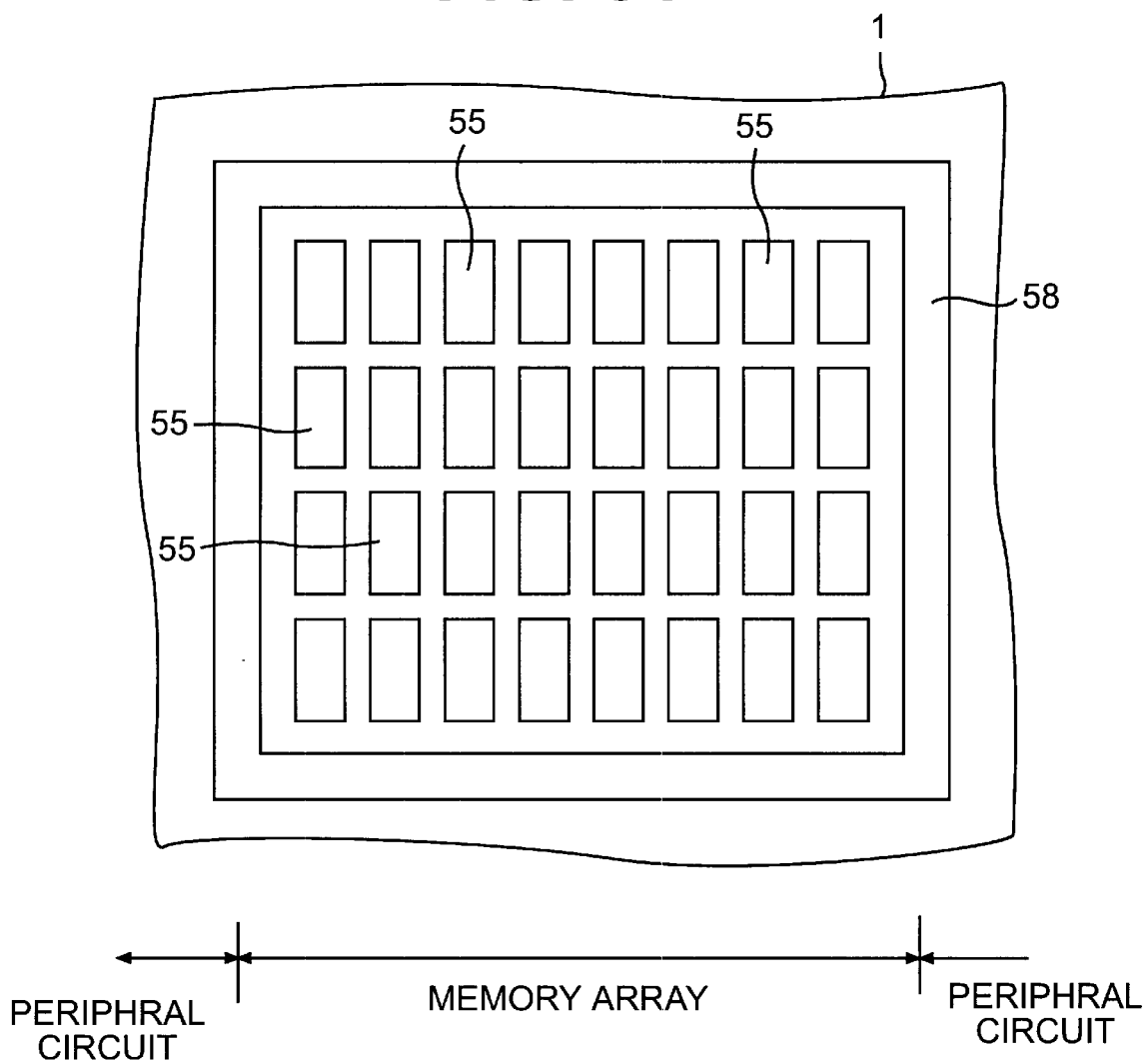
FIG. 34 is a top view of an essential portion of a semiconductor substrate showing the pattern of a groove and the pattern of a long groove.

Then, the photoresist film 52 is removed and thereafter, as shown in FIG. 33, a silicon oxide film 53 having a thickness of approx. 1.3 μm is deposited on the silicon nitride film 51 by the plasma CVD method using, for example, ozone (O$_3$) and tetraethoxysilane (TEOS) as source gases and the silicon oxide film 53 and silicon nitride film 51 are removed by the dry etching using the photoresist film 51 as a mask to form a groove 55 on the via-hole 48 in which the plug 49 is embedded. In this case, a long belt-like groove 59 for enclosing a memory array is formed around the memory array at the same time. FIG. 34 is a top view of an essential portion of the semiconductor substrate 1 showing the pattern of the groove 55 and that of the long groove 59.

Figure 35:
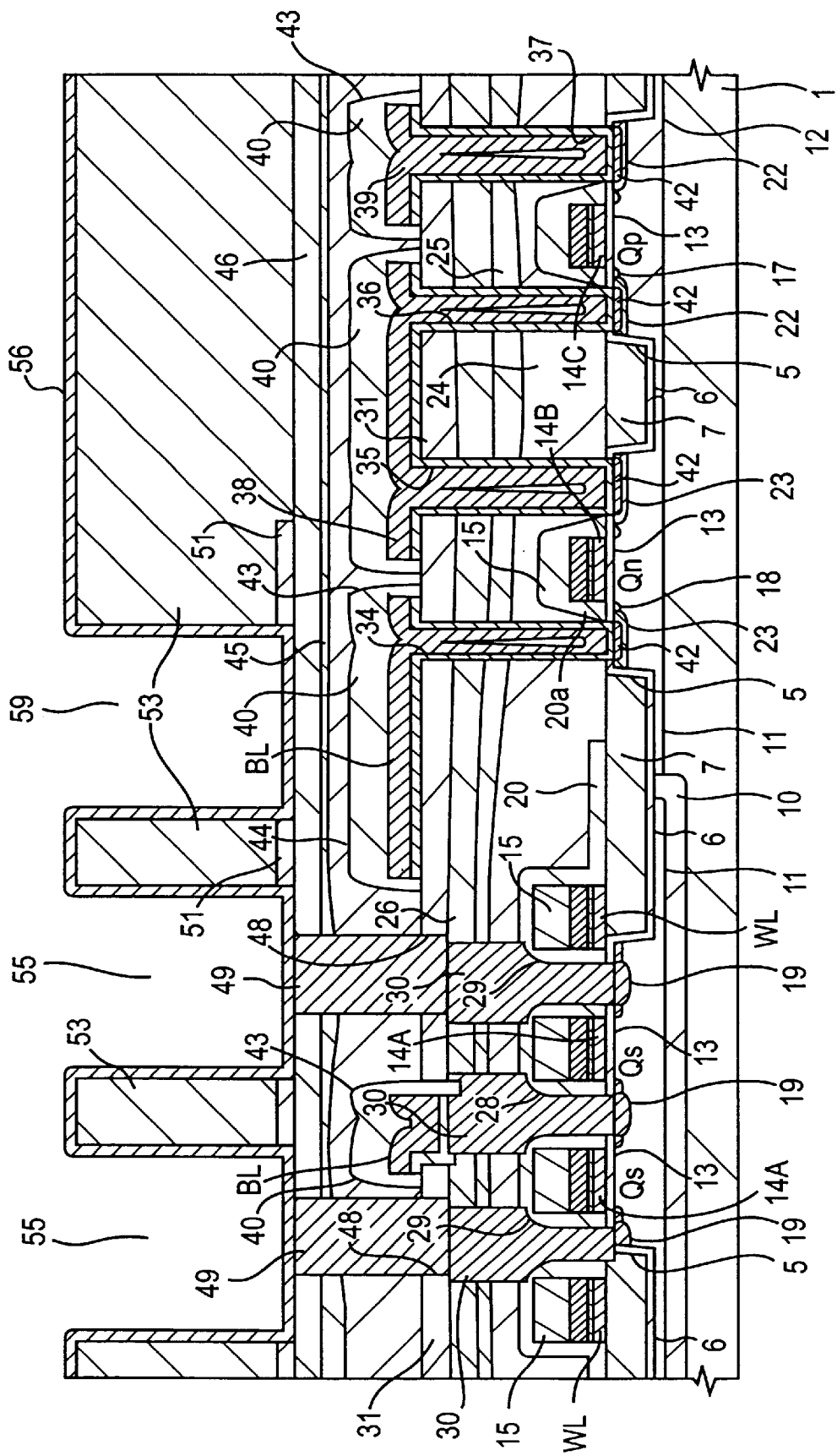
FIG. 35 is a sectional view of an essential portion of a semiconductor substrate showing a fabrication method of the DRAM of an embodiment of the present invention.

Then, the photoresist 54 is removed and thereafter, as shown in FIG. 35, a polysilicon film 56 doped with an n-type impurity {e.g. P (phosphorus)} and having a thickness of approx. 60 nm is deposited on the silicon oxide film 53. The polysilicon film 56 is used as the bottom-electrode material of an information storing capacitive element.

Figure 36:
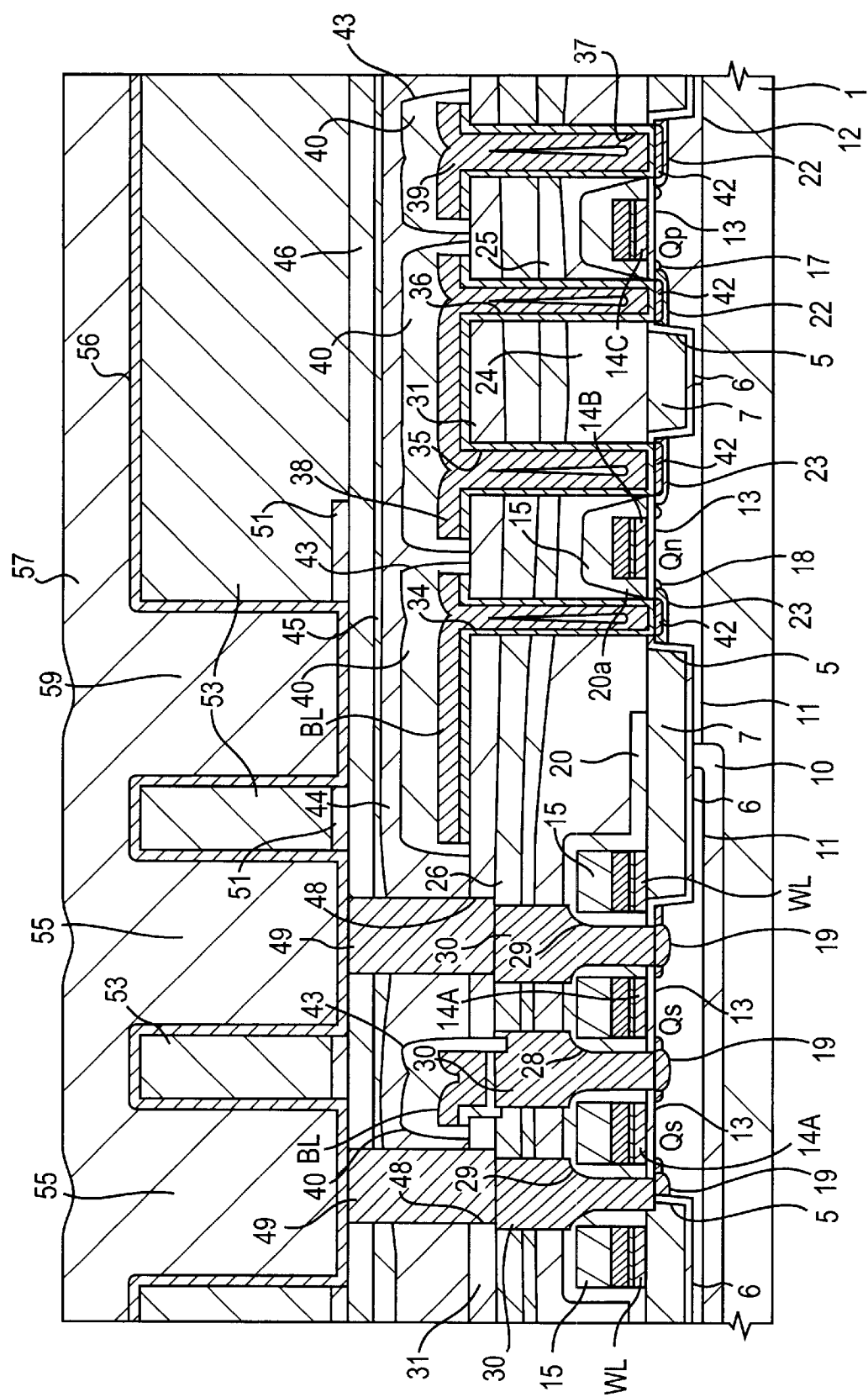
FIG. 36 is a sectional view of an essential portion of a semiconductor substrate showing a fabrication method of the DRAM of an embodiment of the present invention.
Figure 37:
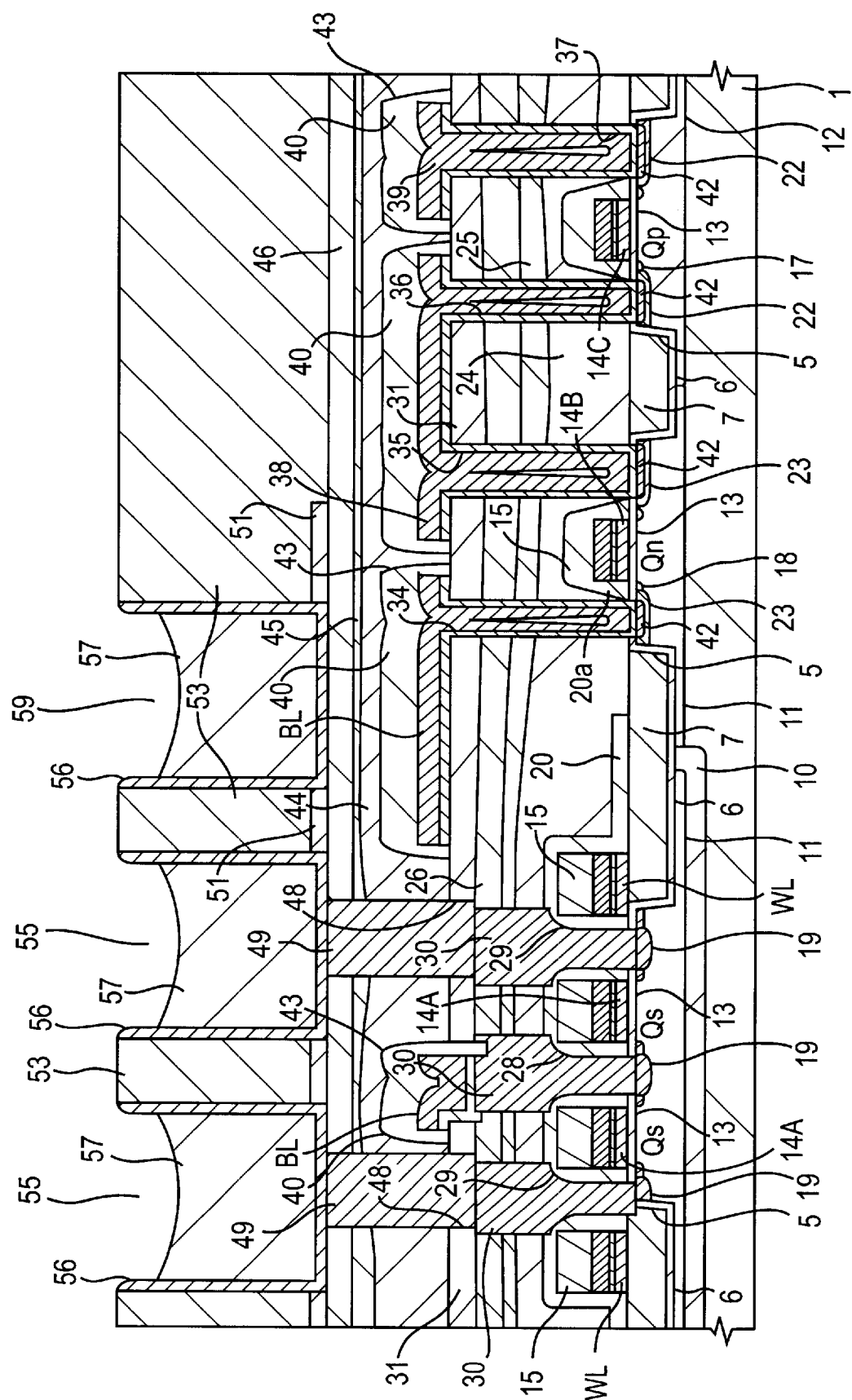
FIG. 37 is a sectional view of an essential portion of a semiconductor showing a fabrication method of the DRAM of an embodiment of the present invention.

Then, as shown in FIG. 36, an SOG film 57 having a thickness enough to embed the groove 55 and long groove 59 (e.g. 300 to 400 nm) is deposited on the polysilicon film 56 and then, the SOG film 57 is baked via heat treatment at approx. 400° C. and thereafter, the SOG film 57 is etched back to expose the polysilicon film 56 on the silicon oxide film 53 as shown in FIG. 37 and then, the film 56 is etched back to leave the polysilicon film 56 in the insides (inner wall and bottom) of the groove 55 and long groove 59. In this case, the SOG film 57 not etched back is also left in the insides of the groove 55 and long groove 59.

Figure 38:
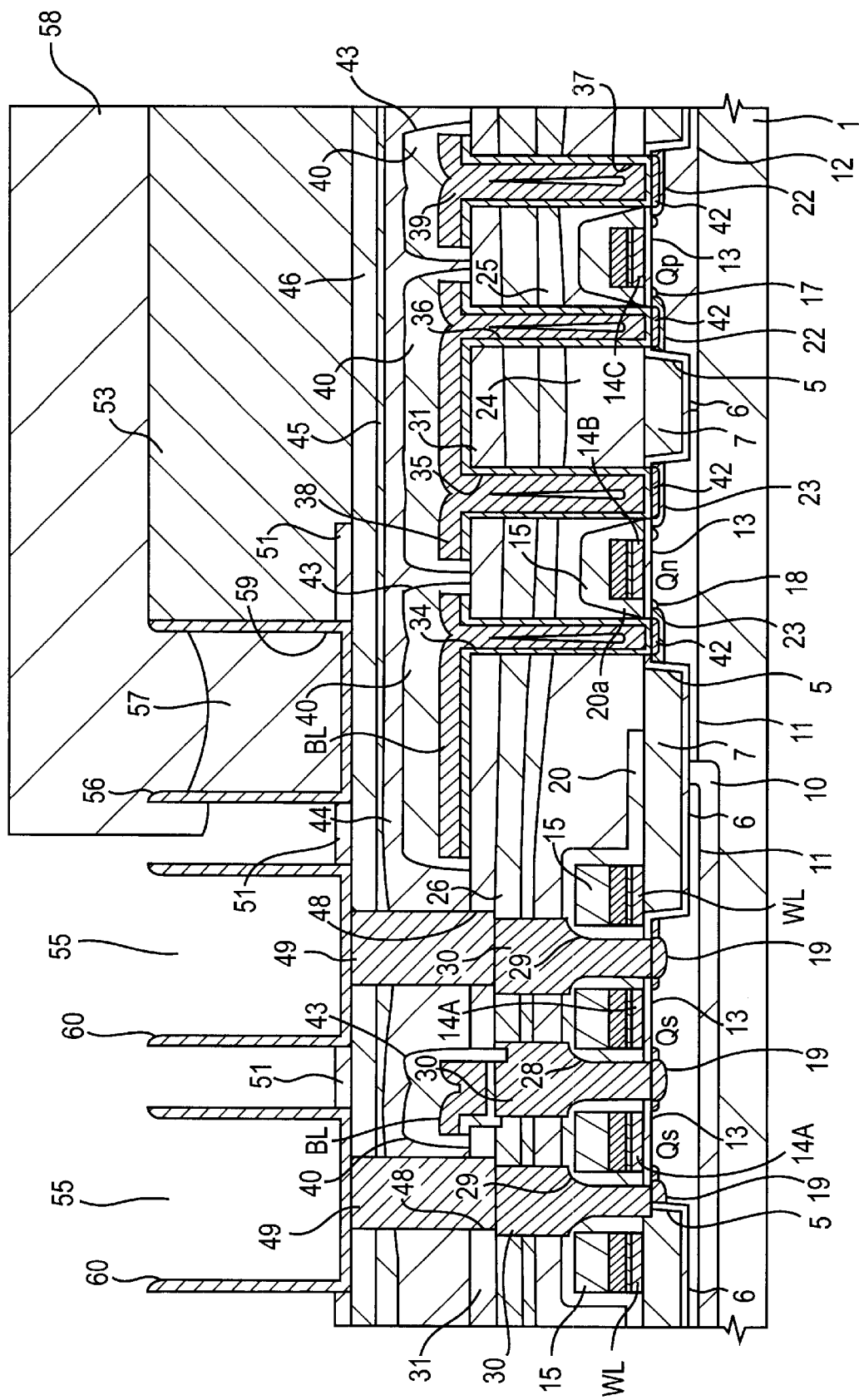
FIG. 38 is a sectional view of an essential portion of a semiconductor showing a fabrication method of the DRAM of an embodiment of the present invention.

Then, as shown in FIG. 38, the silicon oxide film 53 in the peripheral circuit region is covered with a photoresist film 58 and the SOG film 57 inside of the groove 55 and the silicon oxide film 53 in the gap of the groove 55 are wet-etched by a hydrofluoric-acid-base etching solution to form a bottom electrode 60 of an information storing capacitive element. In this case, because the silicon nitride film 51 is formed at the bottom of the gap of the groove 55, the silicon oxide film 46 at the bottom of the gap is not chipped by an etching solution even if the silicon oxide film 53 in the gap is completely removed.

One end of the photoresist film 58 covering the silicon oxide film 53 in the peripheral circuit region is set on the boundary between the memory array and the peripheral circuit region, that is, on the long groove 59. Therefore, by performing the above wet etching, the SOG film 57 in the long groove 59 is also removed. However, because the bottom electrode material (polysilicon film 56) on the inner wall of the long groove 59 serves as an etching stopper, the side wall of the SOG film 57 is not chipped. Moreover, because the surface of the silicon oxide film 53 in the peripheral circuit region is covered with the photoresist film 58, the surface is not chipped. Thereby, the step between the memory array and the peripheral circuit region is eliminated and moreover, the peripheral circuit region is flattened.

Figure 39:
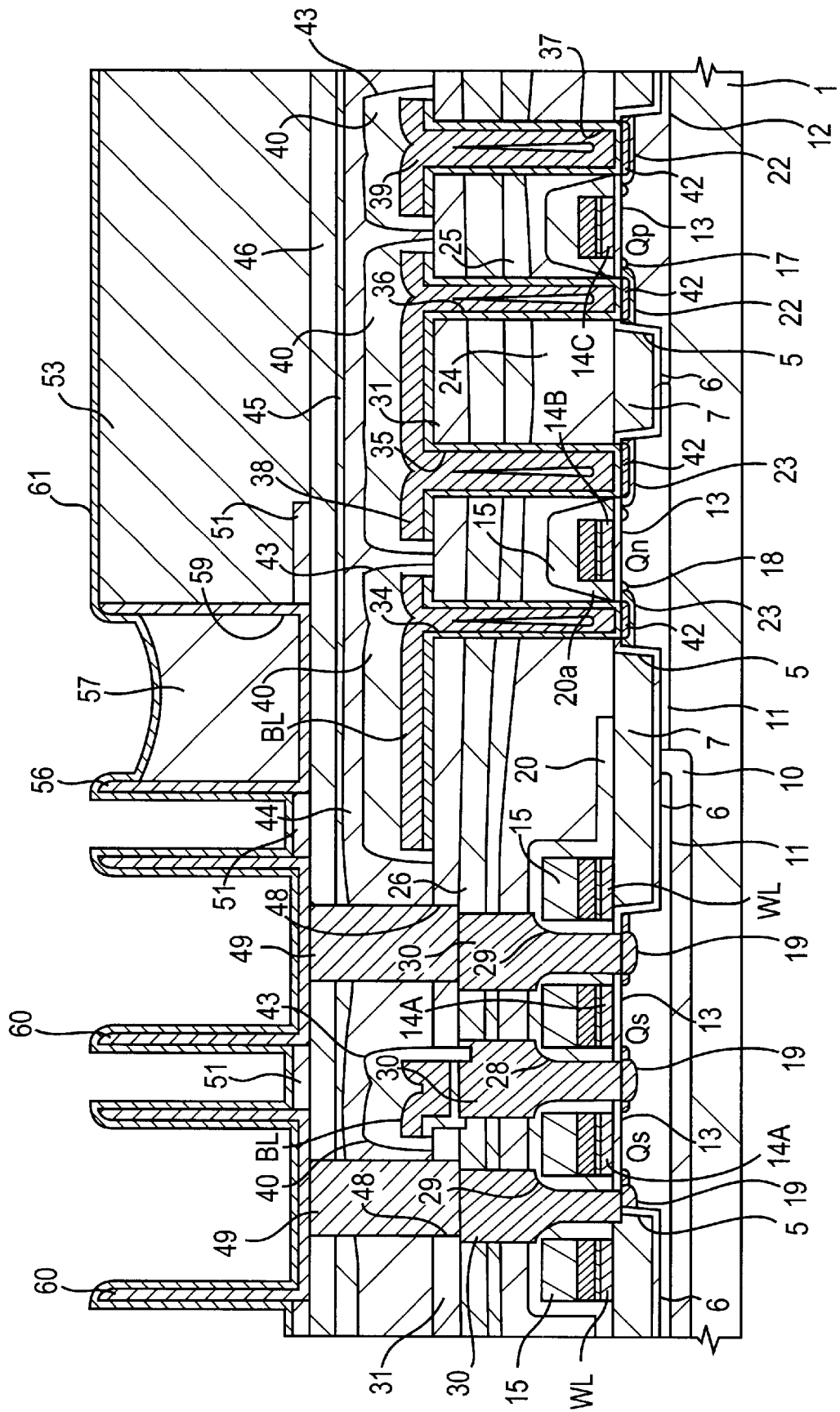
FIG. 39 is a sectional view of an essential portion of a semiconductor showing a fabrication method of the DRAM of an embodiment of the present invention.

Then, the photoresist film 58 covering the peripheral circuit region is removed, the semiconductor substrate 1 is heat-treated in ammonia environment at approx. 800° C. in order to prevent the polysilicon film (56) constituting the bottom electrode 60 from oxidizing to nitrate the surface of the polysilicon film (56) and thereafter, as shown in FIG. 39, a $Ta_2O_5$ (tantalum oxide) film 61 having a thickness of approx. 20 nm is deposited on the bottom electrode 60 by the CVD method, and the semiconductor substrate 1 is heat-treated at approx. 800° C. to repair defects of the $Ta_2O_5$ film 61. The $Ta_2O_5$ film 61 is used as the capacitance insulating film material of an information storing capacitive element.

Figure 40:
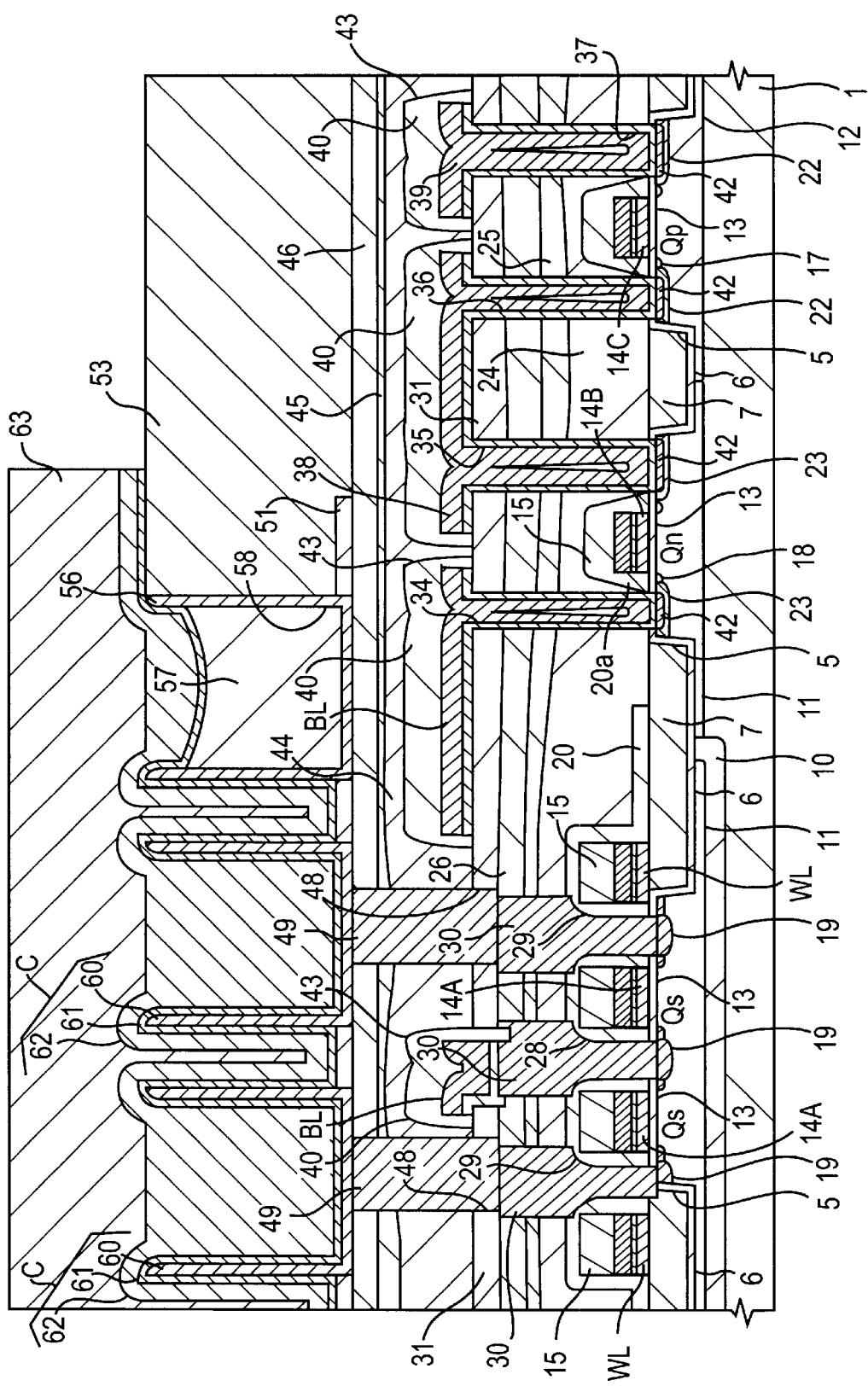
FIG. 40 is a sectional view of an essential portion of a semiconductor showing a fabrication method of the DRAM of an embodiment of the present invention.

Next, as shown in FIG. 40, a TiN film is formed over the $Ta_2O_5$ film 61 to a thickness of 50–100 nm by the CVD method. The CVD-TiN film is deposited by a thermal CVD method at a temperature of 400–650° C., preferably 400–500° C., at a pressure of about 5–3000 Pa using a gas mixture ($TiCl_4/NH_3$=½ to ⅟50) of titanium tetrachloride ($TiCl_4$) and ammonia ($NH_3$) as a source gas. This CVD-TiN film forming condition brings about a good step coverage and a good dielectric strength of the capacitor insulating film. The film, however, contains about 5% of chlorine atoms or chlorine ions.

After the CVD-TiN film has been formed, another TiN film is sputtered to a thickness of 50–100 nm. The multilayer structure of the sputtered-TiN/CVD-TiN film enables the approximately 5% of chlorine or chlorine ions contained in the CVD-TiN film to be trapped by the overlying spattered-TiN film, thus preventing the corrosion of the Al wiring formed in a later process due to chlorine present in the CVD-TiN.

After a TiN film 62 is deposited, the TiN film 62 and $Ta_2O_5$ film 61 are patterned by the dry etching using the photoresist film 63 as a mask to form an information storing capacitive element C comprising a top electrode made of the TiN film 62, a capacitance insulating film made of the $Ta_2O_5$, and the bottom electrode 60 made of the polysilicon film 56. Thereby, a DRAM memory cell comprising the memory cell selecting MISFET Qs and the information storing capacitive element C connected to the MISFET Qs in series is almost completed.

Figure 41:
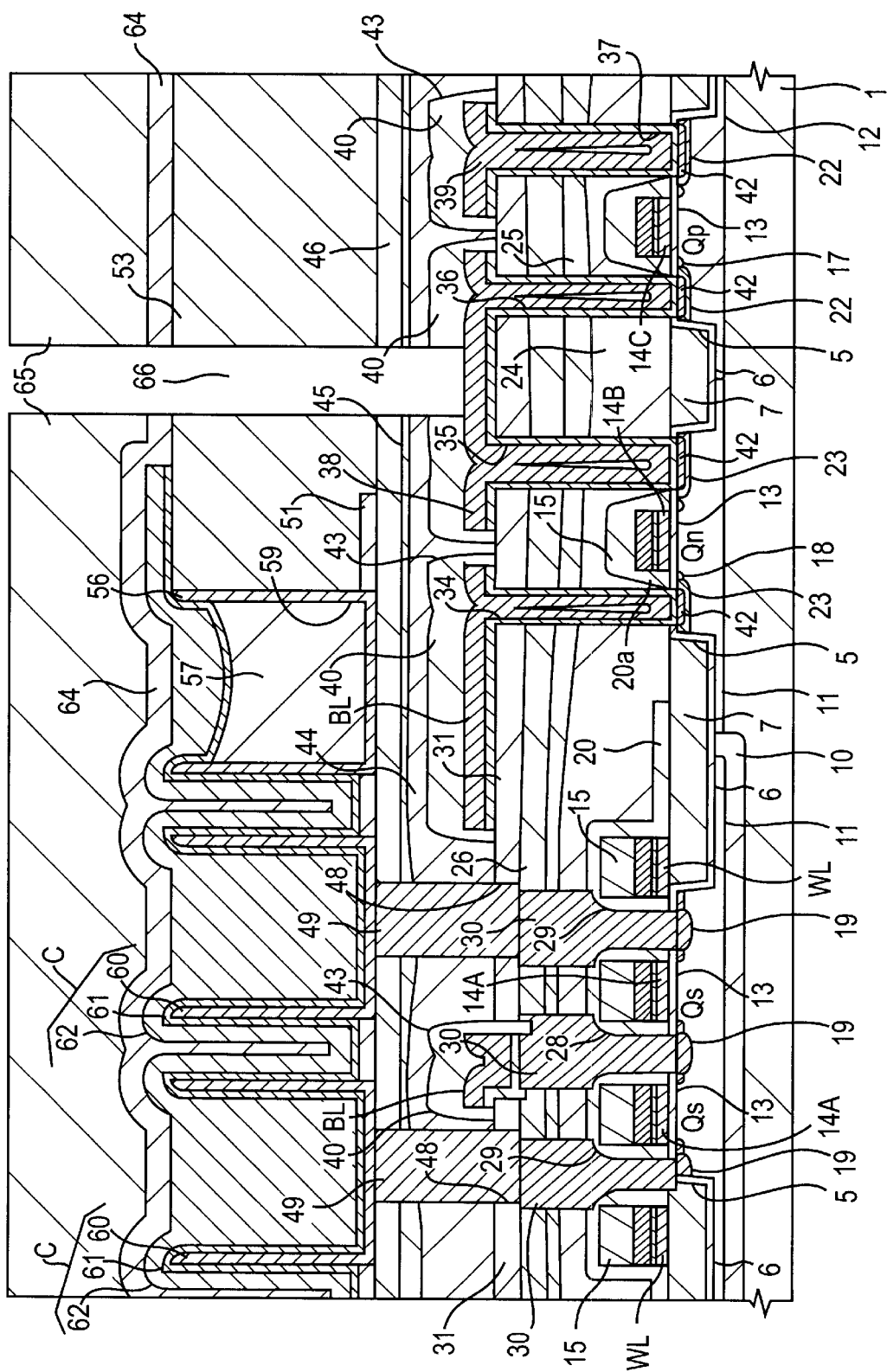
FIG. 41 is a sectional view of an essential portion of a semiconductor showing a fabrication method of the DRAM of an embodiment of the present invention.

Then, the photoresist film 63 is removed and thereafter, as shown in FIG. 41, a silicon oxide film 64 having a thickness of approx. 100 nm is deposited on the information storing capacitive element C by the plasma CVD method using, for example, ozone ($O_3$) and tetraethoxysilane (TEOS) as source gases, and the silicon oxide film 64, silicon oxide film 53, silicon oxide films 46 and 45, SOG film 44, and silicon nitride film 40 are removed from the peripheral circuit region by the dry etching using the photoresist 65 as a mask to form a via-hole 66 having a large aspect ratio on the first-layer wiring 38.

Figure 42:
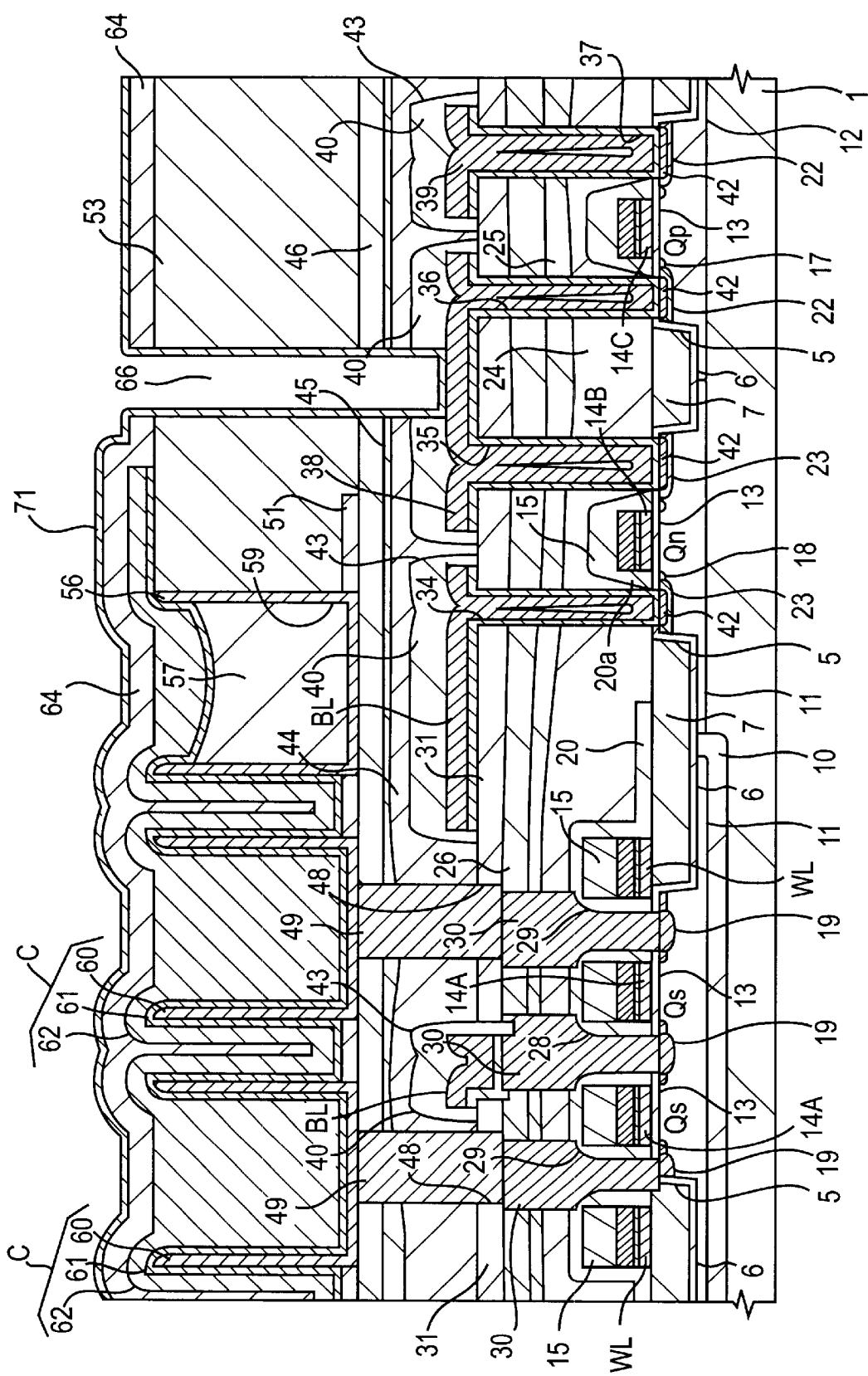
FIG. 42 is a sectional view of an essential portion of a semiconductor showing a fabrication method of the DRAM of an embodiment of the present invention.

Then, the photoresist film 65 is removed and thereafter, as shown in FIG. 42, a TiN film 71 having a thickness of 5 to 50 nm, preferably approx. 50 nm is deposited on the silicon oxide film 64 including the inside of the via-hole 66. The TiN film 71 is deposited by the thermal CVD method at a temperature of 400 to 650° C., preferably 600° C. and a pressure of 5 to 3000 Pa by using a mixed gas ($TiCl_4/NH_3$= ½–⅟50) of titanium tetrachloride ($TiCl_4$) and ammonia ($NH_3$) as a source gas. Because the TiN film 71 has a large step coverage, the film thickness becomes almost uniform at the bottom and the opening of the via-hole 66. Moreover, the TiN film 71 contains approx. 5% of chlorine because titanium tetrachloride is used as the source gas.

Figure 43:
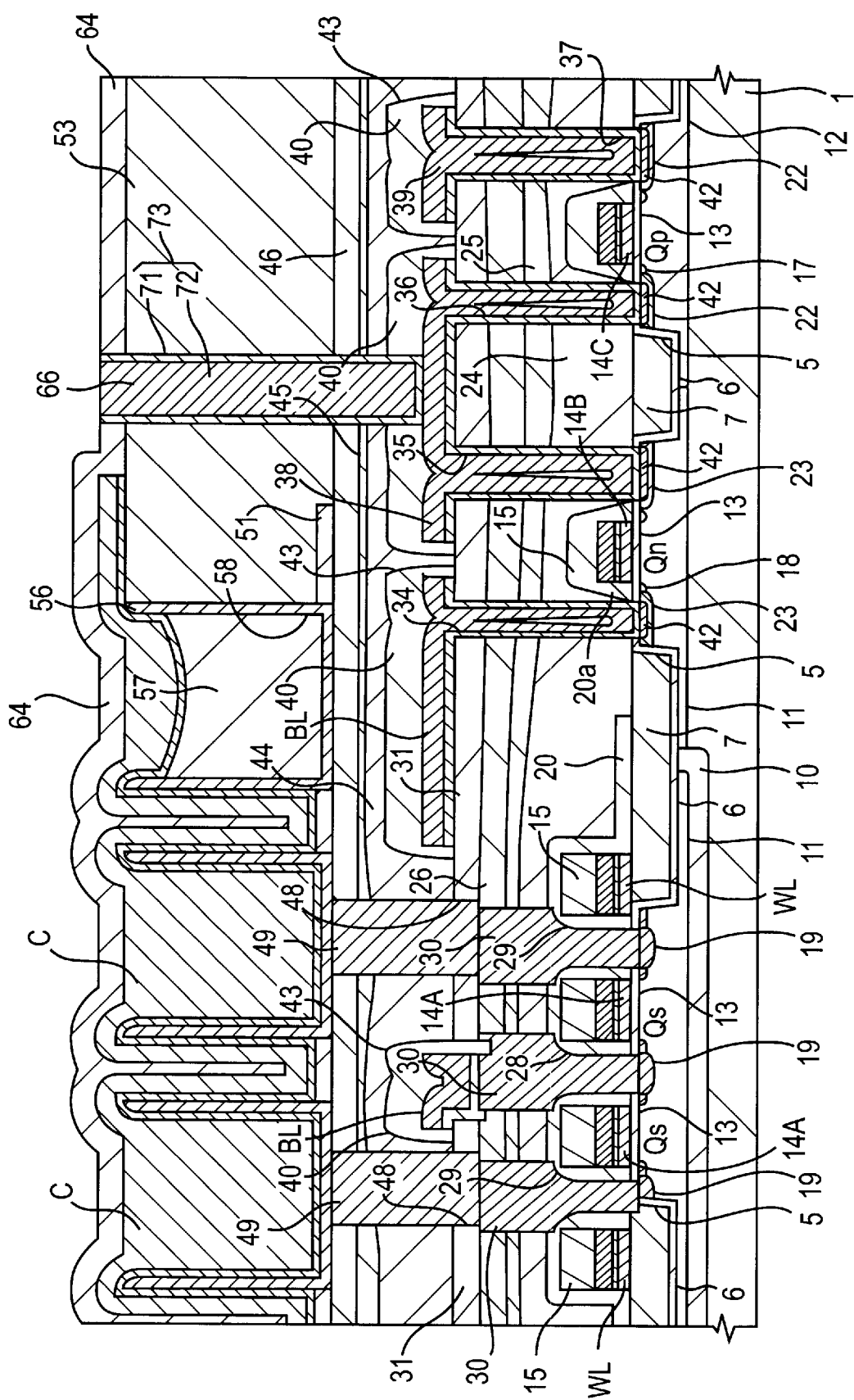
FIG. 43 is a sectional view of an essential portion of a semiconductor showing a fabrication method of the DRAM of an embodiment of the present invention.

Then, as shown in FIG. 43, a W film 72 having a thickness of approx. 500 nm is deposited on the TiN film 71 by the CVD method and the W film 72 and TiN film 71 on the silicon oxide film 64 are etched back and left only in the via-hole 66 to form a plug 73 made of a laminated film of the TiN film 71 and W film 72. To remove the W film 72 and TiN film 71 from the surface of the silicon oxide film 64, it is also possible to use a chemical mechanical polishing (CMP) method.

Figure 44:
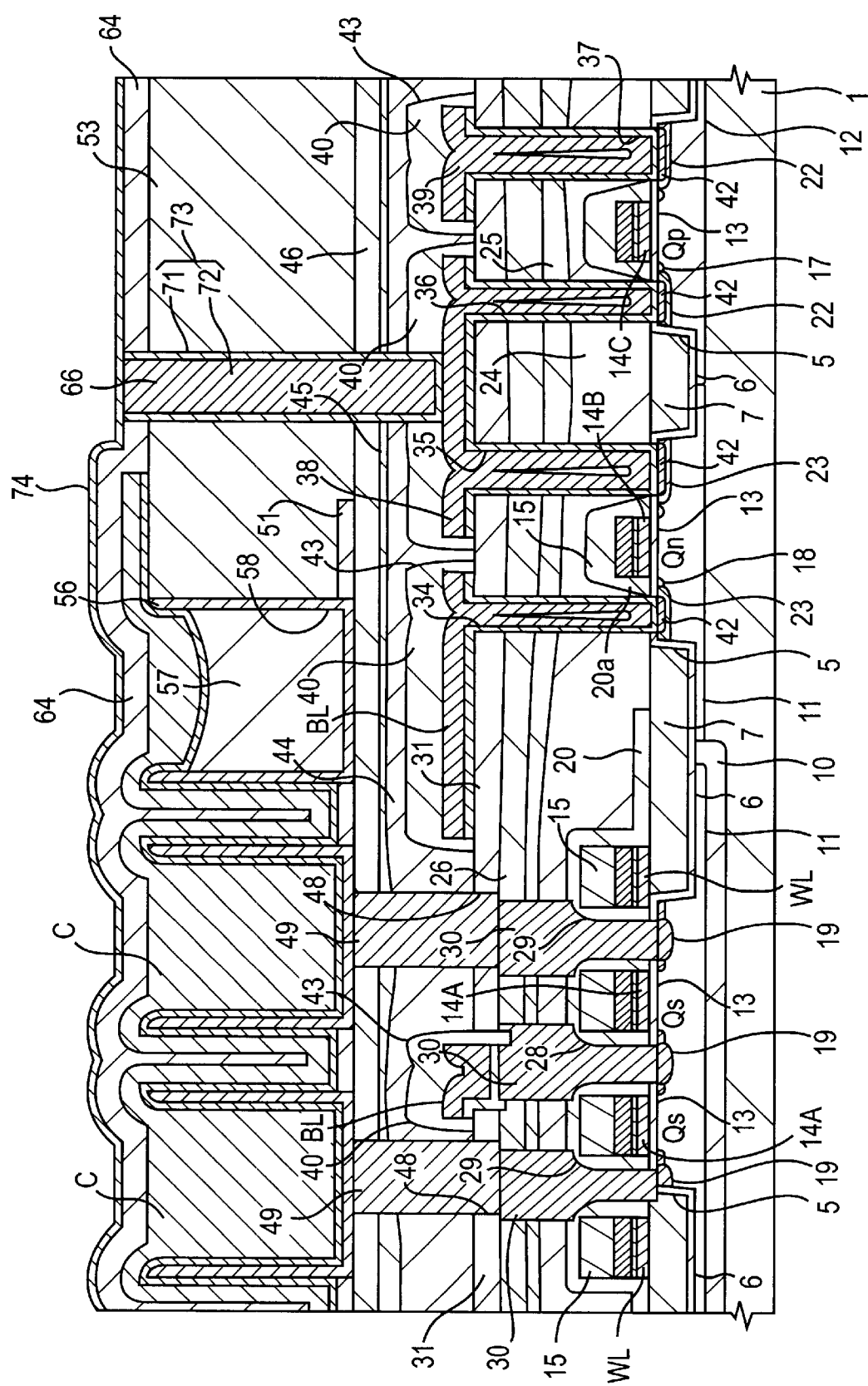
FIG. 44 is a sectional view of an essential portion of a semiconductor showing a fabrication method of the DRAM of an embodiment of the present invention.
Figure 45:
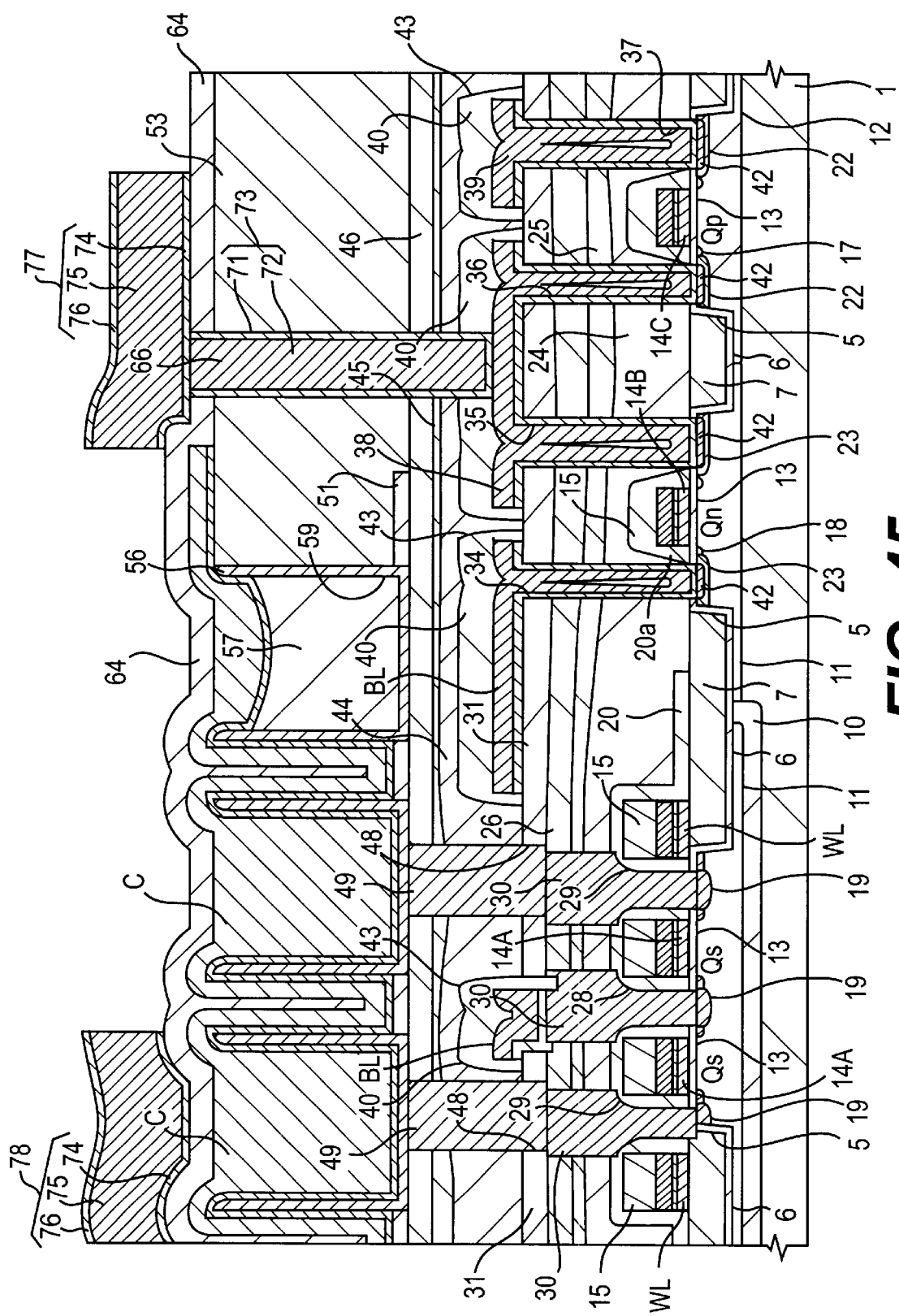
FIG. 45 is a sectional view of an essential portion of a semiconductor showing a fabrication method of the DRAM of an embodiment of the present invention.
Figure 46:
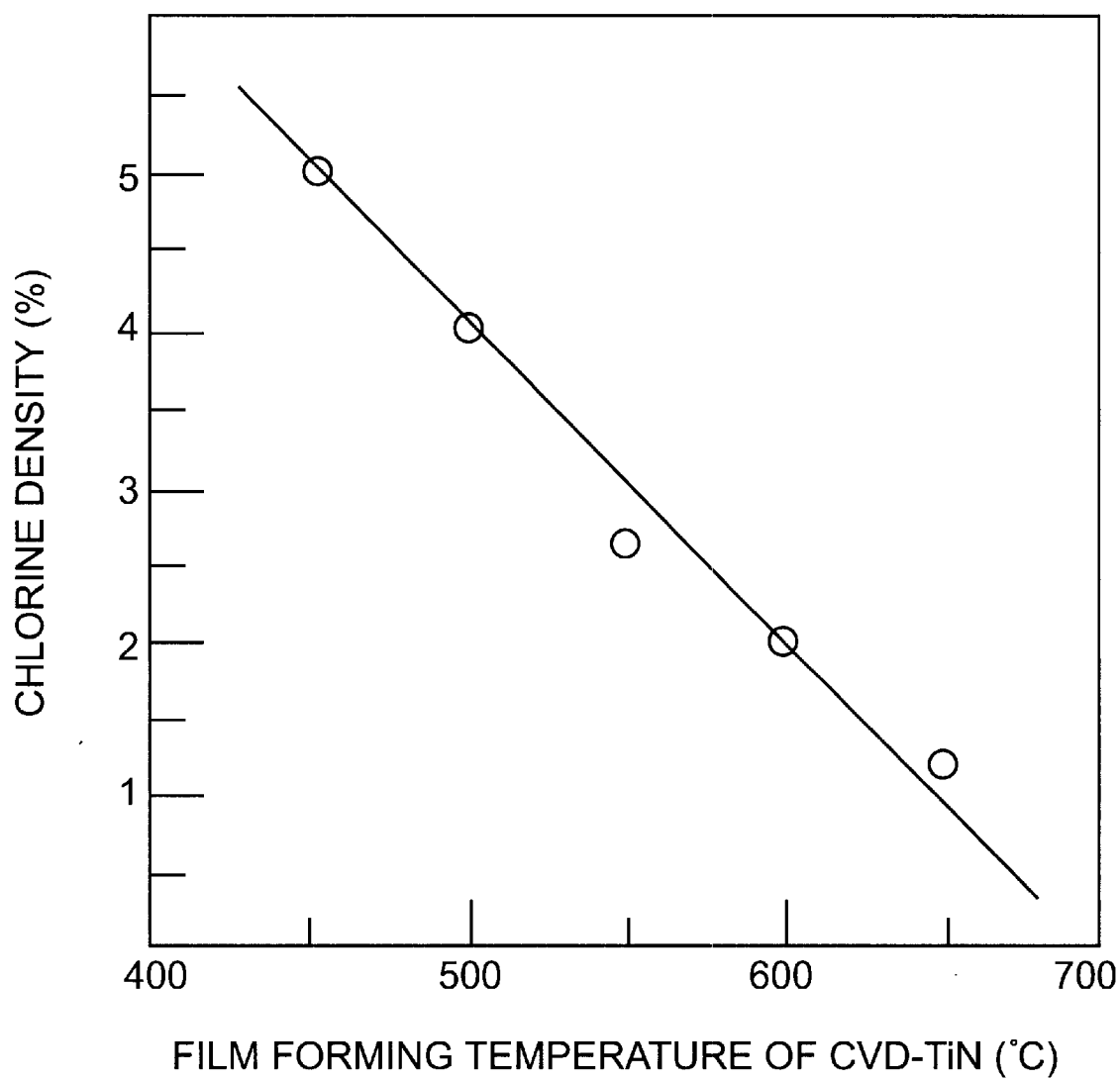
FIG. 46 is a diagram showing the relation between the film forming temperature of the titanium nitride film by the CVD method and the chlorine density of the titanium nitride film.

Then, as shown in FIG. 44, a TiN film 74 having a thickness of approx. 50 nm is deposited on the silicon oxide film 64 including the surface of the plug 73 by the sputtering method. Then, as shown in FIG. 45, an Al-alloy film 75 having a thickness of approx. 500 nm and a Ti film 76 having a thickness of approx. 500 nm are deposited on the TiN film 74 by the sputtering method and thereafter, the Ti film 76, Al-alloy film 75, and TiN film 74 are patterned by the dry etching using a photoresist film as a mask to form second-layer wirings 77 and 78 on the silicon oxide film 64.

Because the TiN film 71 (deposited by the CVD method) constituting a part of the plug 73 is separated from the Al-alloy film 75 constituting a part of each of the second-layer wirings 77 and 78 by the TiN film 74 deposited by the sputtering method, it is possible to prevent the second-layer wirings 77 and 78 from being corroded due to chlorine contained in the TiN film 71 deposited by the CVE process.

The corrosion of the second-layer wirings 77, 78 due to chlorine contained in the TiN film 71 deposited by the CVD method can be prevented also when a sputter Ti film, instead of the above sputter TiN film 74, is formed to a thickness of about 30 nm followed by the formation of another sputtered TiN film of about 30 nm. The sputtered Ti film has a higher capability to trap chlorine than the sputtered TiN film.

While this embodiment uses the sputtered titanium nitride film 74, it may also use a sputtered titanium film, tantalum film or tantalum nitride film.

The present invention can be applied to a process for forming a wiring out of a conductive film including an Al film over a via-hole in which a plug including a CVD-TiN film is buried.

EMBODIMENT 2

This embodiment is an example where the device uses a titanium nitride film containing a halogen element as one of electrodes of a storing capacitor section.

Figure 47:
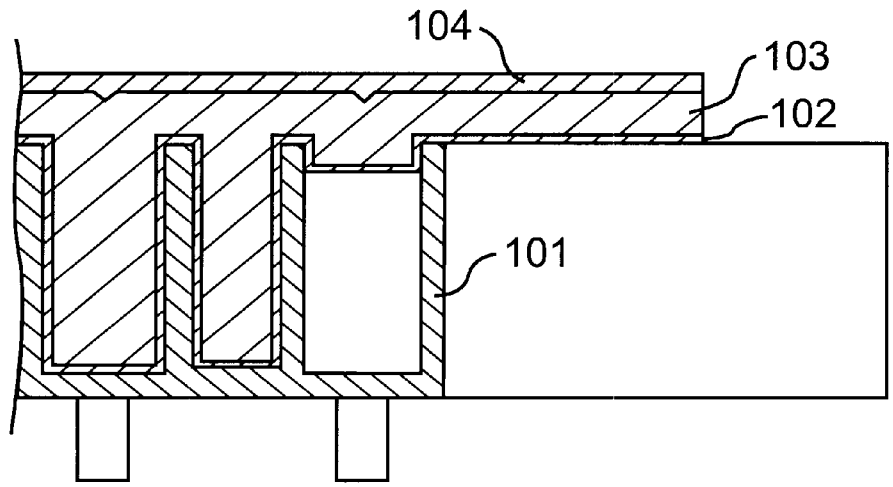
FIG. 47 is a cross section of a storing capacitor section of a DRAM according to this invention.

FIG. 47 shows a cross section of the capacitor. One electrode 101 of the capacitor and a capacitor insulating film 102 of tantalum oxide are formed in the same manner as the embodiment 1. Although the capacitor insulating film of this embodiment uses a tantalum oxide film, it may use a ferrodielectric film such as of BST and PZT. Then, using a gas mixture of titanium tetrachloride and ammonia as a source gas, a titanium nitride film 103 is formed to a thickness of 50–100 nm by the chemical vapor deposition method. This titanium nitride film is formed at about 500° C. and contains about 4% of chlorine. The upper electrode has an advantage that when it is formed of titanium nitride instead of conventionally used polysilicon, it can be formed at a lower temperature. After this, a titanium film 104 is formed to a thickness of about 30 nm as a chlorine trap film over the chlorine containing TiN film 103.

In this way, although the titanium nitride film 103 contains a large amount of chlorine, the formation of the titanium film 104 as a chlorine trapping layer can effectively prevent corrosion of the wiring layer around the capacitor.

EMBODIMENT 3

Figure 48:
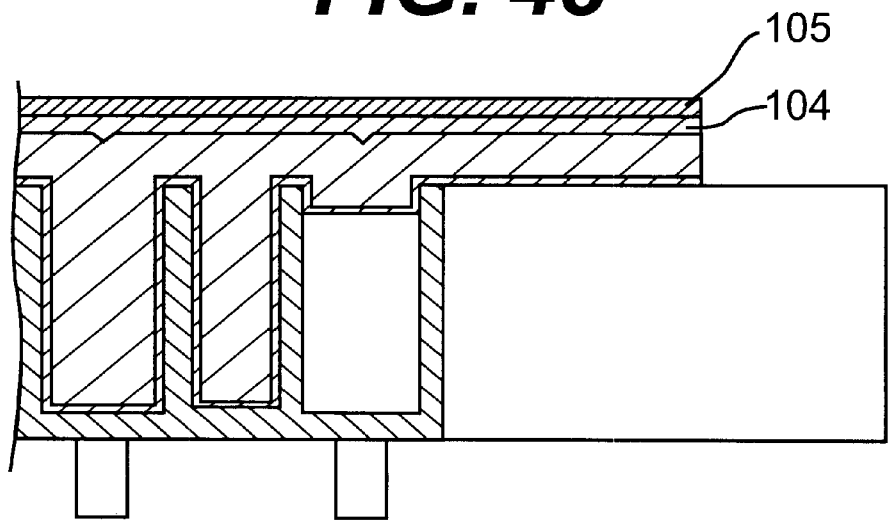
FIG. 48 is a cross section of a storing capacitor section of a DRAM according to this invention.

This embodiment is an example in which a titanium nitride film 105 is formed by the sputtering method over the sputtered titanium film 104 of the Embodiment 2, and will be described referring to FIG. 48. The process up to the formation of the capacitor insulating film of tantalum oxide is similar to those of Embodiment 1 and 2. After this, a titanium film 104 was sputtered to a thickness of 40 nm and a titanium nitride film 105 formed to 60 nm by chemical conversion sputter using the flow of nitrogen gas. The use of a multilayer film of the titanium film 104 formed by sputtering and the titanium nitride film 105 formed by sputtering as the chlorine trapping layer enabled almost complete trapping of chlorine and enhanced the effect to prevent corrosion of the wiring layer around the capacitor.

While, in this embodiment, the titanium film of 104 to 40 nm thickness is formed by sputtering and the titanium nitride film of 105 to 60 nm thickness is formed, the thickness of the titanium film 104 may be 30–50 nm and that of the titanium nitride film 105 to 50–100 nm.

Although, in this embodiment, a multilayer film of the titanium film 104 and the titanium nitride film 105 is formed, a multilayer film of a tantalum film 104 and a tantalum nitride film (TaN) 105 may be formed. In this case, too, the process involves forming a tantalum film and, at a certain stage of the process, flowing nitrogen gas while continuing the forming of the tantalum film in order to form a tantalum nitride film. When the trap layer is a multilayer film as described above, the film deposition and the patterning such as etching can be facilitated if the multilayer film contains a common main constitutional element, like a multilayer film of titanium nitride film (upper layer)/a titanium film (lower layer) or a multilayer film of a tantalum nitride film (upper layer)/a tantalum film (lower layer).

EMBODIMENT 4

This embodiment is an example in which a titanium nitride film containing a halogen element is used for one electrode of the storing capacitor section and in which the upper and side portions of the titanium nitride film are covered with the trap film. This example will be described referring to FIG. 49.

As in Embodiment 2, a polysilicon film 101, a tantalum oxide film 102, and a halogen-containing titanium nitride film 103 are formed as a storing capacitor section. Then, a trap layer 106 is formed by a selective CVD method over the upper and side portions of the titanium nitride film 103. The use of the selective CVD method ensures that the trap film 106 can be formed not only over the halogen-containing titanium nitride film 103 but over its side portions.

Figure 49:
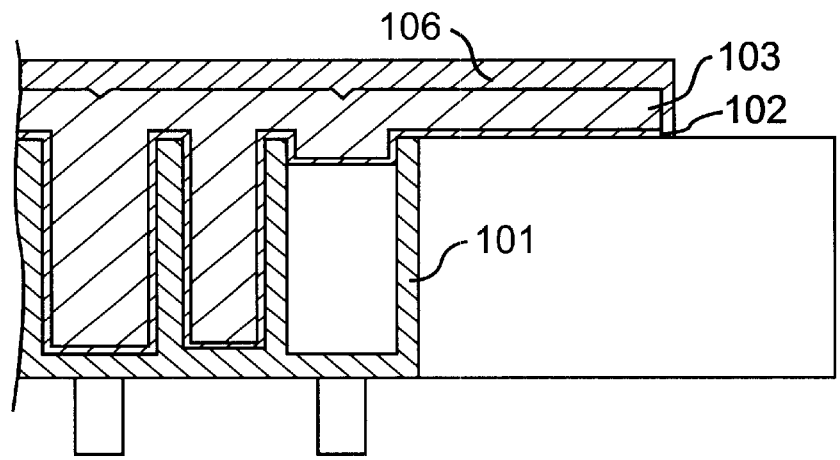
FIG. 49 is a cross section of a storing capacitor section of a DRAM according to this invention.
Figure 55:
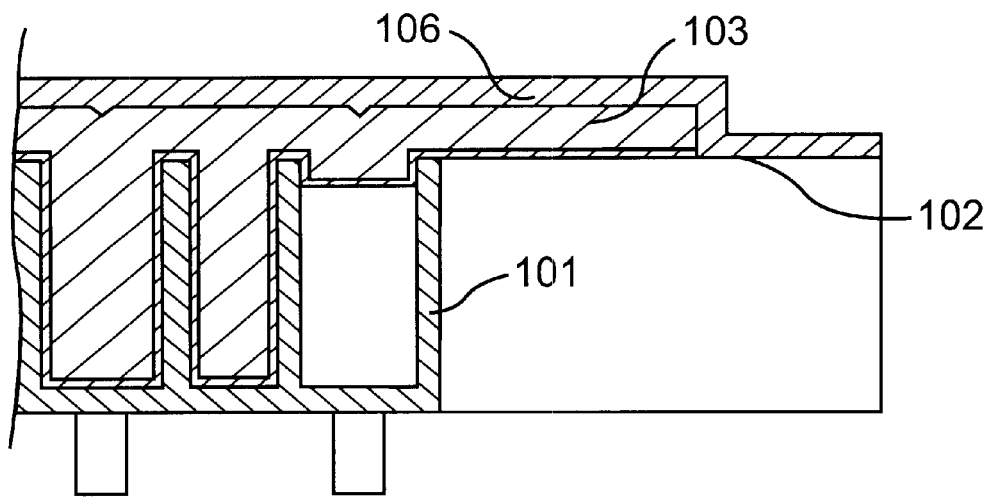
FIG. 55 is a cross section of a storing capacitor section of a DRAM according to this invention.
Figure 56:
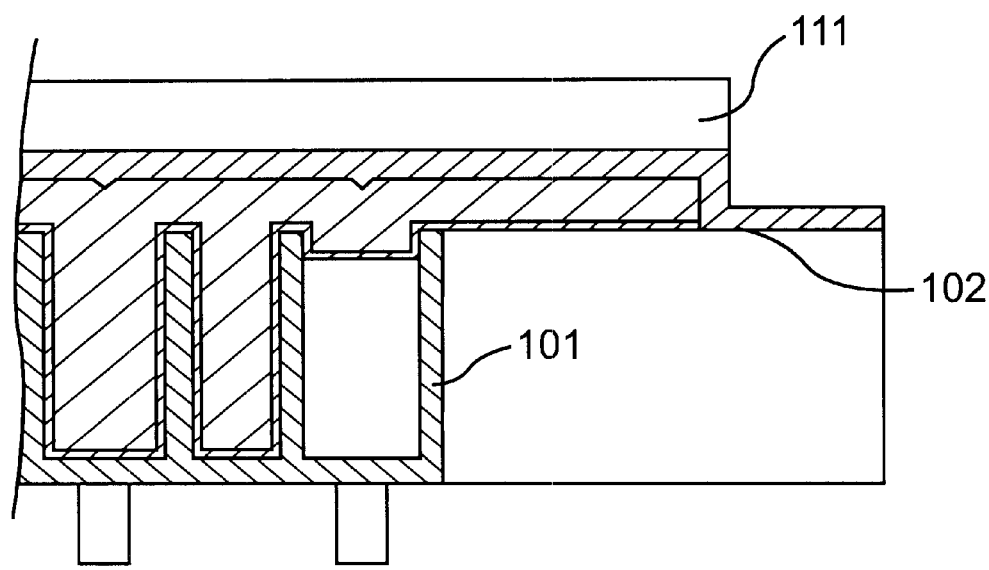
FIG. 56 is a cross section of a storing capacitor section of a DRAM according to this invention.

In addition to the above selective CVD method, a method shown in FIGS. 55 and 56 may also be used to form the trap film 106 over the titanium nitride film. First, a TiN film 106 as the trap layer is formed over the titanium nitride film 103 of the upper electrode by the CVD method using a source gas of TDMAT tetrakis(dimethylamino)titanium (FIG. 55). Next, a resist film 110 is formed over the upper and side surfaces of the titanium nitride film 103 of the upper electrode (FIG. 56) and, using this resist as a mask, a TiN film 106 as a trap film is formed (FIG. 49). Another organic source such as TDEAT tetrakis(diethylamino)titanium may also be used.

By forming the trap film not only over the upper portion but over the side portions in such a way, it is possible to prevent the diffusion of halogen from the side portions of the titanium nitride film and thereby enhance the corrosion prevention effect on the wiring layer around the capacitor.

Further, the trap layer may be a titanium film, a titanium nitride film, a tantalum film, or a tantalum nitride film formed by the sputtering method, or a titanium film, a titanium nitride film, a tantalum film, or a tantalum nitride film formed by the CVD method using a source gas not containing halogen as a constitutional element. The trap layer may also be a multilayer film of these.

EMBODIMENT 5

This embodiment is a method of removing the halogen element from the halogen-containing CVD-TiN film.

Figure 50:
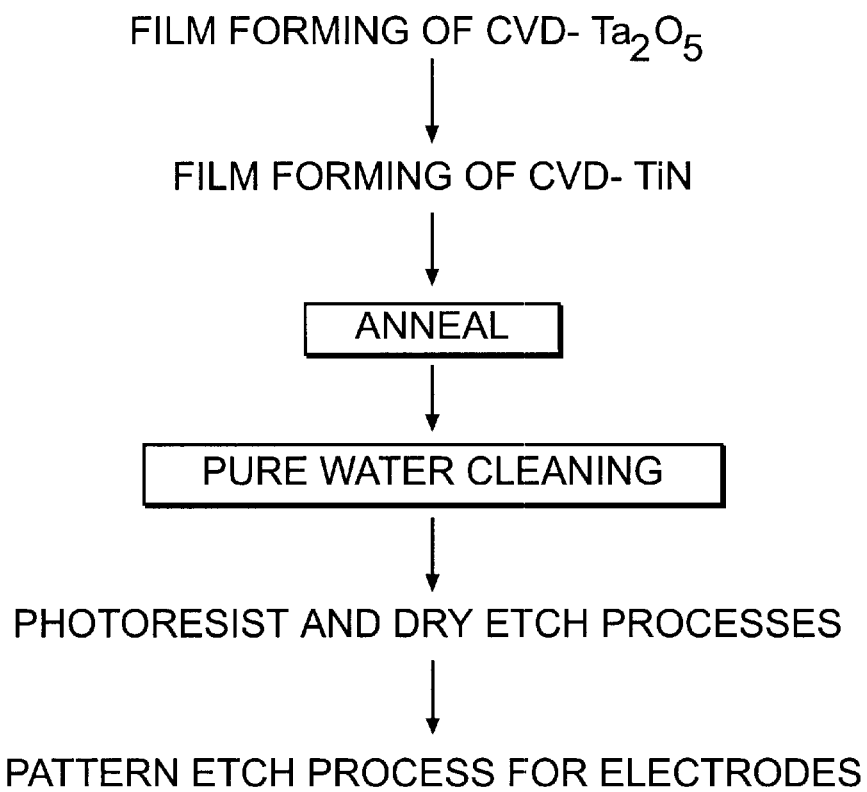
FIG. 50 is a diagram showing the flow of the process for removing chlorine from the titanium nitride film according to this invention.

An example in which a titanium nitride film, formed by the CVD method using a source gas containing a halogen element as a constitutional element, is used as one of the electrodes of a storing capacitor section will be described referring to the process flow diagram of FIG. 50.

First, a $Ta_2O_5$ film, the capacitor insulating film, is formed and then a TiN film is formed over the $Ta_2O_5$ film by the CVD method using a source gas of $TiCl_4$ and $NH_3$ at 450° C. This TiN film contains about 5% of chlorine.

Next, the device is heated at about 500° C. in a nitrogen atmosphere for more than 15 seconds, preferably about 10 minutes. This heat treatment is carried out directly consecutively in the same apparatus without exposing the device to the open air. This heat treatment should preferably be performed at an anneal temperature of 400–800° C., preferably 500–650° C., which is higher than the film making temperature of the CVD-TiN process because the higher annealing temperature results in a greater amount of chlorine removable from within, or from the surface of, the TiN film.

The heat treatment may be done by RTA (Rapid Thermal Anneal). Further, the heat treatment may be performed by using the same TiN film forming apparatus or a different apparatus. If the same apparatus is used, the device can be annealed without being exposed to the atmosphere after the film is formed, enhancing the surface oxidation prevention effect. When the heat treatment is done using a different apparatus or chamber, on the other hand, the productivity (processing capability) improves.

The anneal can be performed in an inert gas atmosphere of Ar or He other than the above $N_2$. Other than such an inert gas, a reducing gas such as $H_2$ or $NH_3$ may be used. The use of a reducing gas requires care because such a reducing gas, although it has a high capability to remove chlorine from the CVD-TiN film, may deteriorate the dielectric strength of the capacitor insulating film.

After this, chlorides such as $NH_4Cl$ deposited on the surface of the film are removed with pure water. The pure water cleaning is performed by applying the pure water to the rotating wafer, or by using pure water to which ultrasonic vibration is applied, or by using a nylon brush as required. After cleaning, the wafer is dried on a hot plate heated to 100–150° C. In addition to the pure water cleaning, the wafer may be cleaned by a water solution containing 1–10% $NH_3$. Because the annealing process alone can remove chlorine of the film, the cleaning process is not essential. But the cleaning process can remove chlorides adhering to the surface of the film and therefore prevents corrosion effectively.

Then, after the photoresist and dry etch processes, the wafer undergoes the pattern etch process for electrodes.

With these processes, chlorine in the TiN film can effectively be removed and there is no need to provide any aforementioned trap layer. However, the combined use of the trap layer and the chlorine removing processes as in this embodiment can prevent the diffusion of chlorine almost completely.

EMBODIMENT 6

Figure 51:
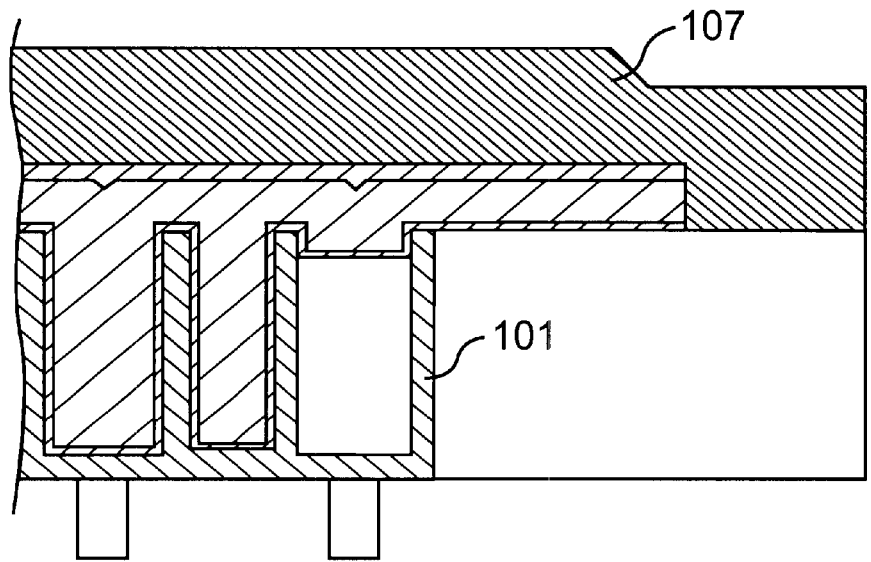
FIG. 51 is a cross section of a storing capacitor section of a DRAM according to this invention.
Figure 52:
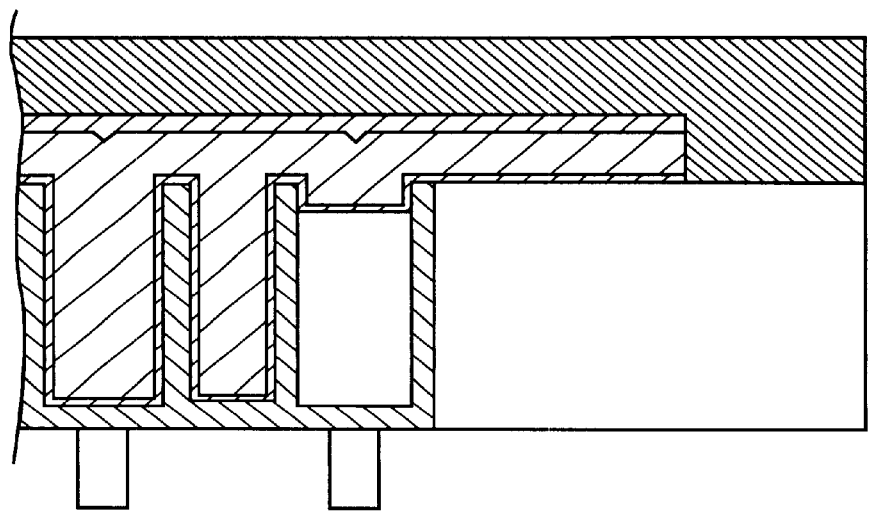
FIG. 52 is a cross section of a storing capacitor section of a DRAM according to this invention.

An embodiment is an example where an SiO film is formed over an interlayer insulating film by the high-density plasma CVD method to prevent Al wiring corrosion will be described referring to FIGS. 51 and 52 which show cross sections of a storing capacitor section.

In a similar manner to that of Embodiment 2, a polysilicon lower electrode 101 and a tantalum oxide capacitor insulating film 102 are formed. Then, a CVD-TiN film as the upper electrode of the capacitor insulating film is formed to a thickness of about 100 nm by using $TiCl_4$. After the photoresist and dry etch processes, the upper electrode 104 is patterned. Next, a TiN film 105 as the chlorine trap layer is formed to a thickness of 30 nm. This is followed by turning a gas mixture of $SiH_4/O_2/Ar$ introduced in the ECR plasma CVD apparatus to a plasma, applying a high frequency wave of 13.56 MHz to a sample stage where a substrate is mounted, and drawing in Ar ions from the plasma to form an $SiO_2$ film by the high-density plasma CVD method. In this way, an $SiO_2$ film 107 having a water blocking capability is formed to about 400 nm (FIG. 51). The plasma CVD apparatus may be of a helical type or a helicon type in addition to the ECR type. In this specification, the high density refers to a state of the plasma with ions in excess of $1 \times 10^{10}$ (ions/$cm^3$). It is however preferable to use a high-density plasma CVD method of a density of $1 \times 10^{12}$ (ions/$cm^3$).

Then, the $SiO_2$ film is partly removed by about 300 nm using CMP, leaving the $SiO_2$ film 107 about 100 nm thick on the electrode. This film corresponds to the silicon oxide film 64 shown in FIG. 41.

Figure 53:
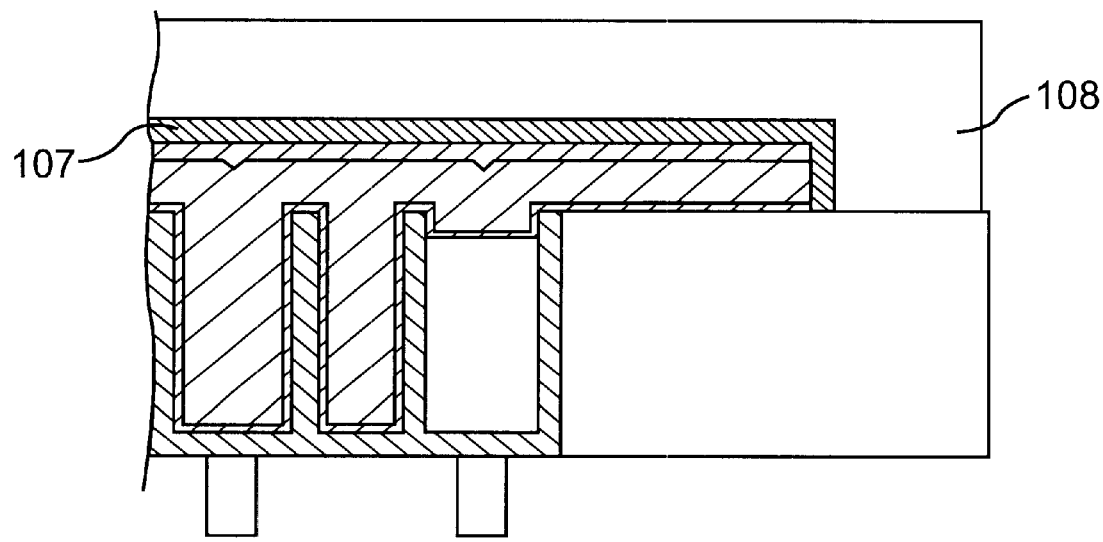
FIG. 53 is a cross section of a storing capacitor section of a DRAM according to this invention.
Figure 54:
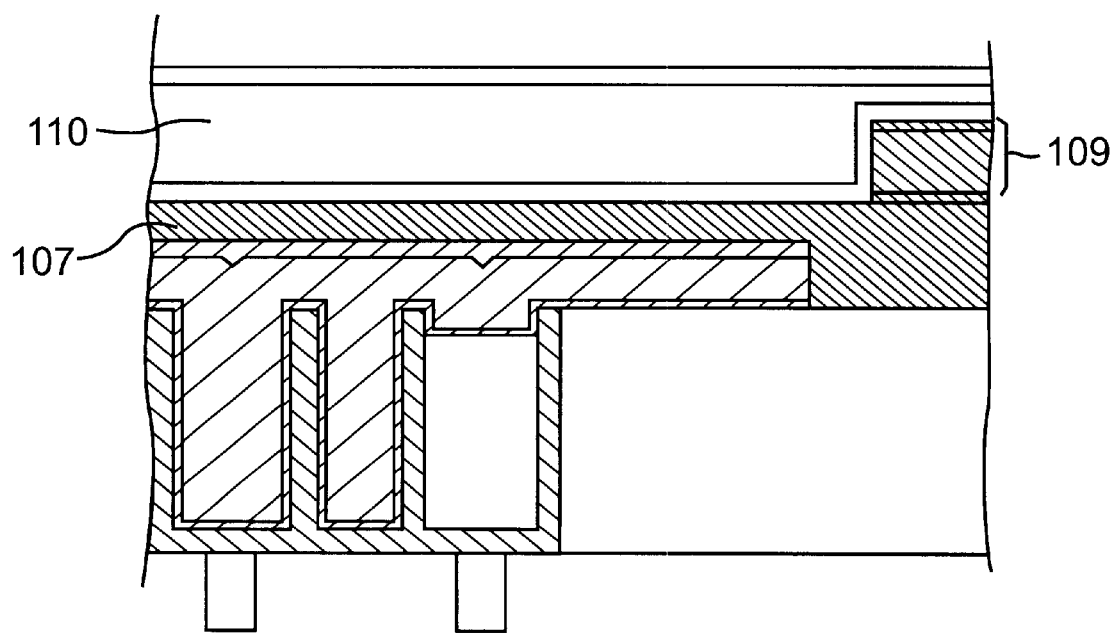
FIG. 54 is a cross section of a storing capacitor section of a DRAM according to this invention.

Chlorine in the TiN film, when brought into contact with water that has entered during some process, may corrode the surrounding wiring layer easily. Forming a high-density plasma insulating film, which has a high water blocking effect, over the chlorine-containing titanium nitride film can prevent water from entering the titanium nitride film and therefore prevent the corrosion of the surrounding wiring layer. This water is produced on the upper layer of the chlorine containing TiN film when the device is steam-baked after an inorganic spin-on-glass (SOG) film is applied or when it is cleaned after etching. Hence, the provision of the high-density plasma $SiO_2$ film between the inorganic SOG film and the chlorine containing TiN film prevents entrance of water into the TiN film and produces a corrosion prevention effect. The high-density plasma $SiO_2$ film needs to be provided between the inorganic SOG film and the halogen containing TiN film. This may be accomplished either by forming the inorganic SOG film 108 directly over the high-density plasma CVD insulating film 107 as in this embodiment (FIG. 53) or by forming the wiring layer 109 over the high-density plasma CVD insulating film 107 and then forming the inorganic SOG film 110 (FIG. 54).

While this embodiment is an example where the TiN film is applied to the upper electrode of the capacitor, the use of the TiN film is not limited to the capacitor. If the TiN film is applied to a part of the wiring layer, a similar water blocking effect can be produced by forming a high-density plasma insulating film over the halogen containing TiN film.

While, in this embodiment, a high-density plasma CVD insulating film is provided as a film having a high water blocking capability, an organic SOG film may also be used. It is noted, however, that the organic SOG film does not have as high a water block capability as the high-density plasma CVD insulating film does.

Further, while the above embodiment is an example where halogen in the titanium nitride film diffuses into the overlying wiring layer, the underlying wiring layer can also be prevented from being corroded by a trap film formed under the titanium nitride film. For example, in a structure in which a tantalum or tantalum nitride film is formed as a trap film over a copper film which is highly corrodable, an insulating film is formed, and further a halogen containing titanium nitride film is formed thereover, the halogen from the overlying layer can be trapped by the tantalum or tantalum nitride film, which in turn prevents corrosion of the underlying copper film.

Further, while in the above embodiment the tantalum oxide is used as a capacitor insulating film, any of the materials including $BaSrTiO_3$, $SrTiO_3$, $BaTiO_3$, PZT, and ZnO doped with B (boron) or F (fluorine) can also be applied. Such a material can also be used for a DRAM or a nonvolatile memory.

The invention made by the present inventor is specifically described above in accordance with embodiments. However, the present invention is not restricted to the embodiments. It is needless to say that various modifications of the present invention are allowed as long as they are not deviated from the gist of the present invention.

ADVANTAGES OF THE PRESENT INVENTION

Advantages obtained from the present invention include those that are application are briefly described below.

According to the present invention, it is possible to securely prevent an Al wiring formed on a via-hole in which a plug including a CVD-TiN film is embedded from corroding. Therefore, it is possible to improve the reliability and fabrication yield of LSIs having a via-hole of a particularly high aspect ratio.

This invention can prevent corrosion of an Al wiring that is formed over the capacitor element including the CVD-TiN film at the upper electrode of the capacitor insulating film and therefore can improve the reliability of the Al wiring and the manufacturing yield without degrading the dielectric strength of the capacitor insulating film.

What is claimed is:

1. A semiconductor integrated circuit device comprising:

a substrate;

a titanium nitride film formed over the substrate which is deposited by CVD using a material gas containing a halogen element;

a first conductive film formed over the titanium nitride film; and a second conductive film formed between the titanium nitride film and the first conductive film, the second conductive film containing metal atoms bondable to the halogen element and having a greater capability to trap the halogen than tungsten, and not containing a halogen element as a constitutional element, wherein the second conductive film is a film deposited by CVD using a material gas without any halogen element, or deposited by sputtering in halogen a free ambient.

2. A semiconductor integrated circuit device according to claim 1, wherein the second conductive film is a titanium film or a tantalum film.

3. A semiconductor integrated circuit device according to claim 1, wherein the second conductive film is a multilayer film including a titanium film or a tantalum film.

4. A semiconductor integrated circuit device according to claim 1, wherein the second conductive film has a thickness of at least 5 nm.

5. A semiconductor integrated circuit device according to claim 1, wherein the first conductive film is an aluminum film, an aluminum alloy film, a copper film, or a copper alloy film.

6. A semiconductor integrated circuit device comprising:

a substrate;

an insulating film having an opening and formed over the substrate;

a titanium nitride film formed inside the opening by using a source gas containing a halogen element;

a first conductive film formed over the titanium nitride film, containing a metal element bondable to the halogen element, having a greater capability to trap the halogen than tungsten, and not containing a halogen element as a constitutional element; and a second conductive film formed over the first conductive film, wherein the first conductive film is a film deposited by CVD using a material gas without any halogen element, or deposited by sputtering in a halogen free ambient.

7. A semiconductor integrated circuit device according to claim 6, wherein the first conductive film is formed over a range from the titanium nitride film to the insulating film.

8. A semiconductor integrated circuit device according to claim 6, wherein the first conductive film is a multilayer film including a titanium film or the titanium film.

9. A semiconductor integrated circuit device according to claim 6, wherein a tungsten film is formed over the titanium nitride film inside the opening.

10. A semiconductor integrated circuit device comprising:

a substrate;

an insulating film having an opening and formed over the substrate;

a lower electrode of a capacitor formed in the opening and a dielectric film formed on the lower electrode;

a titanium nitride film formed over the dielectric film by a CVD method using a source gas containing a halogen element;

a first conductive film formed over the titanium nitride film, containing a metal element bondable to the halogen element having a greater capability to trap the halogen than tungsten and not containing halogen as constitutional element;

a second conductive film formed over the first conductive film; and wherein the first conductive film is a film deposited by CVD using a material gas without a halogen element, or deposited by sputtering in a halogen free ambient.

* * * * *